(12) United States Patent
Lin et al.

(10) Patent No.: US 11,309,424 B2
(45) Date of Patent: Apr. 19, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Zhi-Chang Lin, Hsinchu County (TW); Shih-Cheng Chen, New Taipei (TW); Jung-Hung Chang, Changhua County (TW); Lo-Heng Chang, Hsinchu (TW); Chien-Ning Yao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/847,204

(22) Filed: Apr. 13, 2020

(65) Prior Publication Data

US 2021/0320210 A1 Oct. 14, 2021

(51) Int. Cl.
| | |
|---|---|
| *H01L 29/423* | (2006.01) |
| *H01L 21/02* | (2006.01) |
| *H01L 29/66* | (2006.01) |
| *H01L 29/786* | (2006.01) |
| *H01L 29/06* | (2006.01) |

(52) U.S. Cl.
CPC .. *H01L 29/78609* (2013.01); *H01L 21/02603* (2013.01); *H01L 29/0649* (2013.01); *H01L 29/0673* (2013.01); *H01L 29/42392* (2013.01); *H01L 29/66553* (2013.01); *H01L 29/66742* (2013.01); *H01L 29/78618* (2013.01); *H01L 29/78696* (2013.01)

(58) Field of Classification Search
CPC ....... H01L 21/02603; H01L 21/823878; H01L 29/0649; H01L 29/0665; H01L 29/0669; H01L 29/0673; H01L 29/42392; H01L 29/6653; H01L 29/66553; H01L 29/6656; H01L 29/66742; H01L 29/78609; H01L 29/78618; H01L 29/78696; H01L 29/66439; H01L 29/6681; H01L 29/775
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2020/0066894 A1* | 2/2020 | Frougier | H01L 27/088 |

(Continued)

*Primary Examiner* — David C Spalla
(74) *Attorney, Agent, or Firm* — Maschoff Brennan

(57) ABSTRACT

A semiconductor device includes a substrate, a semiconductor layer, a gate structure, source/drain regions, a bottom isolation layer, and a bottom spacer. The semiconductor layer is above the substrate. The gate structure is above the substrate and surrounds the semiconductor layer. The source/drain regions are on opposite sides of the semiconductor layer. The bottom isolation layer is between the substrate and the semiconductor layer. The bottom spacer is on a sidewall of the bottom isolation layer.

20 Claims, 55 Drawing Sheets

(56) References Cited

U.S. PATENT DOCUMENTS

2020/0091287 A1\* 3/2020 Glass ................ H01L 29/78696
2020/0105869 A1\* 4/2020 Loubet ................ H01L 29/7851
2020/0279918 A1\* 9/2020 Wu ................ H01L 21/823431

\* cited by examiner

SEMICONDUCTOR DEVICE AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process can increase production efficiency and lower associated costs. Such scaling down has also increased the complexity of processing and manufacturing ICs and, for these advancements to be realized, similar developments in IC processing and manufacturing are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
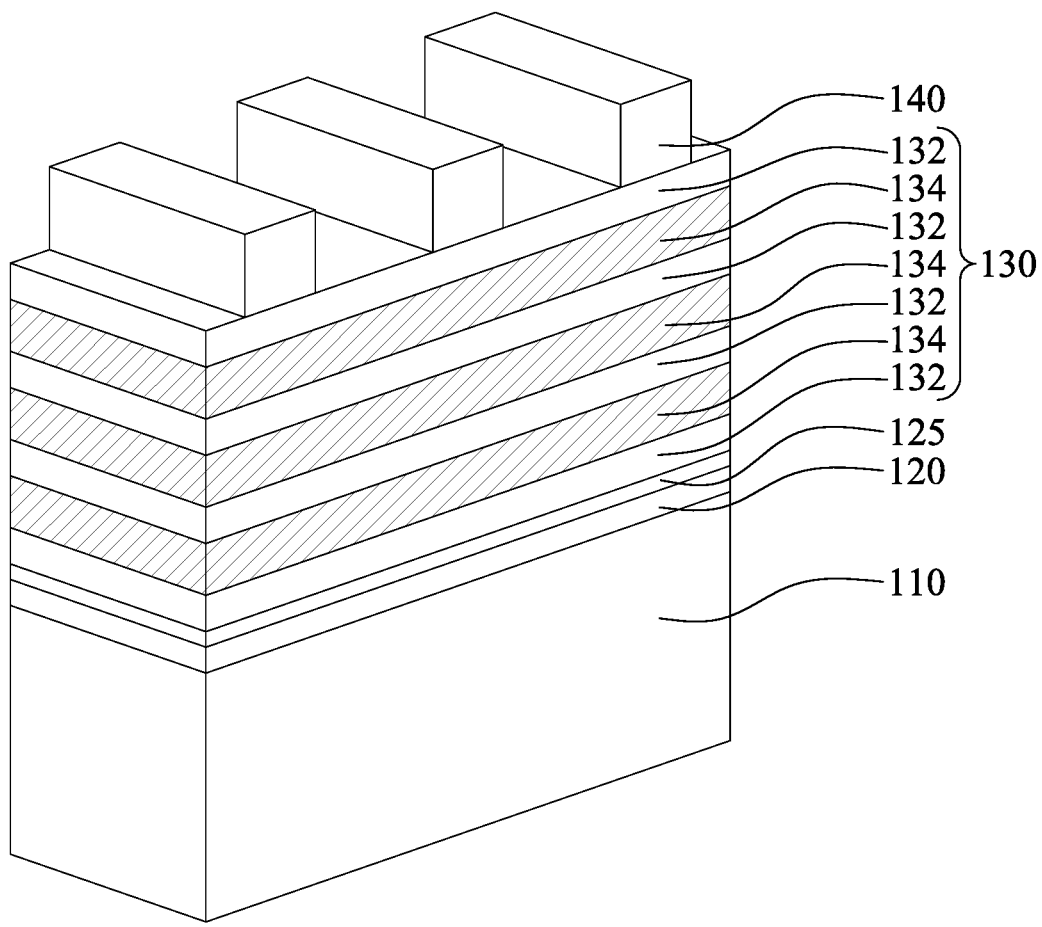
FIGS. 1-26D illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanowire channels, bar-shaped channels, and/or other suitable channel configurations. In some embodiments, the channel region of a GAA device may have multiple horizontal nanowires or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure.

FIGS. 1-26D illustrate a method for manufacturing a semiconductor device at various stages in accordance with some embodiments of the present disclosure. In some embodiments, the semiconductor device shown in FIGS. 1-26D may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multigate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. A substrate 110, which may be a part of a wafer, is provided. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

A sacrificial layer 120 is formed on the substrate 110. The sacrificial layer 120 may be epitaxially grown on the substrate 110, such that the sacrificial layer 120 forms a crystalline layer. The sacrificial layer 120 and the substrate 110 have different materials and/or components, such that the sacrificial layer 120 and the substrate 110 have different etching rates. In some embodiments, the sacrificial layer 120 is made of silicon germanium (SiGe). The germanium percentage (atomic percentage) of the sacrificial layer 120 is in the range between about 40 percent and about 60 percent, while higher or lower germanium percentages may be used. It is appreciated, however, that the values recited throughout the description are examples, and may be changed to different values. In some embodiments, the thickness of the sacrificial layer 120 is in the range between about 5 nm and about 15 nm.

A protection layer 125 is formed on the sacrificial layer 120 and may be pure silicon layers that are free from germanium. The protection layer 125 may also be substantially pure silicon layers, for example, with a germanium percentage lower than about 1 percent. Furthermore, the protection layer 125 may be intrinsic, which are not doped with p-type and n-type impurities. In some embodiments, the thickness of the protection layer 125 is in the range between about 3 nm and about 10 nm. In some other embodiments, however, the protection layer 125 can be silicon germanium or germanium, or can be III-V materials, such as InAs, InGaAs, InGaAsSb, GaAs, InPSb, or other suitable materials.

A semiconductor stack 130 is formed on the protection layer 125 through epitaxy, such that the semiconductor stack 130 forms crystalline layers. The semiconductor stack 130 includes semiconductor layers 132 and 134 stacked alternatively. The semiconductor layers 132 can be SiGe layers having a germanium percentage lower than the germanium percentage in the sacrificial layer 120. In some embodiments, the germanium percentage of the semiconductor layers 132 is in the range between about 20 percent and about 30 percent. Furthermore, a difference between the germanium percentages of the sacrificial layer 120 and the germanium percentage of the semiconductor layers 132 may be greater than about 20 percent or higher. In some embodiments, the thickness of the semiconductor layers 132 is in the range between about 5 nm and about 15 nm.

The semiconductor layers 134 may be pure silicon layers that are free from germanium. The semiconductor layers 134 may also be substantially pure silicon layers, for example, with a germanium percentage lower than about 1 percent. Furthermore, the semiconductor layers 134 may be intrinsic, which are not doped with p-type and n-type impurities. There may be two, three, four, or more of the semiconductor layers 134. In some embodiments, the thickness of the semiconductor layers 134 is in the range between about 3 nm and about 10 nm. In some other embodiments, however, the semiconductor layers 134 can be silicon germanium or germanium for p-type semiconductor device, or can be III-V materials, such as InAs, InGaAs, InGaAsSb, GaAs, InPSb, or other suitable materials.

A patterned hard mask 140 is formed over the semiconductor stack 130. In some embodiments, the patterned hard mask 140 is formed of silicon nitride, silicon oxynitride, silicon carbide, silicon carbo-nitride, or the like. The patterned hard mask 140 covers a portion of the semiconductor stack 130 while leaves another portion of the semiconductor stack 130 uncovered.

Figure 2:
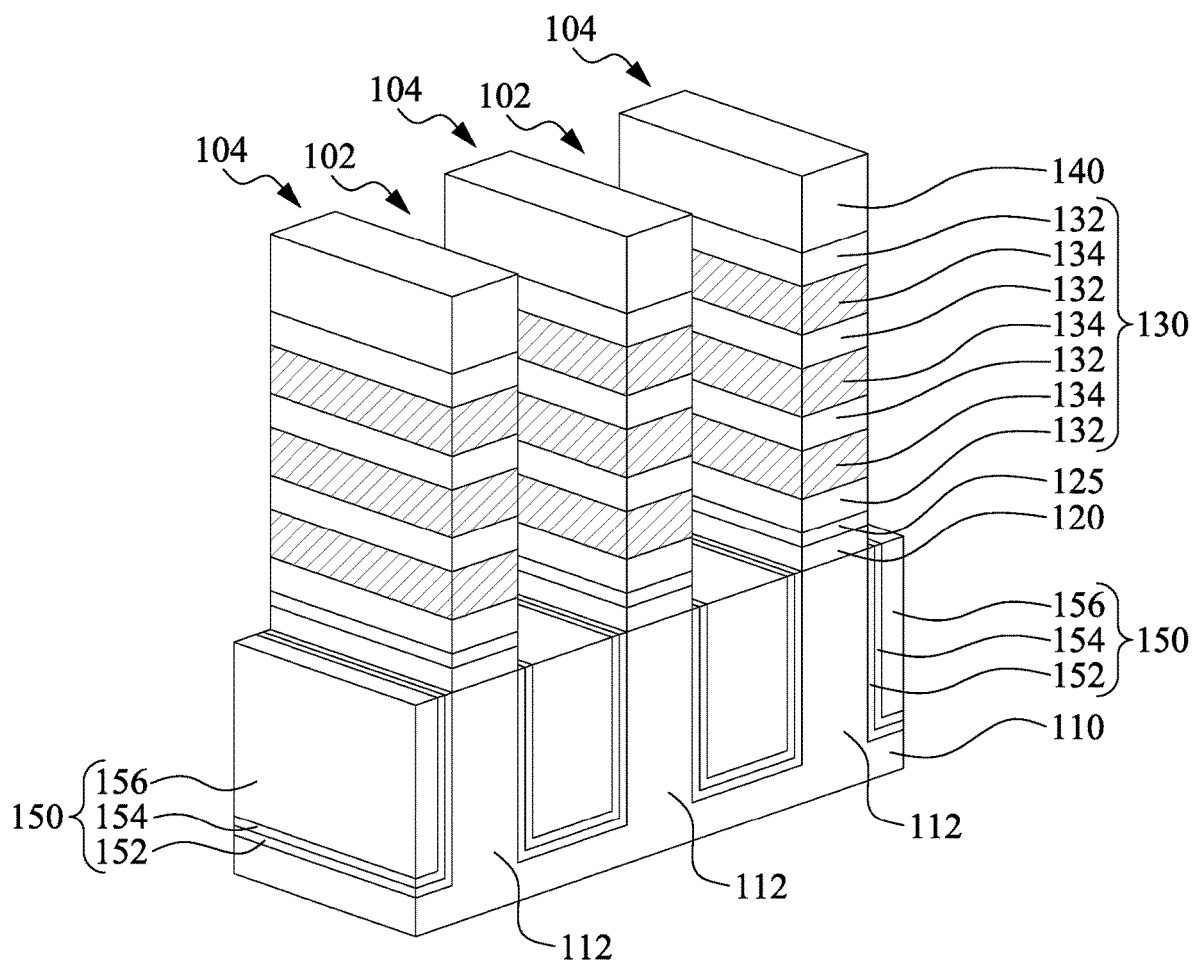

Reference is made to FIG. 2. The semiconductor stack 130, the protection layer 125, the sacrificial layer 120, and the substrate 110 of FIG. 1 are patterned using the patterned hard mask 140 as a mask to form trenches 102. Accordingly, a plurality of semiconductor strips 104 are formed. The trenches 102 extend into the substrate 110, and have lengthwise directions substantially parallel to each other. The trenches 102 form base portions 112 in the substrate 110, where the base portions 112 protrude from the substrate 110, and the semiconductor strips 104 are respectively formed above the base portions 112 of the substrate 110. The remaining portions of the semiconductor stack 130, protection layer 125, and the sacrificial layer 120 are accordingly referred to as the semiconductor strips 104 alternatively.

Isolation structures 150, which may be shallow trench isolation (STI) regions, are formed in the trenches 102. The formation may include filling the trenches 102 with a dielectric layer(s), for example, using flowable chemical vapor deposition (FCVD), and performing a chemical mechanical polish (CMP) to level the top surface of the dielectric material with the top surface of the hard mask 140. The isolation structures 150 are then recessed. The top surface of the resulting isolation structures 150 may be level with the bottom surface of the sacrificial layer 120, or may be at an intermediate level between the top surface and the bottom surface of the sacrificial layer 120.

In some embodiments, each of the isolation structures 150 includes a first liner layer 152, a second liner layer 154, and a filling material 156. The first liner layer 152 is in contact with the substrate 110 and may be a dielectric layer, such as silicon oxide, silicon nitride, silicon oxynitride, SiCN, $SiC_xO_yN_z$, or combinations thereof. The second liner layer 154 is on and in contact with the first liner layer 152 and may be a semiconductor layer such as a silicon layer. The filling material 156 is on and in contact with the second liner layer 154 and may be a dielectric material, such as silicon oxide, silicon nitride, silicon oxynitride, SiCN, $SiC_xO_yN_z$, or combinations thereof. In some other embodiments, the second liner layer 154 is omitted. In still some other embodiments, the first and second liner layers 152 and 154 are omitted.

Figure 3:
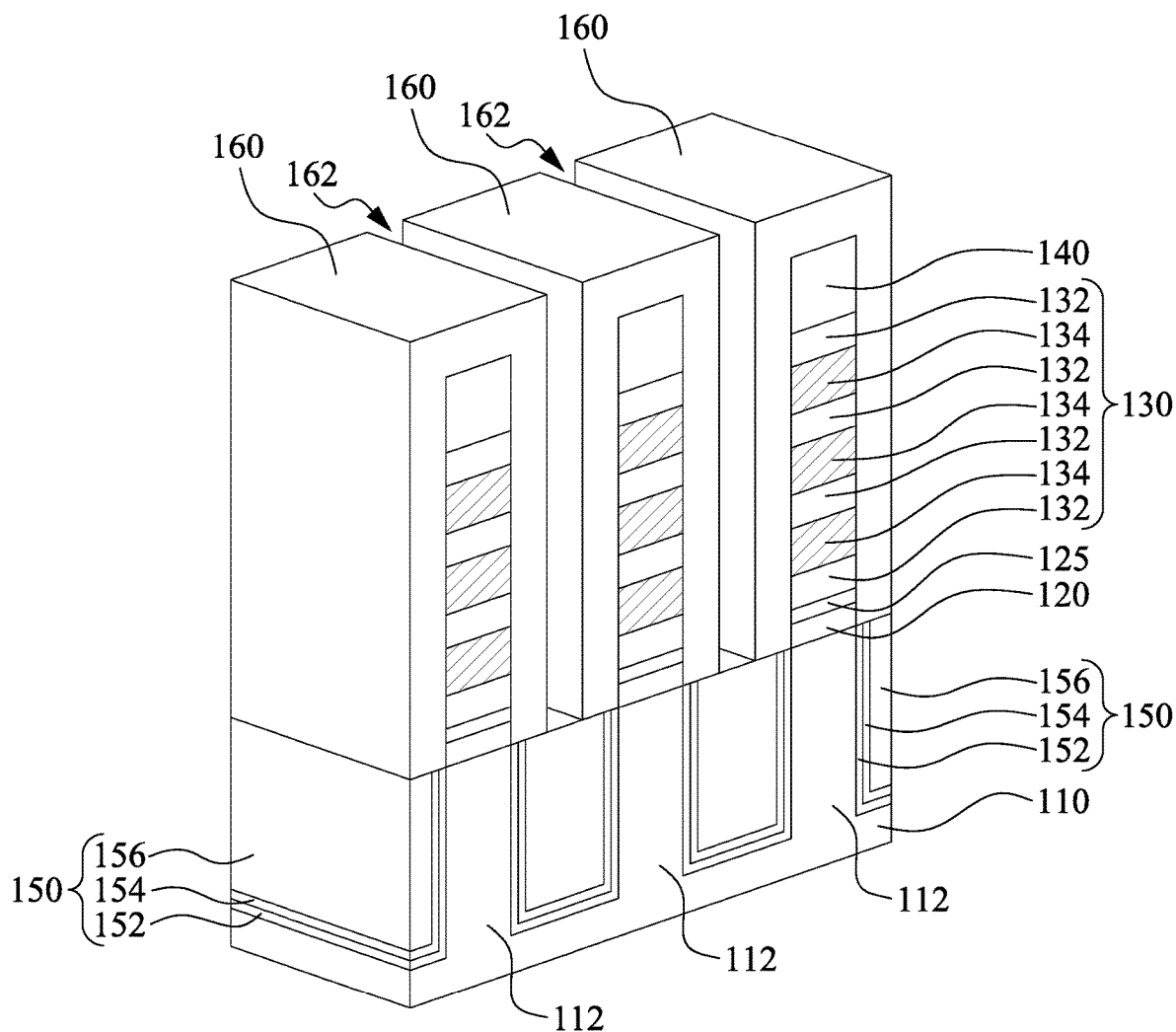

Reference is made to FIG. 3. Cladding layers 160 are formed above the isolation structures 150 and respectively cover the semiconductor strips 104 (see FIG. 2). In some embodiments, the cladding layers 160 are made of semiconductor materials, such as SiGe or other suitable materials. In some embodiments, the cladding layers 160 and the semiconductor layers 132 may have substantially the same or similar materials/components, such the cladding layers 160 and the semiconductor layers 132 have similar etching rates under the same etchant. The cladding layers 160 are separated from each other, such that trenches 162 are formed therebetween.

Figure 4:
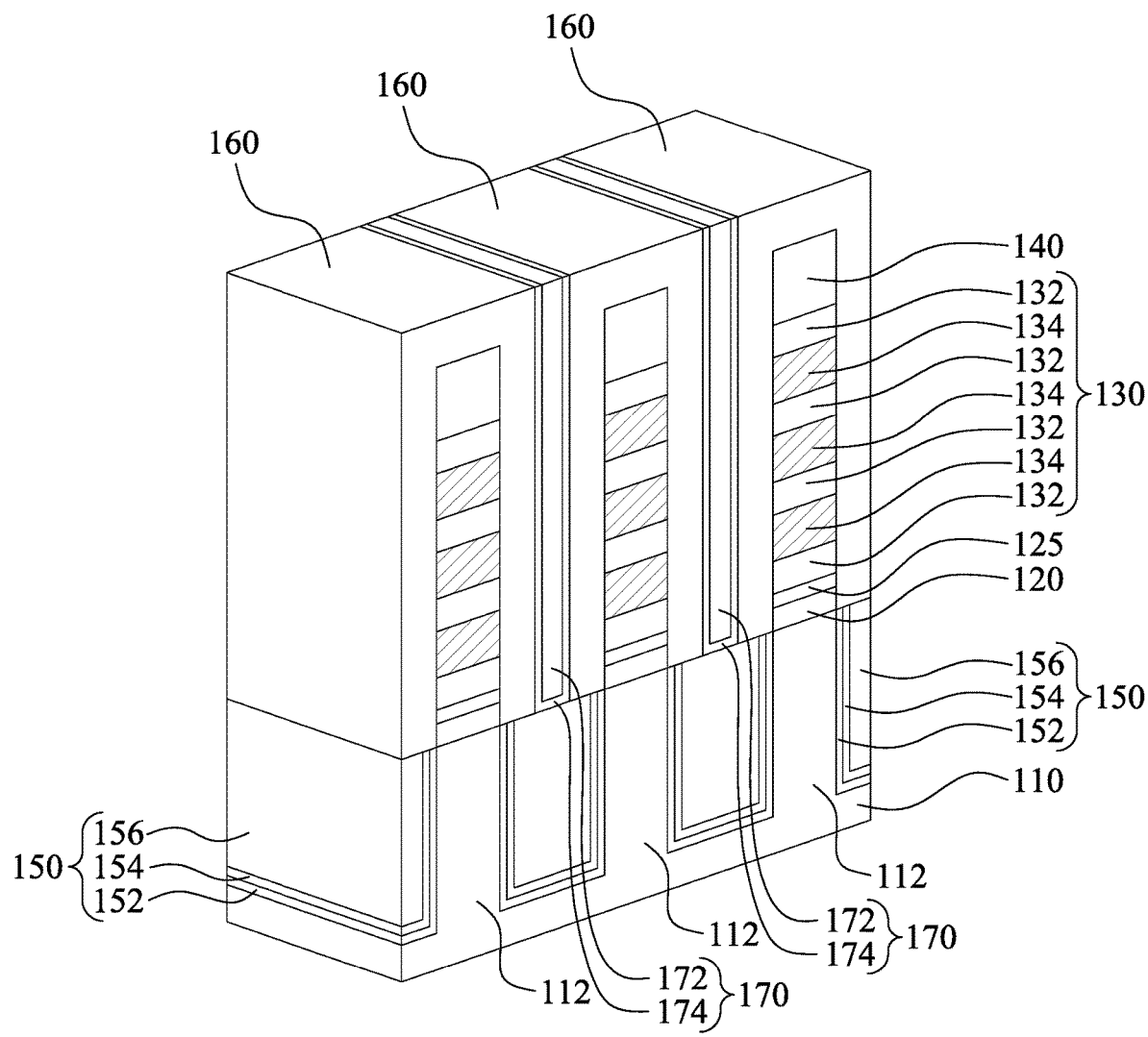

Reference is made to FIG. 4. A plurality of dummy fin structures 170 are respectively formed in the trenches 162 (see FIG. 3). In some embodiments, a dielectric layer is conformally formed above the structure in FIG. 3, and a filling material is filled in the trenches 162. A planarization (e.g., CMP) process is then performed to remove excess portions of the dielectric layer and the filling material to form the dummy fin structures 170 respectively in the trenches 162. As such, each of the dummy fin structures 170 includes a dielectric layer 172 and a dummy fin 174 above the dielectric layer 172. In some embodiments, the dielectric layer 172 is deposited with an ALD process or other suitable processes. In some embodiments, the dielectric layer 172 and the dummy fin 174 include silicon nitride, silicon oxide, silicon oxynitride, SiCN, SiCON, SiOC, or other suitable materials. For example, the dielectric layer 172 includes silicon nitride, and the dummy fin includes silicon dioxide.

Figure 5:
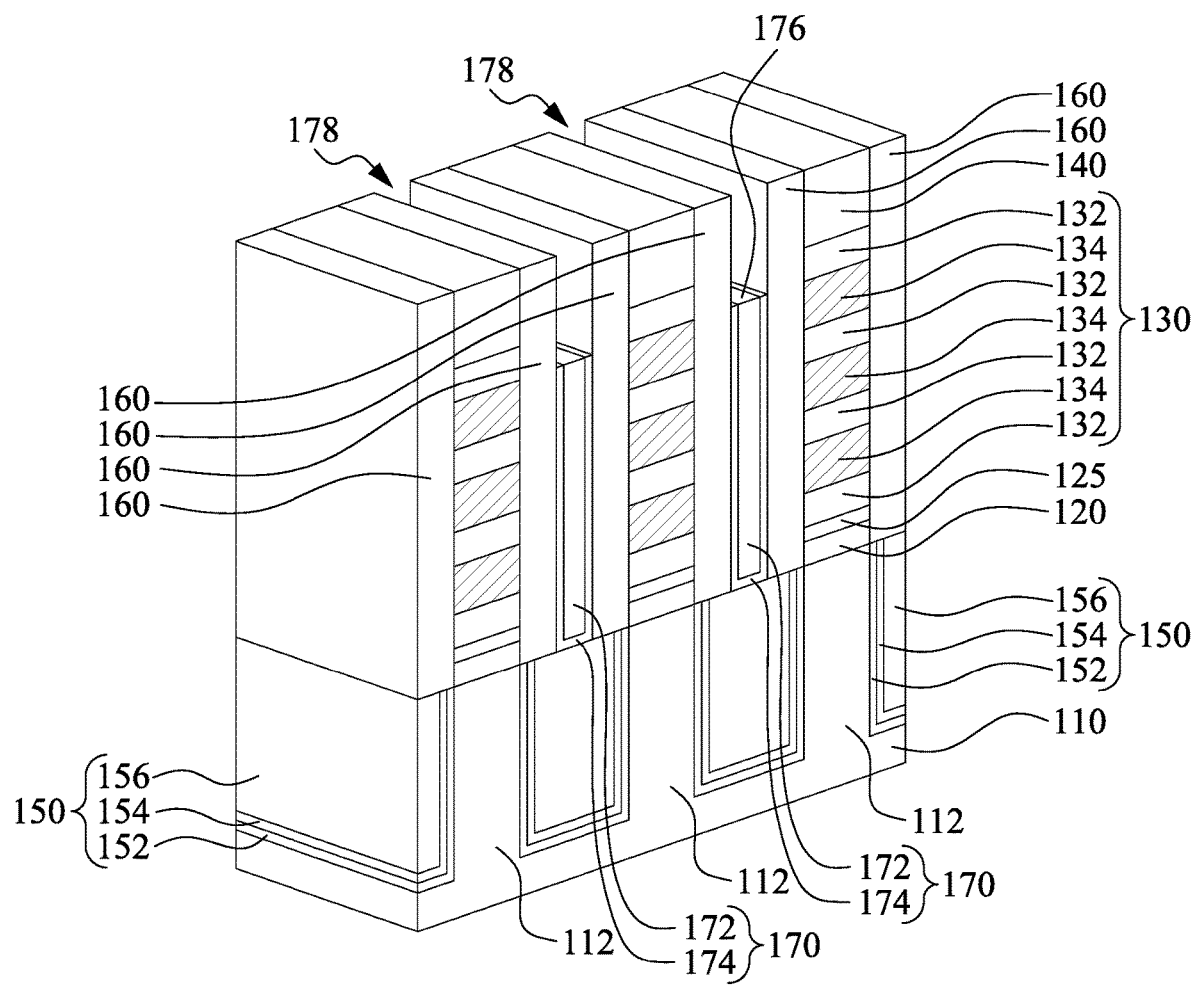

Reference is made to FIG. 5. The dummy fin structures 170 are recessed to form recesses 178 thereon. In some embodiments, multiple etching processes are performed to recess the dummy fin structures 170. The etching processes include dry etching process, wet etching process, or combinations thereof. In some embodiments, during the recessing of the dummy fin structures 170, top portions of the cladding layers 160 are removed to expose the hard mask 140. In some embodiments, a top surface 176 of the dummy fin structures 170 is substantially level with the top surface of the topmost semiconductor layer 134, or may be at an intermediate level between the top surface and the bottom surface of the topmost semiconductor layer 132.

Figure 6:
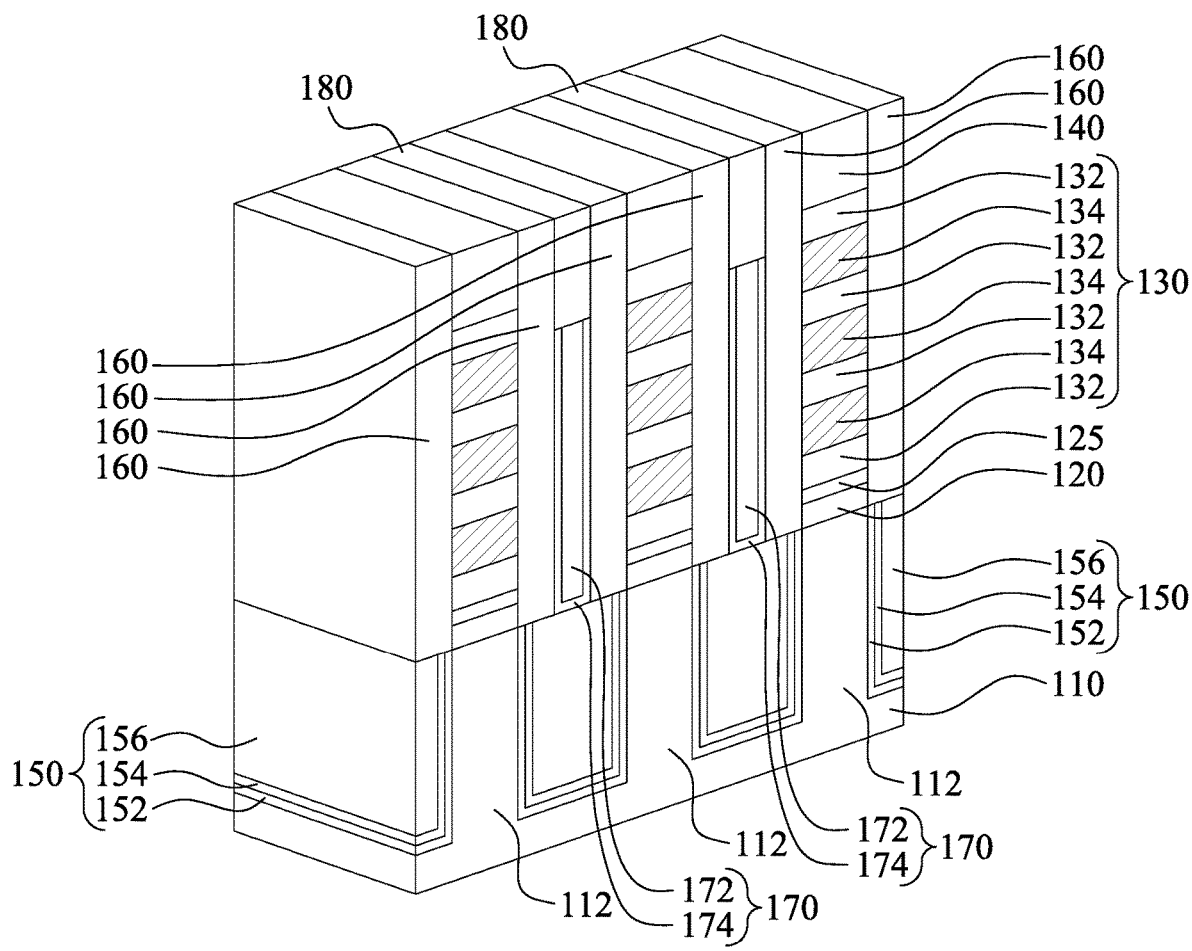

Reference is made to FIG. 6. Mask layers 180 are respectively formed in the recesses 178 (see FIG. 5). In some embodiments, the mask layers 180 are formed of silicon nitride, silicon oxynitride, silicon carbide, silicon carbonitride, or the like. For example, a mask material is formed above the structure of FIG. 5, and a planarization (e.g., CMP) process is performed to remove excess portion of the mask material to form the mask layers 180.

Figure 7:
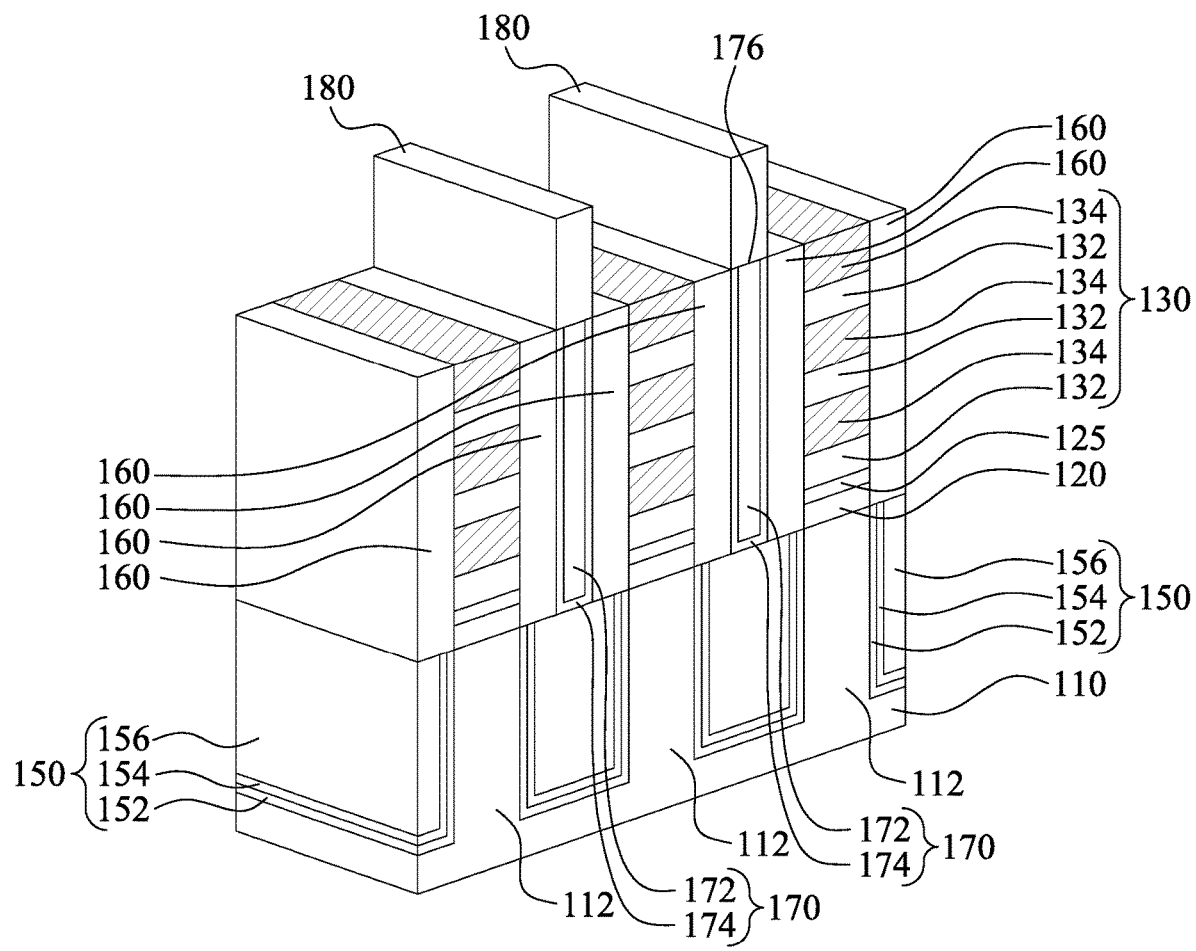

Reference is made to FIG. 7. The patterned hard masks 140 (see FIG. 6) are removed, and then the topmost semiconductor layer 132 and portions of the cladding layers 160 above top surfaces of the topmost semiconductor layer 134 are removed. As such, top surfaces of the cladding layers 160 are substantially level with the top surface 176 of the dummy fin structures 170. In some embodiments, multiple etching processes are performed to etch back the cladding layers 160 and remove the hard masks 140 and the topmost semiconductor layer 132. The etching processes include dry etching process, wet etching process, or combinations thereof.

Figure 8:
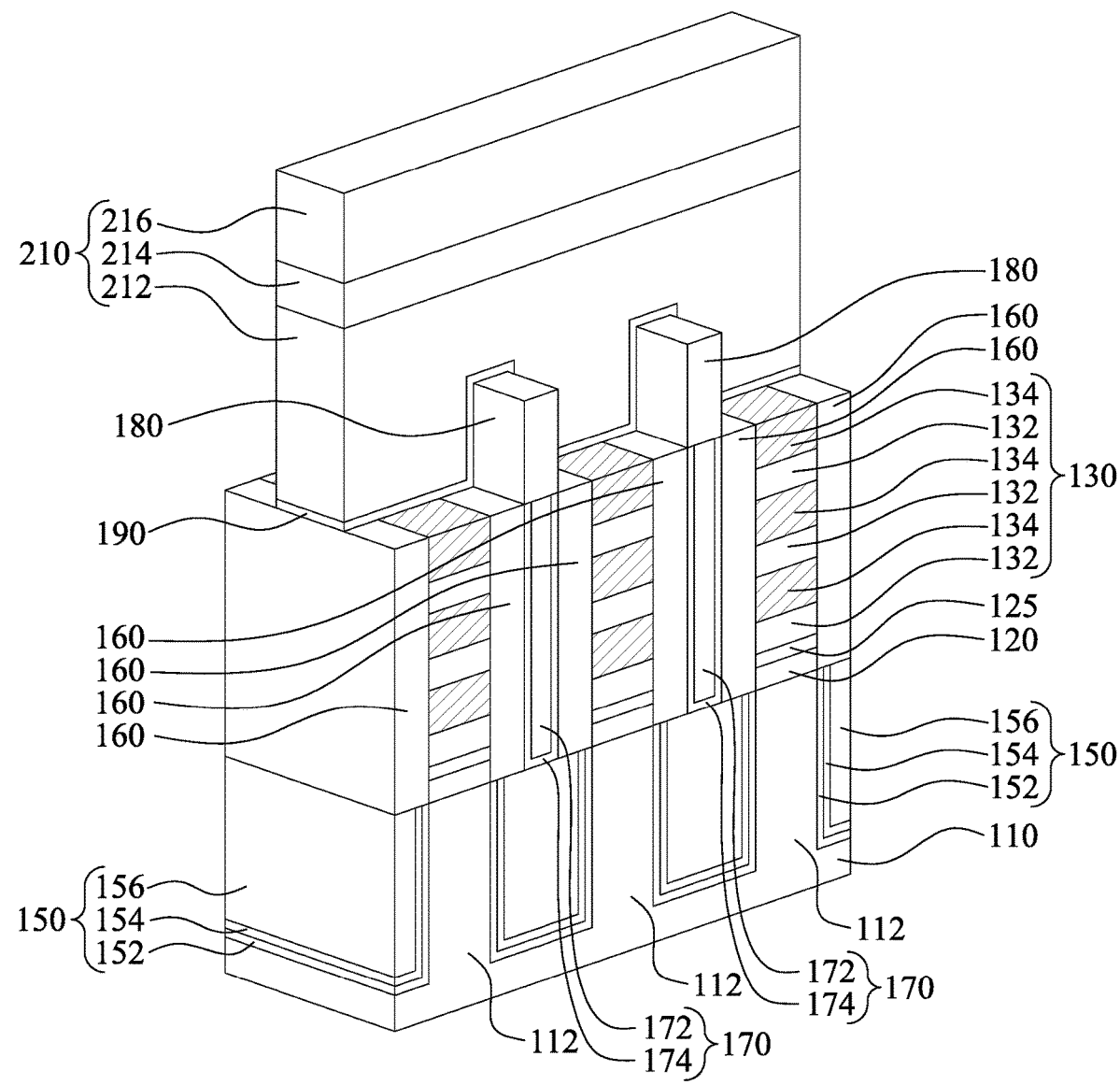

Reference is made to FIG. 8. An interfacial layer 190 is conformally formed above the structure of FIG. 7. In some embodiments, the interfacial layer 190 may include silicon dioxide, silicon nitride, a high-κ dielectric material or other suitable material. In various examples, the interfacial layer 190 may be deposited by an ALD process, a CVD process, a subatmospheric CVD (SACVD) process, a flowable CVD process, a PVD process, or other suitable process. By way of example, the interfacial layer 190 may be used to prevent damage to the semiconductor strips 130 by subsequent processing (e.g., subsequent formation of the dummy gate structure).

Subsequently, at least one dummy gate structure 210 is formed above the interfacial layer 190. The dummy gate structure 210 includes a dummy gate layer 212a, a pad layer 214 formed over the dummy gate layer 212, and a mask layer 216 formed over the pad layer 214. In some embodiments, a dummy gate layer (not shown) may be formed over the interfacial layer 190, and the pad layer 214 and the mask layer 216 are formed over the dummy gate layer. The dummy gate layer is then patterned using the pad layer 214 and the mask layer 216 as masks to form the dummy gate layer 212. As such, the dummy gate layer 212, the pad layer 214, and the mask layer 216 are referred to as the dummy gate structure 210. In some embodiments, the dummy gate layer 212 may be made of polycrystalline-silicon (poly-Si), poly-crystalline silicon-germanium (poly-SiGe), or other suitable materials. The pad layer 214 may be made of silicon nitride or other suitable materials, and the mask layer 216 may be made of silicon dioxide or other suitable materials.

Figure 9:
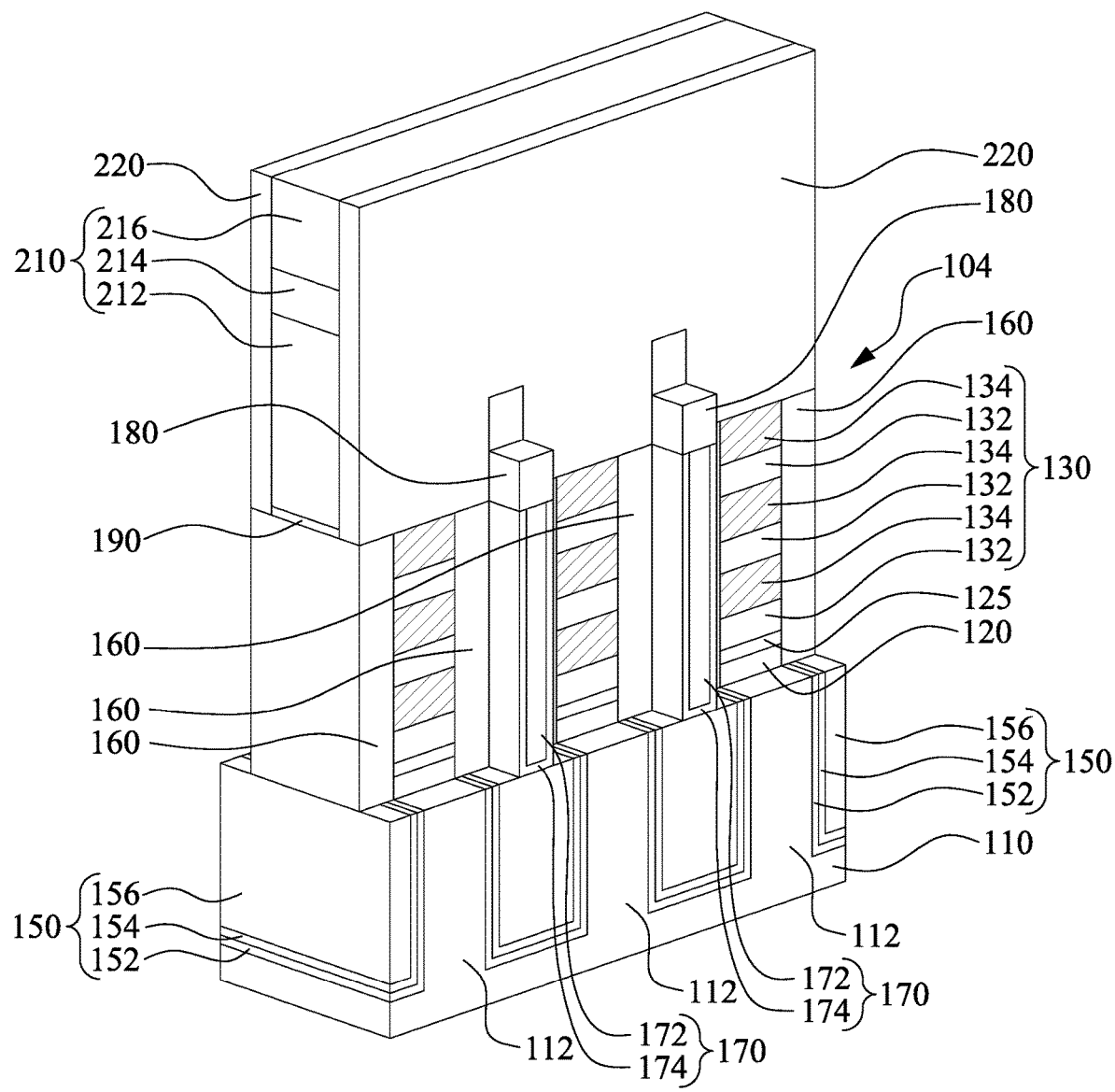

Reference is made to FIG. 9. Gate spacers 220 are respectively formed on sidewalls of the dummy gate structure 210. The gate spacers 210 may include a seal spacer and a main spacer (not shown). The gate spacers 210 include one or more dielectric materials, such as silicon oxide, silicon nitride, silicon oxynitride, SiCN, SiCxOyNz, or combinations thereof. The seal spacers are formed on sidewalls of the dummy gate structure 210 and the main spacers are formed on the seal spacers. The gate spacers 220 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 220 may include blanket forming spacer layers, and then performing etching operations to remove the horizontal portions of the spacer layers. The remaining vertical portions of the gate spacer layers form the gate spacers 220.

Subsequently, the semiconductor strips 104 and the semiconductor layers 160 are further patterned using the dummy gate structure 210 and the gate spacers 220 as masks, such that portions of the isolation structures 150 and the base portions 112 of the substrate 110 are exposed. During this etching process, the mask layers 180 are recessed at the areas not covered by the dummy gate structure 210 or the gate spacers 220. In some embodiments, the patterning process is performed with an anisotropic dry etch process. In some embodiments, the dry etch process etches the semiconductor strips 104 and the semiconductor layers 160 (e.g., Si and SiGe) much faster than etching the mask layers 180 (e.g., metal oxides, SiON, and SiOCN). Due to this etch selectivity, the dry etch process patterns the semiconductor strips 104 and the semiconductor layers 160 vertically without complete etching the mask layers 180. In FIG. 9, portions of the mask layers 180 covered by the dummy gate structure 210 or the gate spacers 220 has a height greater than a height of the recessed portion of the mask layers 180.

Figure 10A:
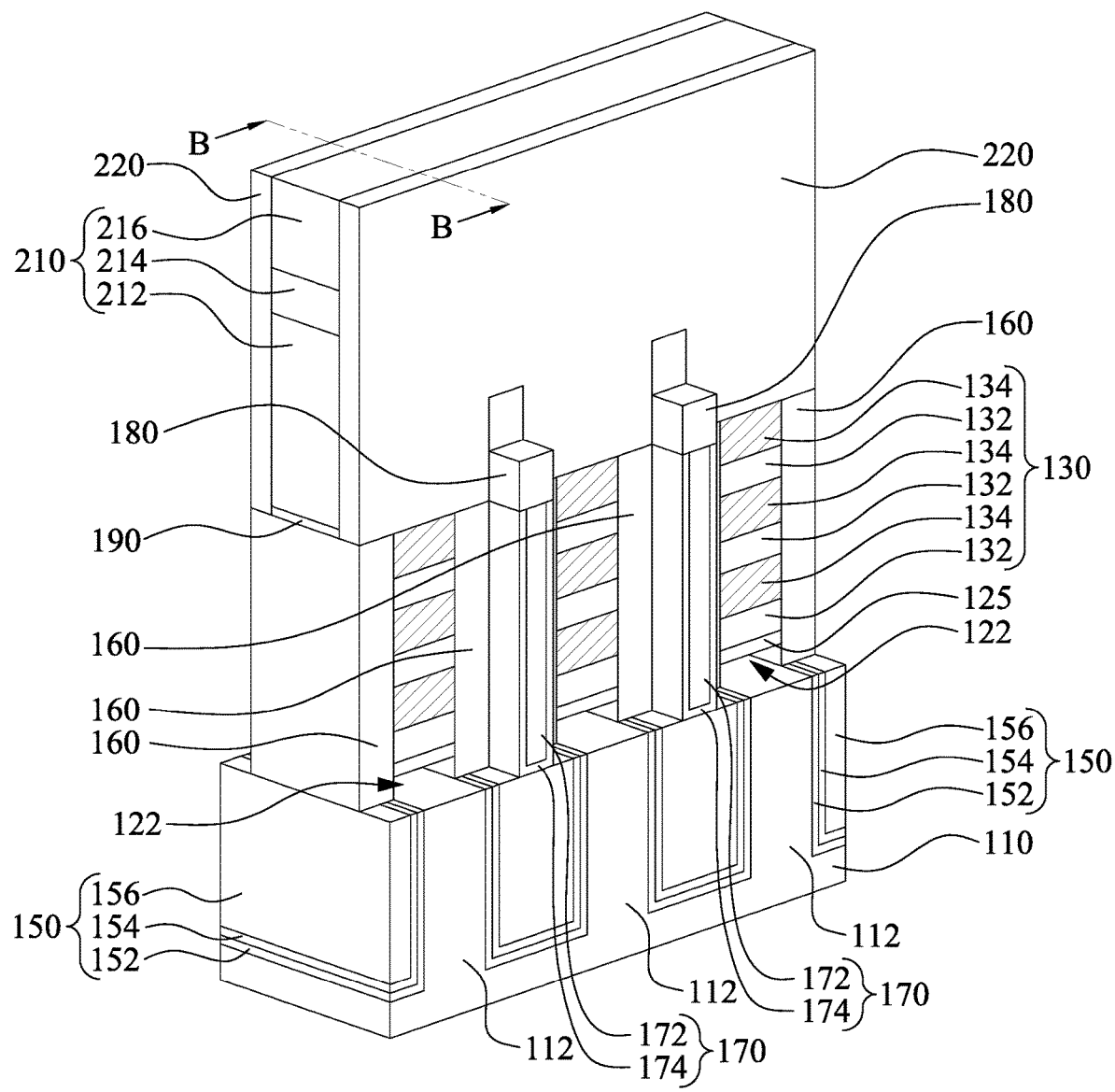
Figure 10B:
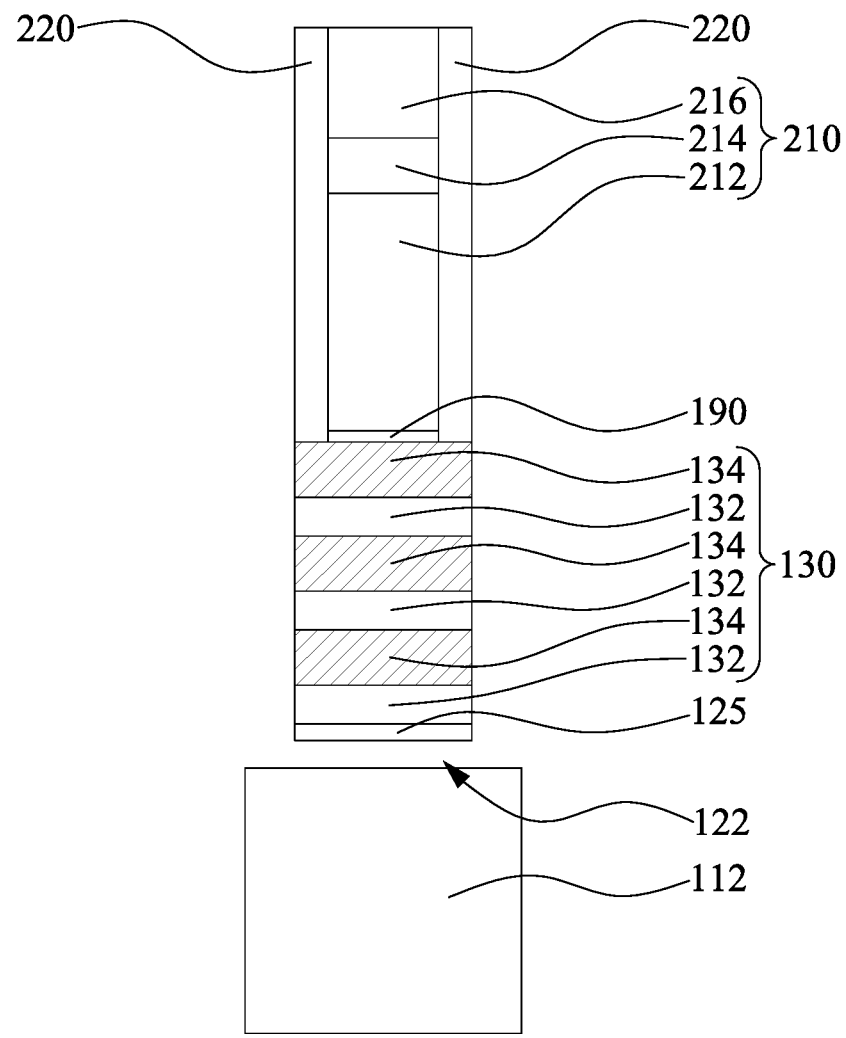

Reference is made to FIGS. 10A and 10B, where FIG. 10B is a cross-sectional view taken along line B-B in FIG. 10A. The sacrificial layer 120 (see FIG. 9) is removed, for example, by performing an etching process. In some embodiments, the etching process can be a wet etch process which has high etching selectivity between germanium and silicon. Since the material of the sacrificial layer 120 is different from the semiconductor stacks 130 and the protection layer 125, etching rates thereof are different, and the semiconductor stacks 130 and the protection layer 125 remain in place while the sacrificial layers 120 are removed. The sacrificial layers 120 are removed and opening 122 are formed between the semiconductor stacks 130 and the substrate 110.

Figure 11A:
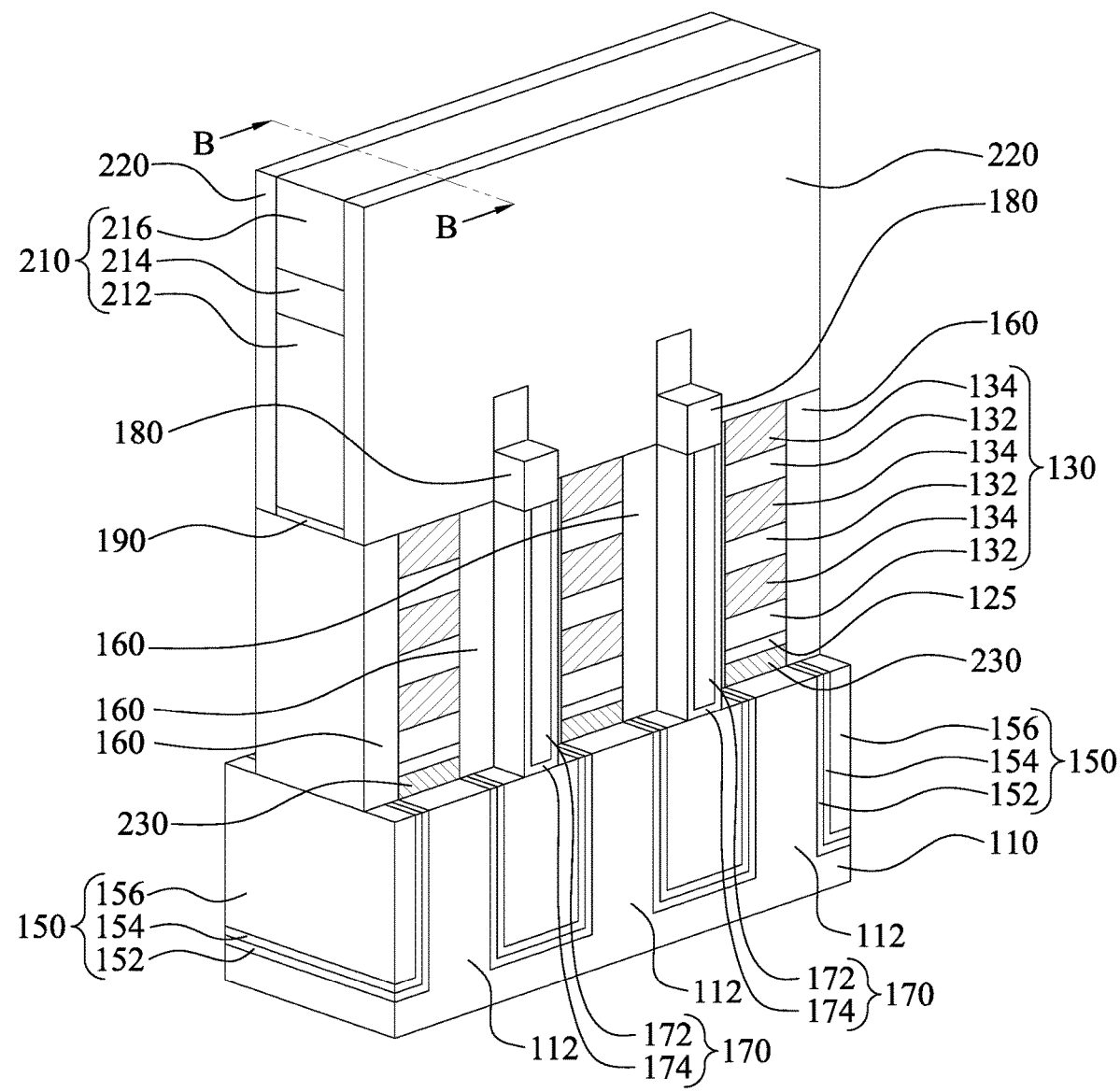
Figure 11B:
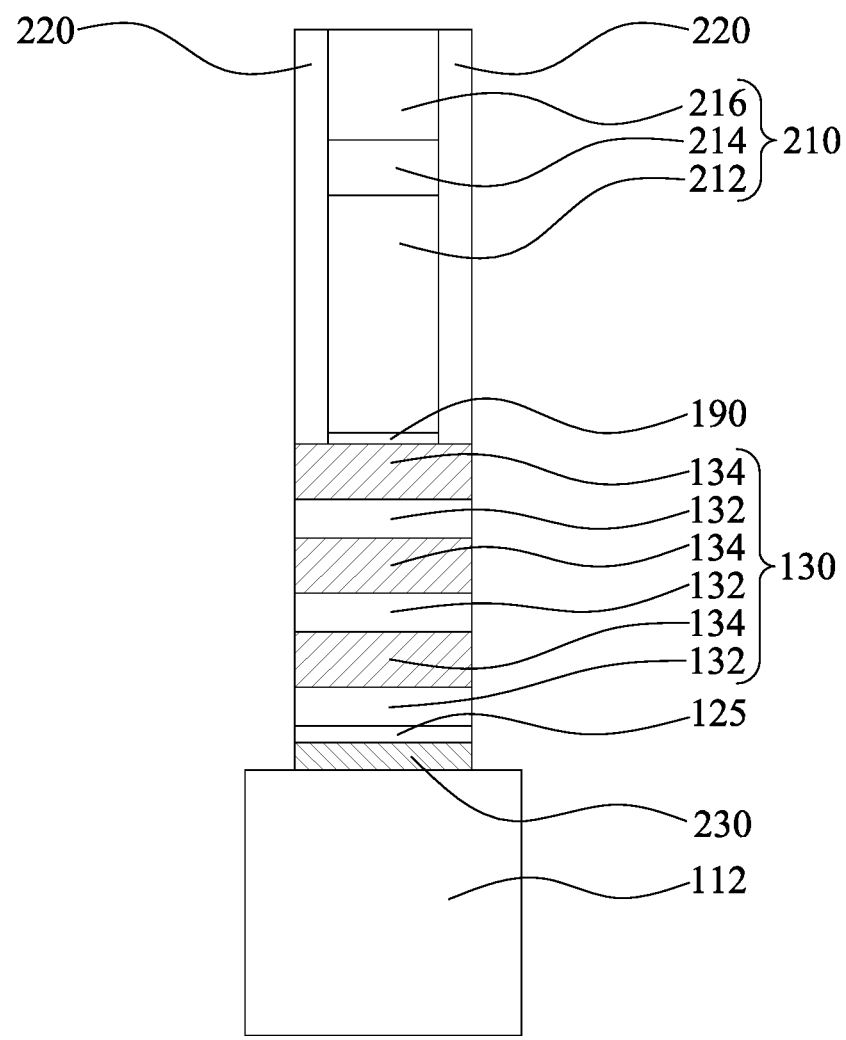

Reference is made to FIGS. 11A and 11B, where FIG. 11B is a cross-sectional view taken along line B-B in FIG. 11A. Bottom isolation layers 230 are respectively formed in the openings 122 (see FIGS. 10A and 10B) and between the protection layers 125 and the substrate 110. The bottom isolation layers 230 may be made of silicon nitride, silicon oxide, metal oxide, SiOC, SiCN, SiCON, or other dielectric materials. In some embodiments, the bottom isolation layers 230 may be formed by performing an ALD process or other suitable process. For example, the bottom isolation layers 230 may be formed by performing a PEALD process, such that the bottom isolation layers 230 can be formed at low temperature. The low temperature process prevents the semiconductor materials (e.g., the semiconductor layers 132 and 134 and the cladding layers 160) from oxidizing.

Figure 12A:
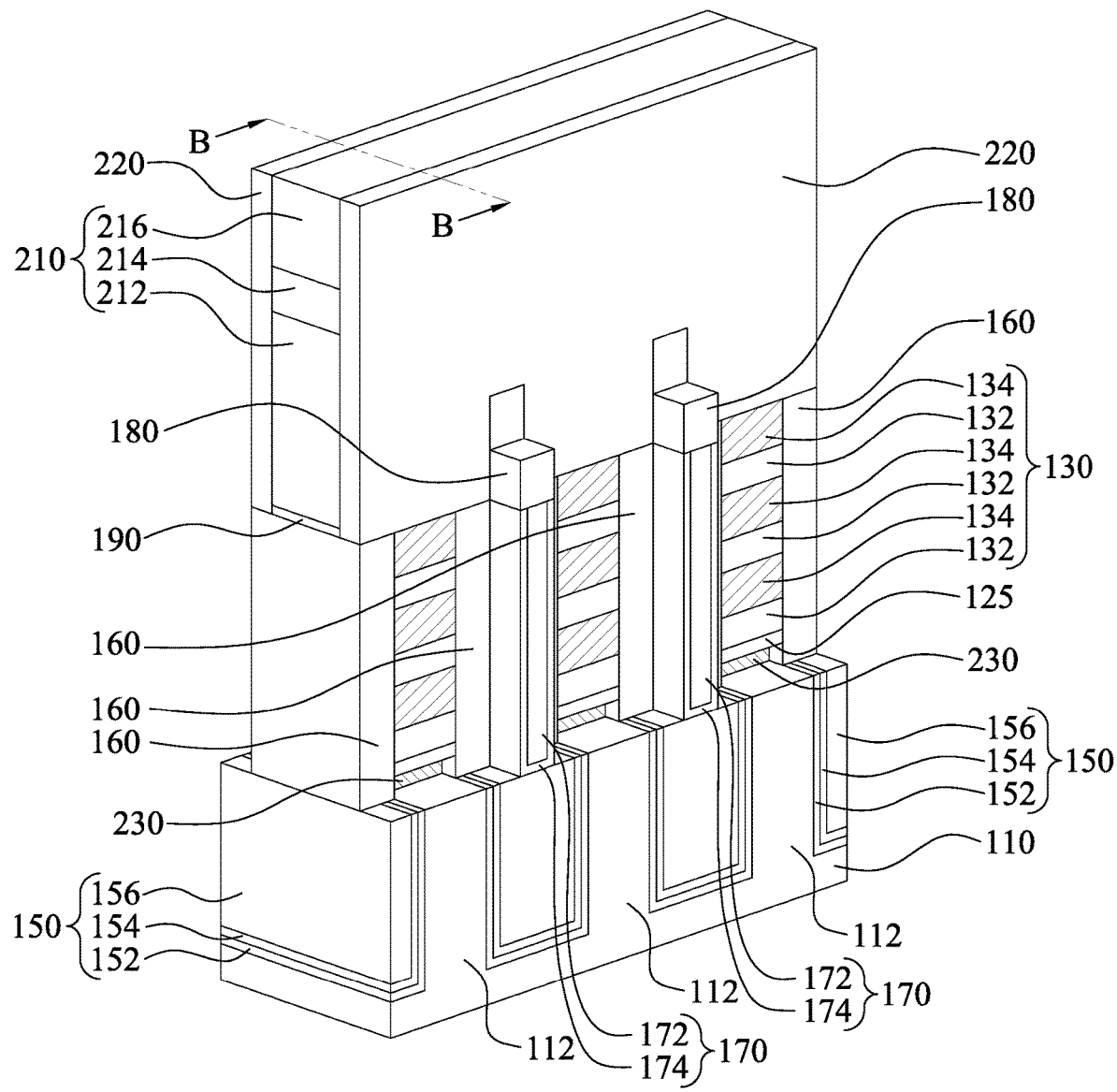
Figure 12B:
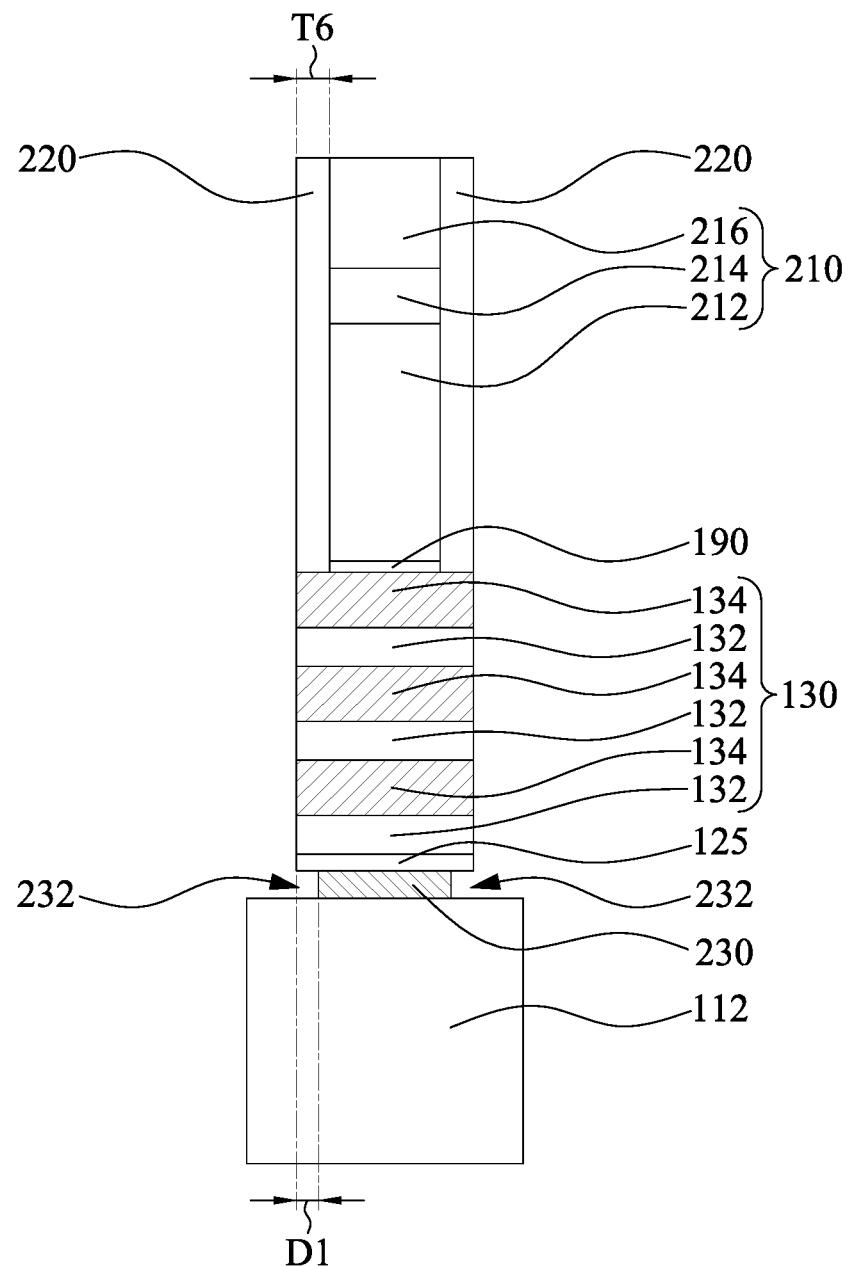

Reference is made to FIGS. 12A and 12B, where FIG. 12B is a cross-sectional view taken along line B-B in FIG. 12A. In some embodiments, a trimming process can be performed after the bottom isolation layers 230 are deposited in order to remove portions of the bottom isolation layers 230 outside the openings 122. This trimming process can further recess the inner bottom spacers 230, so that edges of the bottom isolation layers 230 are located substantially below the gate spacers 220, and recesses 232 are formed at the edges of the bottom isolation layers 230. The depth D1 of the recesses 232 of the bottom isolation layers 230 is in a range from about 2 nm to about 10 nm. The trimming/etching of the bottom isolation layers 230 includes wet etching and/or dry etching. In some embodiments, the depth D1 of the recesses 232 is smaller than a thickness T6 of the gate spacers 220. In some other embodiments, the depth D1 is substantially the same as the thickness T6.

Figure 13A:
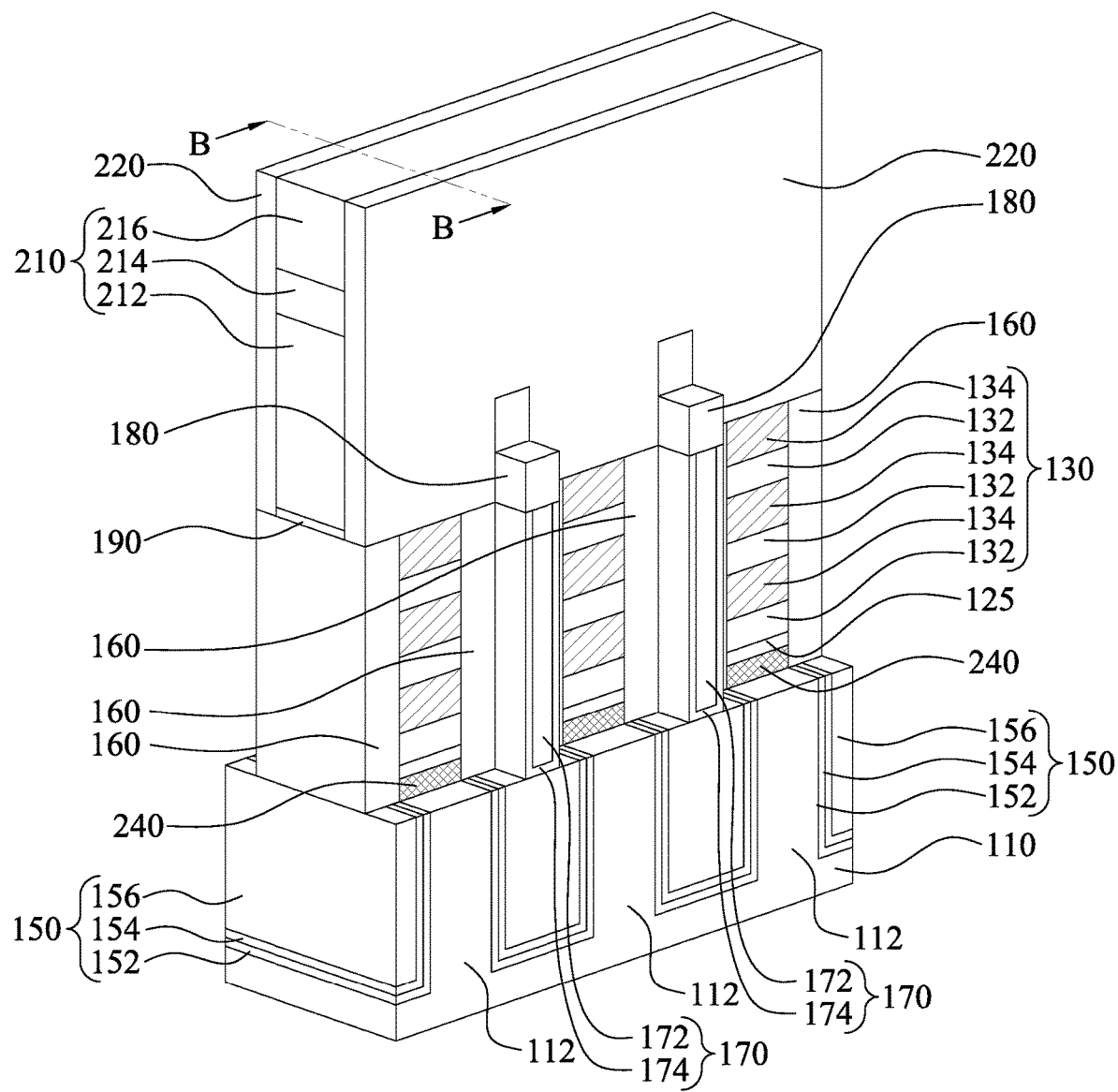
Figure 13B:
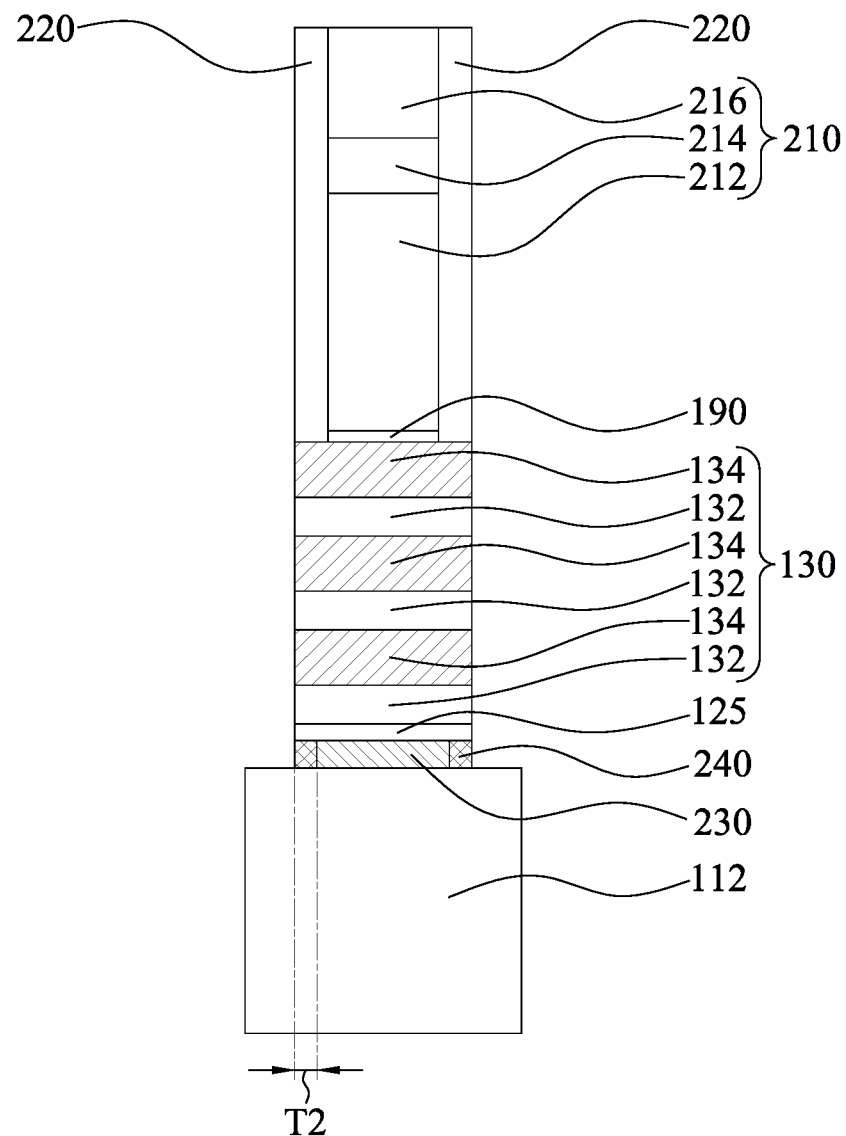

Reference is made to FIGS. 13A and 13B, where FIG. 13B is a cross-sectional view taken along line B-B in FIG. 13A. Bottom spacers 240 are respectively formed in the recesses 232. In some embodiments, a dielectric layer is conformally formed above the structure in FIG. 12A, and one or more etching operations are performed to form the bottom spacers 240 respectively in the recesses 232 (see FIG. 12B). The etching operations include one or more wet and/or dry etching operations. The etching is an isotropic etching in some embodiments. The thickness T2 of the bottom spacers 240 is in a range from about 2 nm to about 10 nm in some embodiments. If the thickness T2 of the bottom spacers 240 is less than about 2 nm, the bottom spacers 240 may not protect the bottom isolation layers 230 from being etched in the following etching or cleaning processes. If the thickness T2 of the bottom spacers 240 is greater than about 10 nm, a parasitic capacitance may be formed between the semiconductor layers 134 (channels) and the substrate 110, and the processing speed of the semiconductor device may be decreased. In some embodiments, the bottom spacers 240 includes a silicon nitride-based material, such as SiN, SiON, SiOCN SiOC, or SiCN and combinations thereof and is different from the material of the bottom isolation layers 230. In certain embodiments, the silicon nitride-based material is SiOCN. In some embodiments, the bottom spacers 240 are low-k dielectric layers, where k is less than 7 in some embodiments, where the low-k dielectric layers improve the parasitic capacitance between the semiconductor layers 134 and the substrate 110. The bottom spacers 240 fully fill the recesses 232 in some embodiments. The bottom spacers 240 can be formed using CVD, including LPCVD and PECVD, PVD, ALD, or other suitable processes.

Figure 14A:
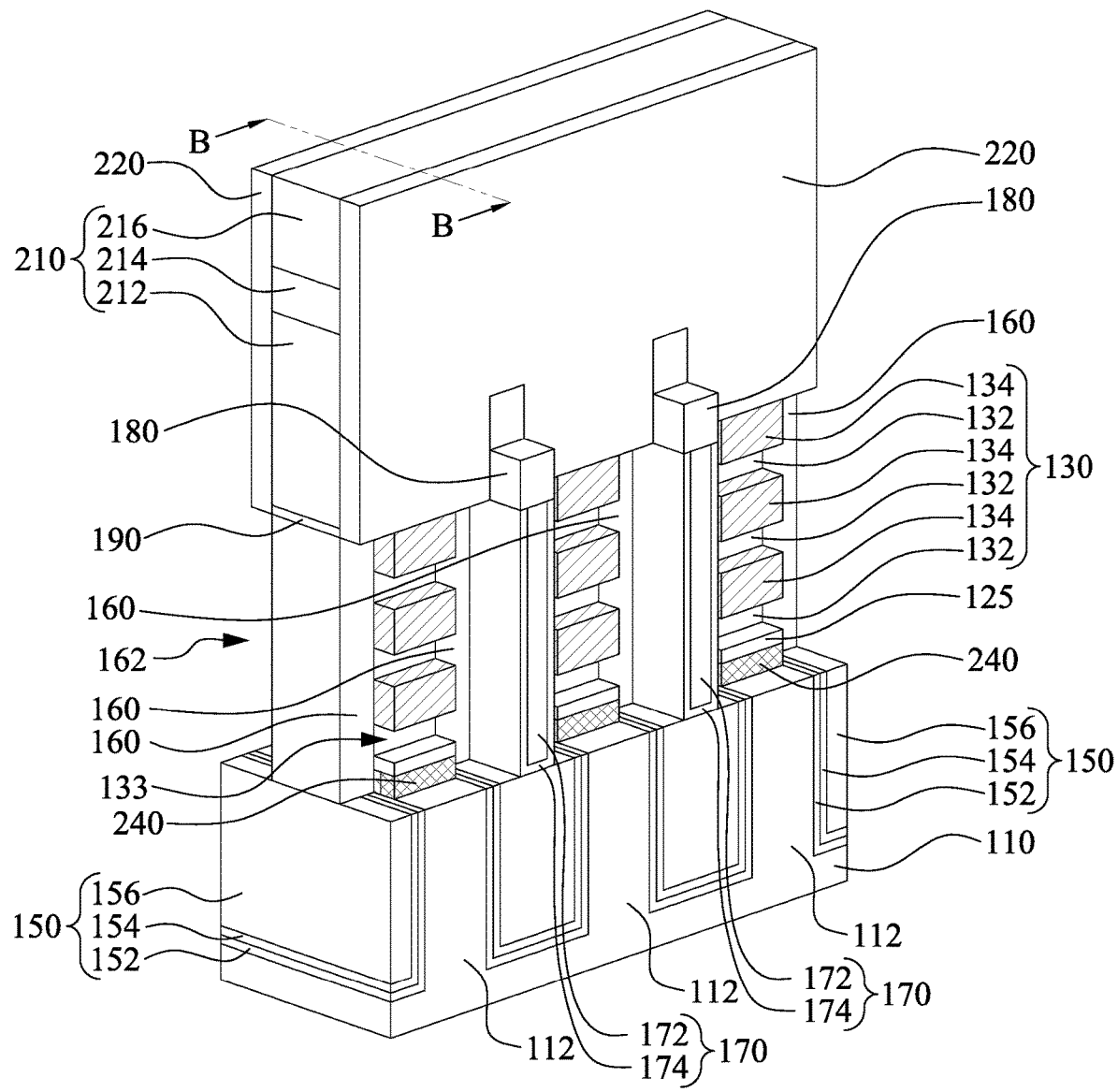
Figure 14B:
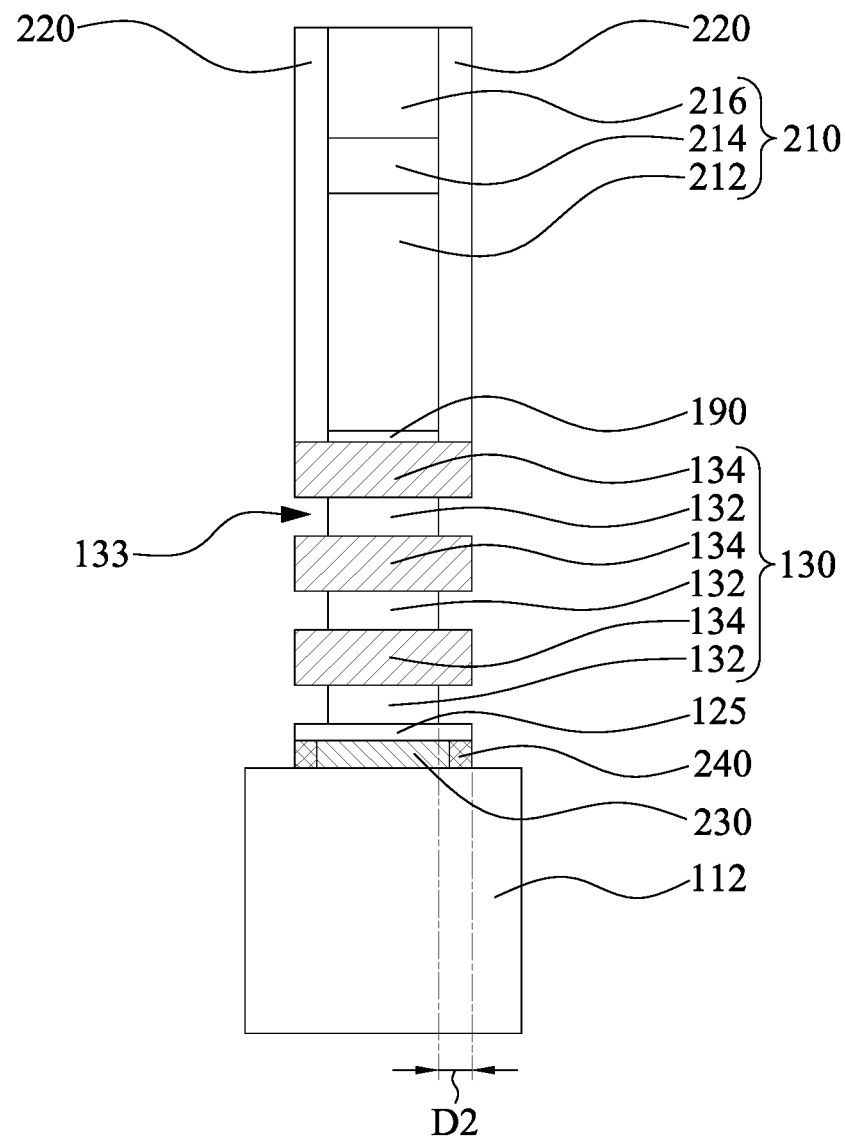

Reference is made to FIGS. 14A and 14B, where FIG. 14B is a cross-sectional view taken along line B-B in FIG. 14A. The semiconductor layers 132 and the cladding layers 160 are horizontally recessed (etched) so that edges of the semiconductor layers 132 and the cladding layers 160 are located substantially below the gate spacers 220 and recesses 133 and 162 are formed. The depth D2 of the recesses 133 and 162 of the semiconductor layers 132 and the cladding layers 160 is in a range from about 3 nm to about 10 nm. The etching of the semiconductor layers 132 and the cladding layers 160 includes wet etching and/or dry etching. A wet etchant such as a tetramethylammonium hydroxide (TMAH) solution can be used to selectively etch the semiconductor layers 132 and the cladding layers 160.

Figure 15A:
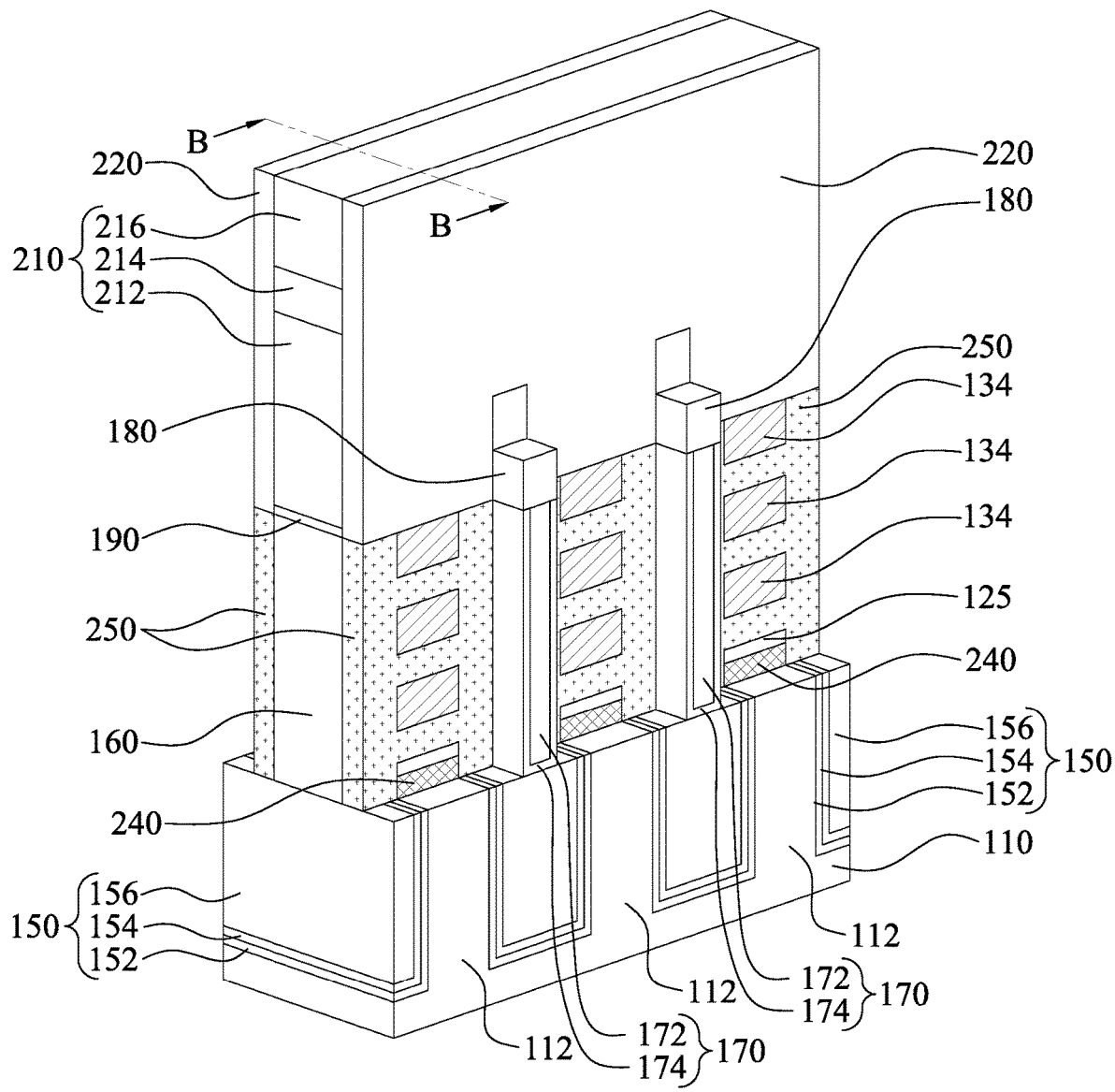
Figure 15B:
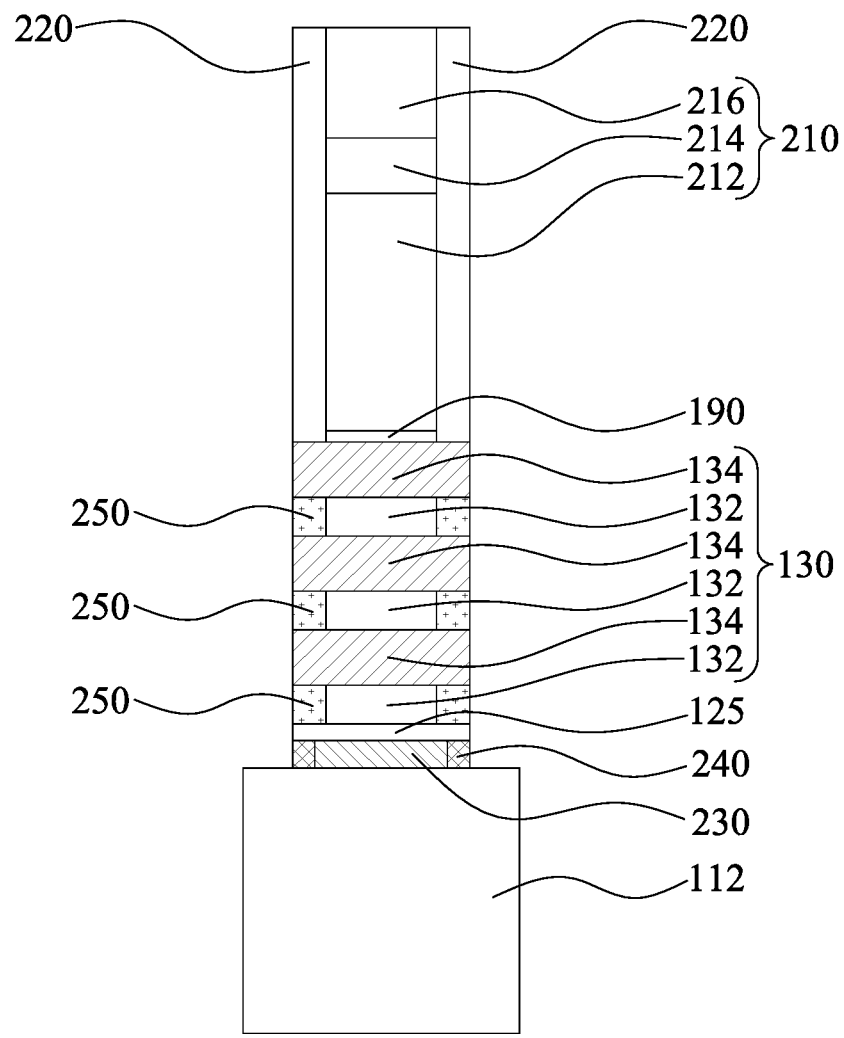

Reference is made to FIGS. 15A and 15B, where FIG. 15B is a cross-sectional view taken along line B-B in FIG. 15A. Inner sidewall spacers 250 are respectively formed in the recesses 133 and 162 (see FIG. 14A) of the semiconductor layers 132 and the cladding layers 160. For example, a dielectric material layer is formed over the structure of FIGS. 14A and 14B, and one or more etching operations are performed to form the inner sidewall spacers 250. In some embodiments, the inner sidewall spacers 250 includes a silicon nitride-based material, such as SiN, SiON, SiOCN or SiCN and combinations thereof and is different from the material of the gate spacers 220. In some embodiments, the inner sidewall spacers 250 are silicon nitride. The inner sidewall spacers 250 and the bottom spacers 240 have the same material or different materials. The inner sidewall spacers 250 may fully fill the recesses 132 and 162 as shown in FIG. 15A. The dielectric material layer can be formed using CVD, including LPCVD and PECVD, PVD, ALD, or other suitable processes. The etching operations include one or more wet and/or dry etching operations. In some embodiments, the etching is an isotropic etching in some embodiments.

Subsequently, a cleaning process is performed on the semiconductor layers 134 to remove native oxide formed thereon. During the cleaning process, since the inner bottom spacers 240 are on outside of the bottom isolation layer 230, the etchants used in the cleaning process is blocked by the inner bottom spacers 240 and does not etch the bottom isolation layer 230. As such, the bottom isolation layer 230 is not consumed or removed after the cleaning process and can provide a good isolation performance between the channel and the substrate 110. In some embodiments, the etchant used in the cleaning process is dilute HF wet solution, or HF/NH$_3$ gas.

Figure 16A:
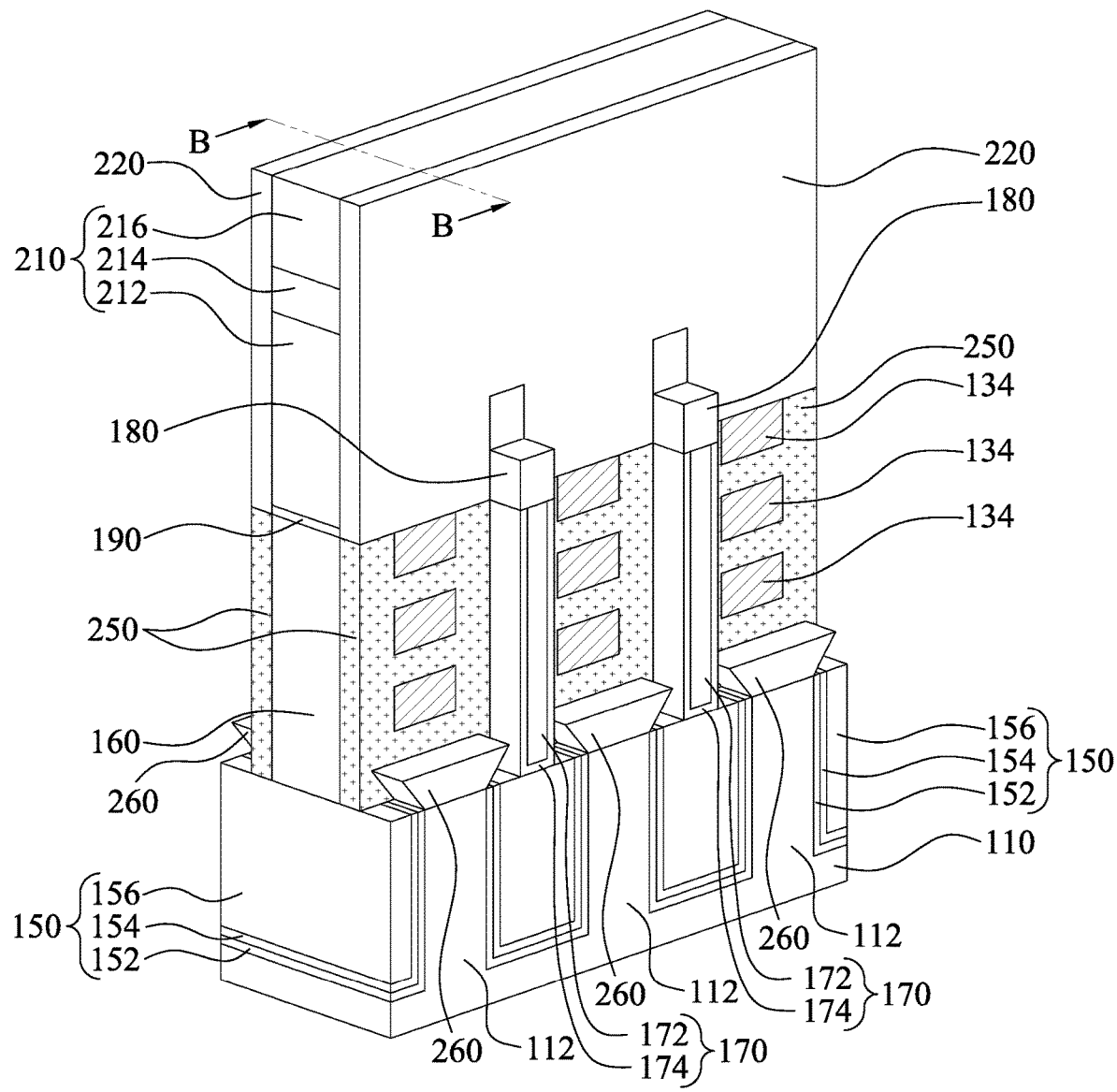
Figure 16B:
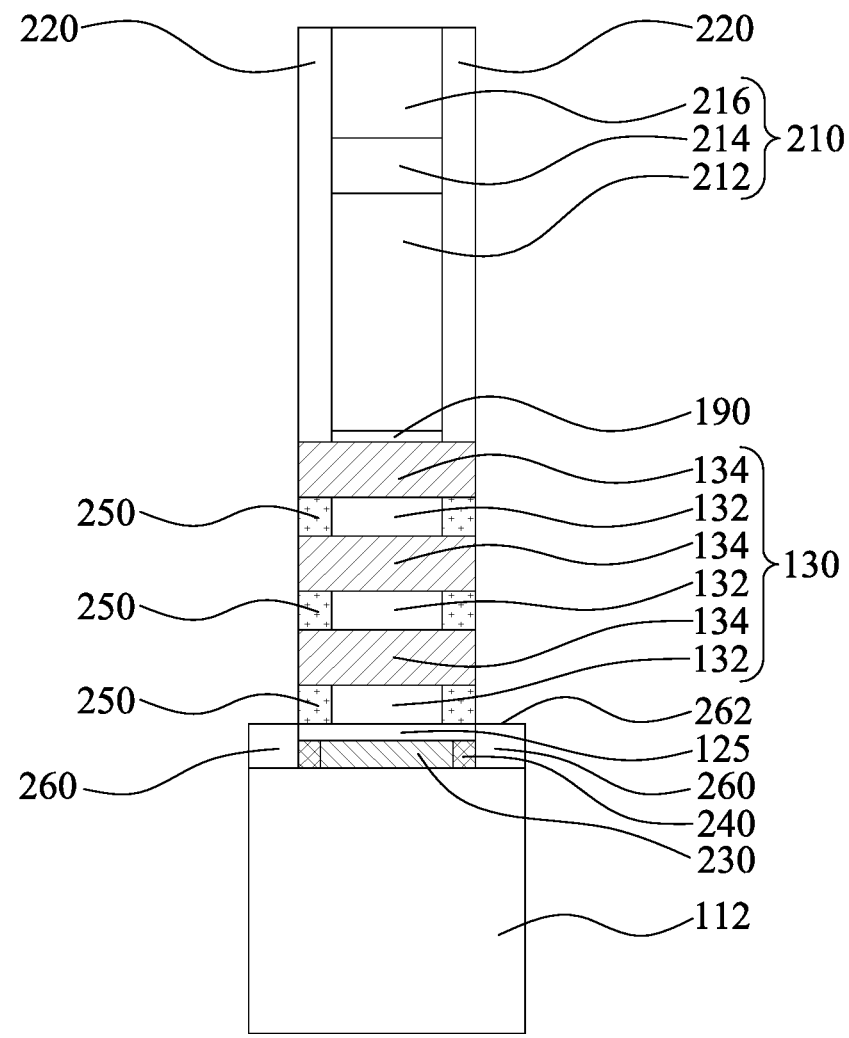

Reference is made to FIGS. 16A and 16B, where FIG. 16B is a cross-sectional view taken along line B-B in FIG. 16A. Bottom epitaxial structures 260 are respectively formed on the base portions 112 of the substrate 110. In some embodiments, semiconductor materials are deposited on the base portions 112 to form the bottom epitaxial structures 260. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). The bottom epitaxial structures 260 have suitable bcrystallographic orientations (e.g., a (100), (110), or (111) crystallographic orientation). The epitaxial processes include CVD deposition techniques (e.g., vapor-phase epitaxy (VPE) and/or ultra-high vacuum CVD (UHV-CVD)), molecular beam epitaxy, and/or other suitable processes. In some embodiments, the bottom epitaxial structures 260 are intrinsic. That is, the bottom epitaxial structures 260 are undoped. The undoped bottom epitaxial structures 260 are benefit for reducing current leakage from top epitaxial structures 270 and 275 (see FIG. 17) to the substrate 110. The top surfaces 262 of the bottom epitaxial structures 260 may be level with the top surface of the protection layer 125, or may be at an intermediate level between the bottom surface of the bottommost semiconductor layer 134 and the top surface of the protection layer 125. That is, the bottom epitaxial structures 260 may be spaced apart from the bottommost semiconductor layer 134.

Figure 17:
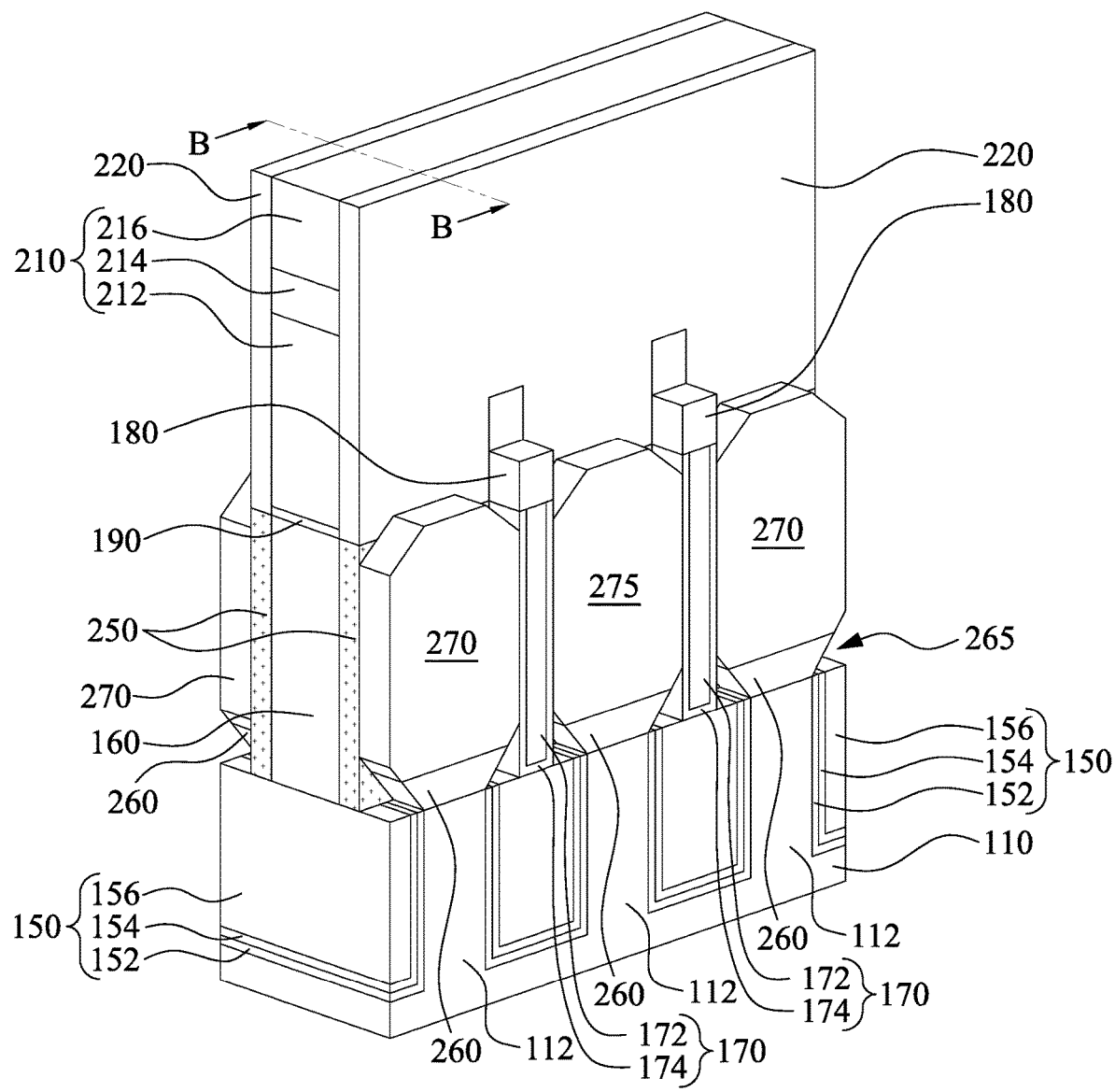

Reference is made to FIG. 17. Top epitaxial structures 270 and 275 are respectively formed on the bottom epitaxial structures 260. In some embodiments, semiconductor materials are deposited on the bottom epitaxial structures 260 to form the top epitaxial structures 270 and 275. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). The top epitaxial structures 270 and 275 have suitable crystallographic orientations (e.g., a (100), (110), or (111) crystallographic orientation). In some embodiments, the top epitaxial structures 270 and 275 include source/drain epitaxial structures. In some embodiments, where an N-type device is desired, the top epitaxial structures 270 may include an epitaxially grown silicon phosphorus (SiP) or silicon carbon (SiC). In some embodiments, where a P-type device is desired, the top epitaxial structures 275 may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation (PIII) process, gas and/or solid source diffusion process, other suitable process, or combinations thereof.

The dummy fin structures 170 are configured to limit the space for epitaxially growing the top epitaxial structures 270 and 275. As a result, the top epitaxial structures 270 and 275 are confined between the dummy fin structures 170. This can be used to produce any desirable size of the top epitaxial structures 270 and 275, particularly small top epitaxial structures 270 and 275 for reducing parasitic capacitances. Further, air gaps 265 may be formed under the top epitaxial structures 270 and 275. For example, the air gap 265 is defined by the top epitaxial structure 270 (or 275), the bottom epitaxial structure 260, the dummy fin structure 170, and the isolation structure 150. In some embodiments, the top epitaxial structures 270 and 275 are in contact with the dummy fin structures 170, and the bottom epitaxial structures 260 are spaced apart from the dummy fin structures 170.

Figure 18:
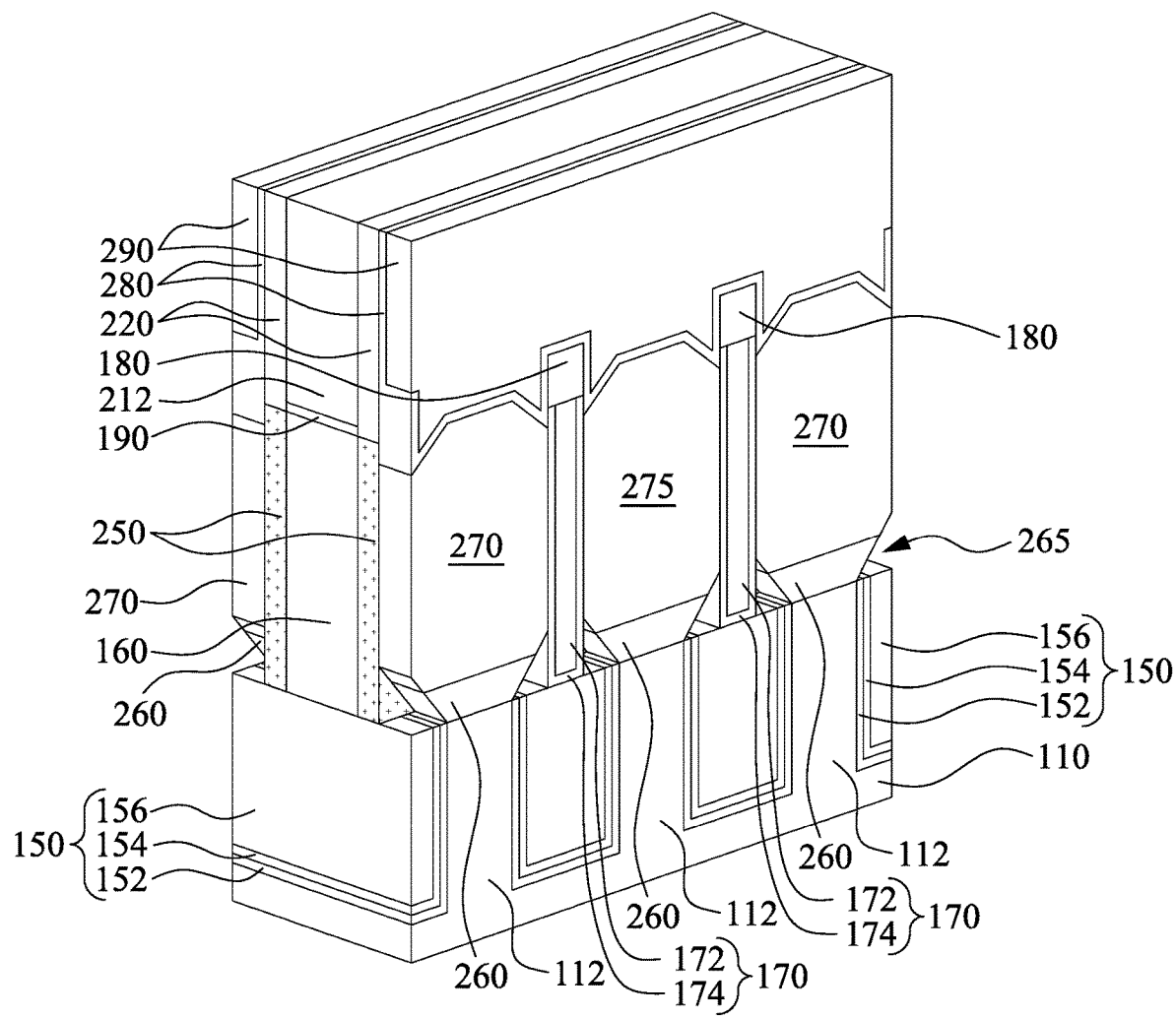

Reference is made to FIG. 18. A contact etch stop layer (CESL) 280 is conformally formed over the structure of FIG. 17. In some embodiments, the CESL 280 can be a stressed layer or layers. In some embodiments, the CESL 280 has a tensile stress and is formed of $Si_3N_4$. In some other embodiments, the CESL 280 includes materials such as oxynitrides. In yet some other embodiments, the CESL 280 may have a composite structure including a plurality of layers, such as a silicon nitride layer overlying a silicon oxide layer. The CESL 280 can be formed using plasma enhanced CVD (PECVD), however, other suitable methods, such as low pressure CVD (LPCVD), atomic layer deposition (ALD), and the like, can also be used.

An interlayer dielectric (ILD) 290 is then formed on the CESL 280. The ILD 290 may be formed by chemical vapor deposition (CVD), high-density plasma CVD, spin-on, sputtering, or other suitable methods. In some embodiments, the ILD 290 includes silicon oxide. In some other embodiments, the ILD 290 may include silicon oxy-nitride, silicon nitride, compounds including Si, O, C and/or H (e.g., silicon oxide, SiCOH and SiOC), a low-k material, or organic materials (e.g., polymers). After the ILD 290 is formed, a planarization operation, such as CMP, is performed, so that the pad layer 214 and the mask layer 216 (see FIG. 17) are removed and the dummy gate layer 212 is exposed.

Figure 19A:
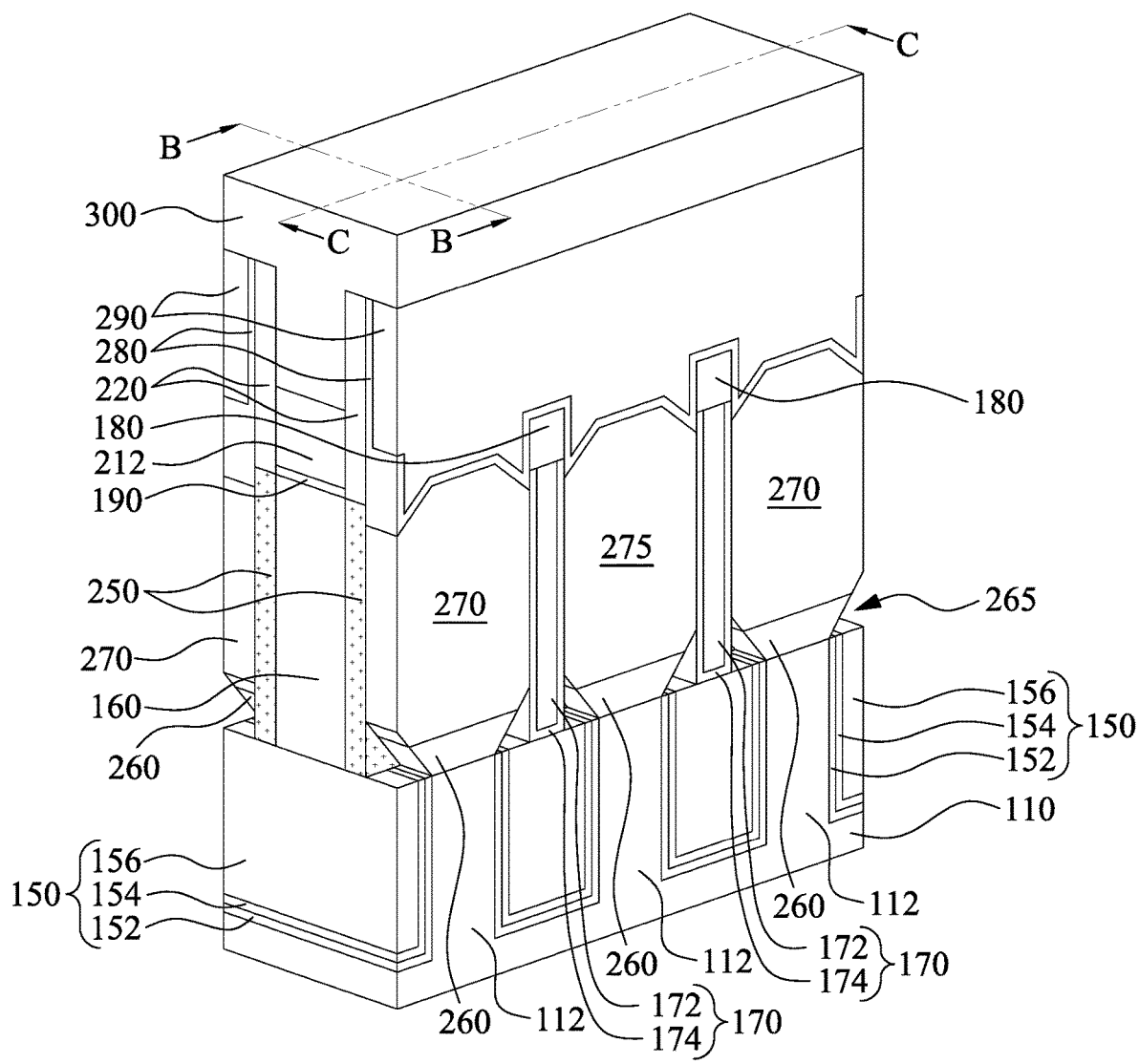
Figure 19B:
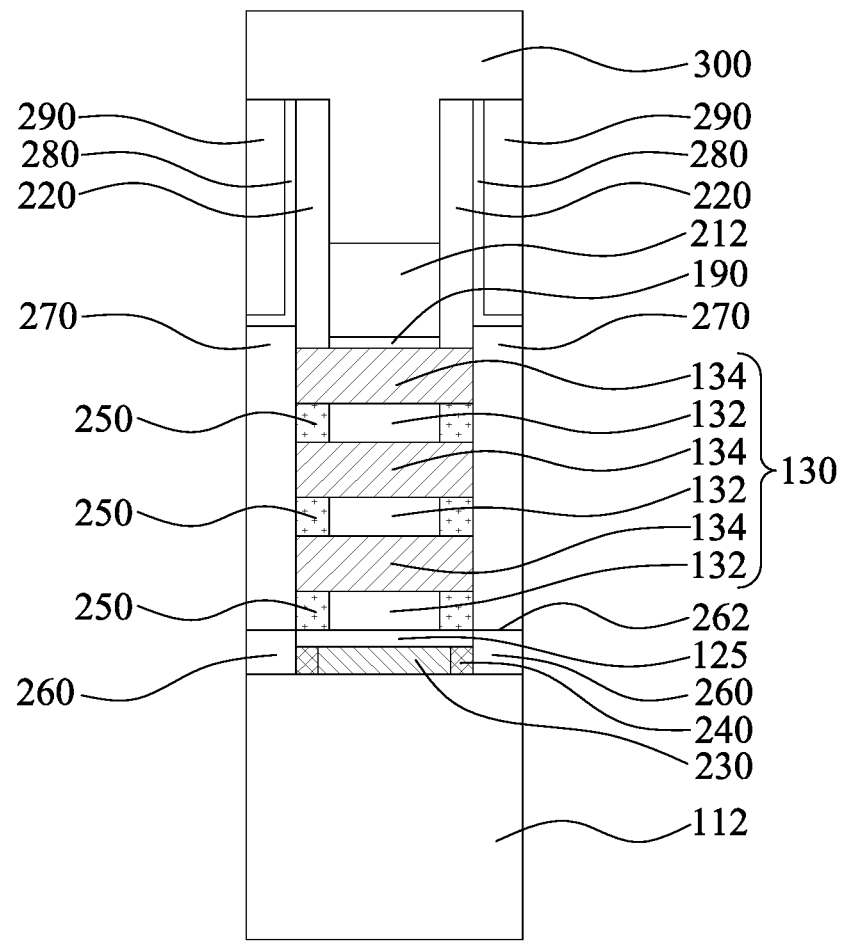
Figure 19C:
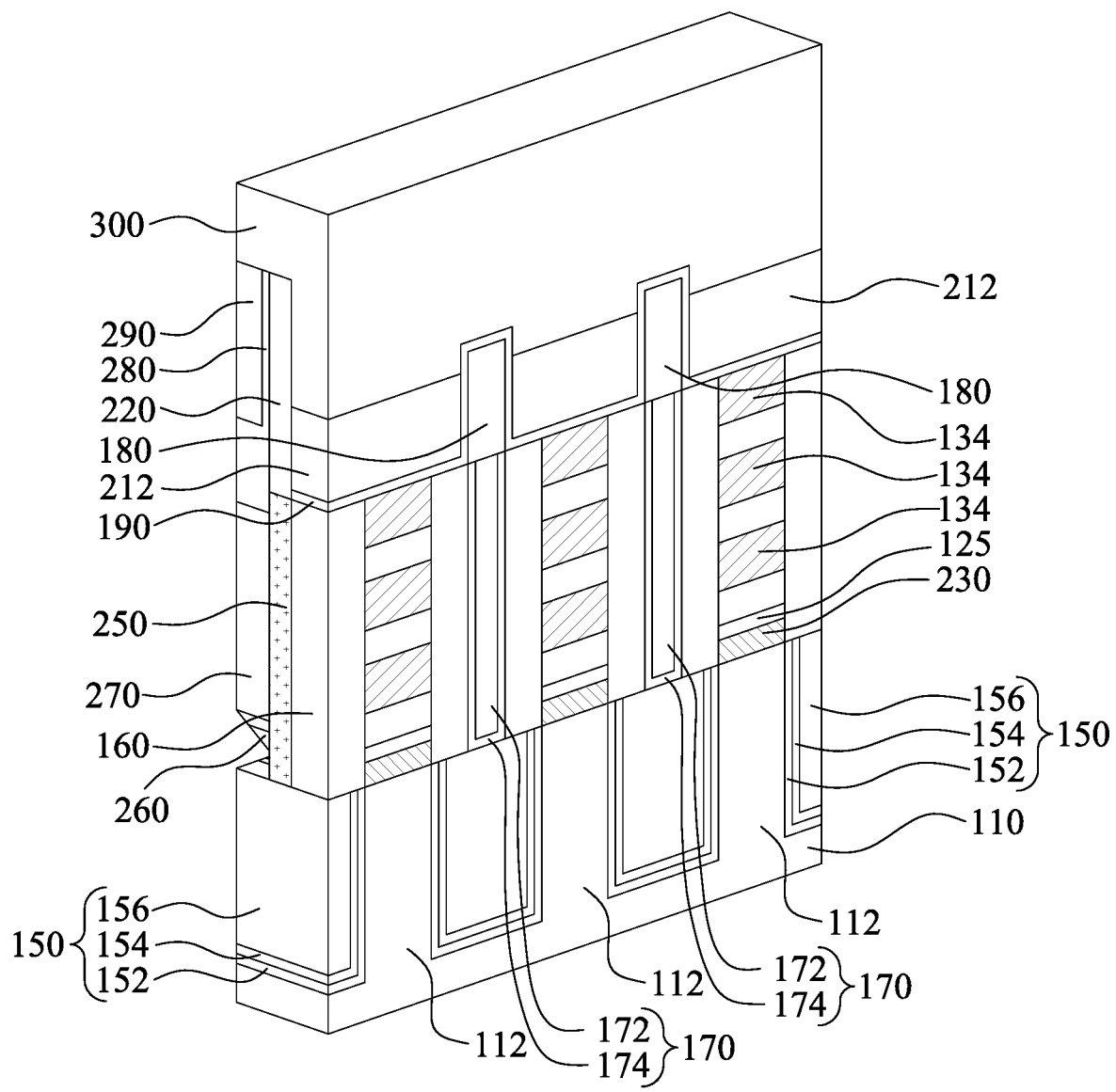

Reference is made to FIGS. 19A-19C, where FIG. 19B is a cross-sectional view taken along line B-B in FIG. 19A, and FIG. 19C is a cross-sectional view taken along line C-C in FIG. 19A. The dummy gate layer 212 is etched back to expose portions of the interfacial layer 190 above the mask layers 180. Subsequently, a resist layer 300 is formed above the etched back dummy gate layer 212. The resist layer 300 covers the dummy gate layer 212, the interfacial layer 190, the CESL 280, and the ILD 290. In some embodiments, the resist layer 300.

Figure 20A:
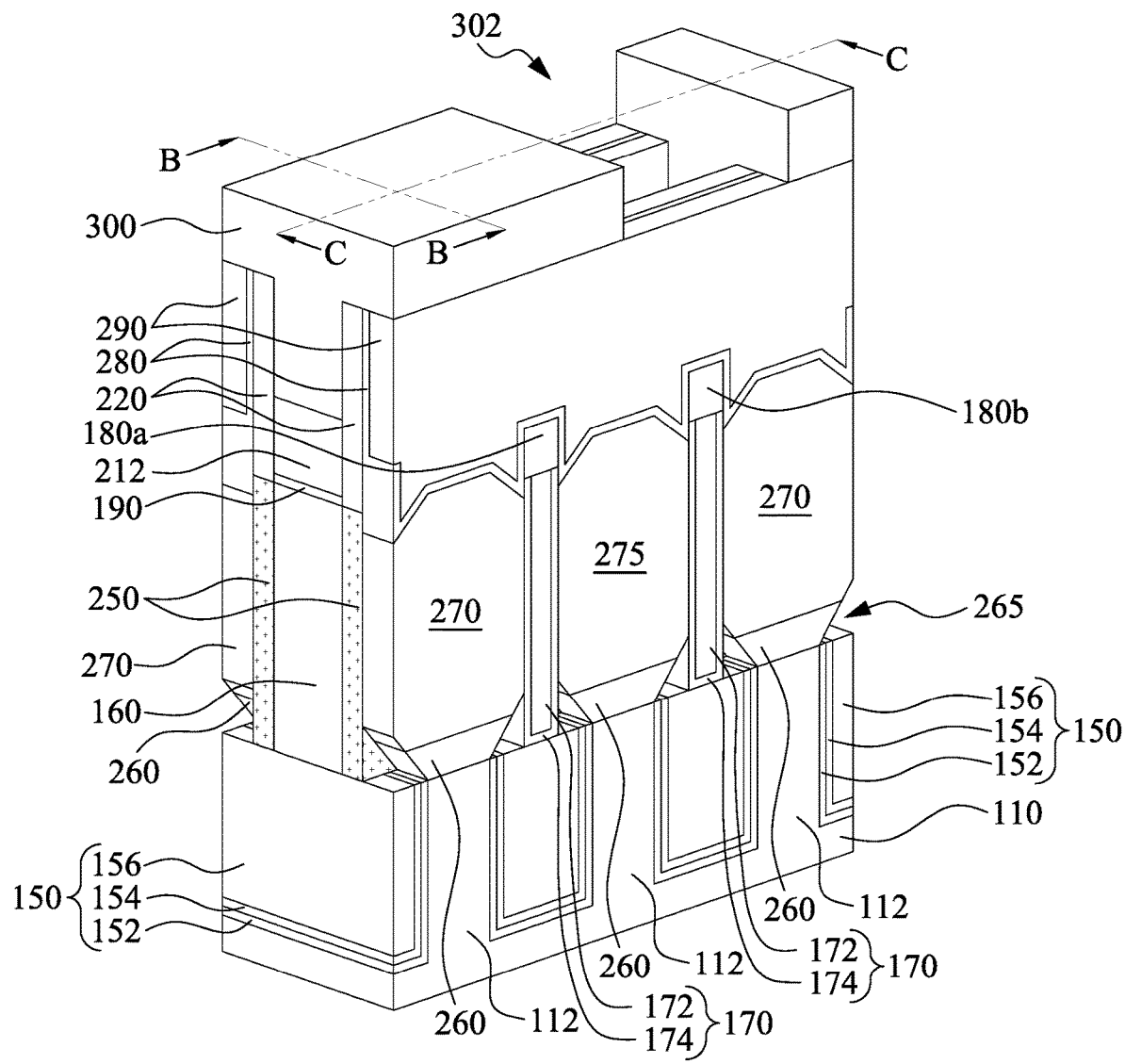
Figure 20B:
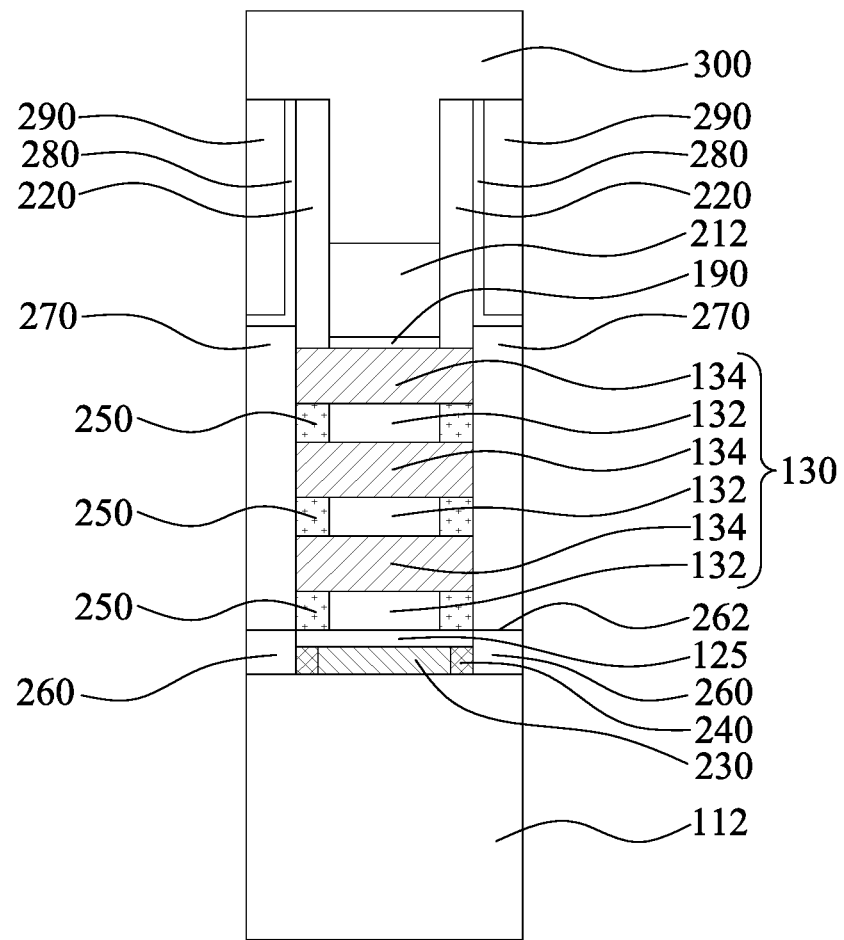
Figure 20C:
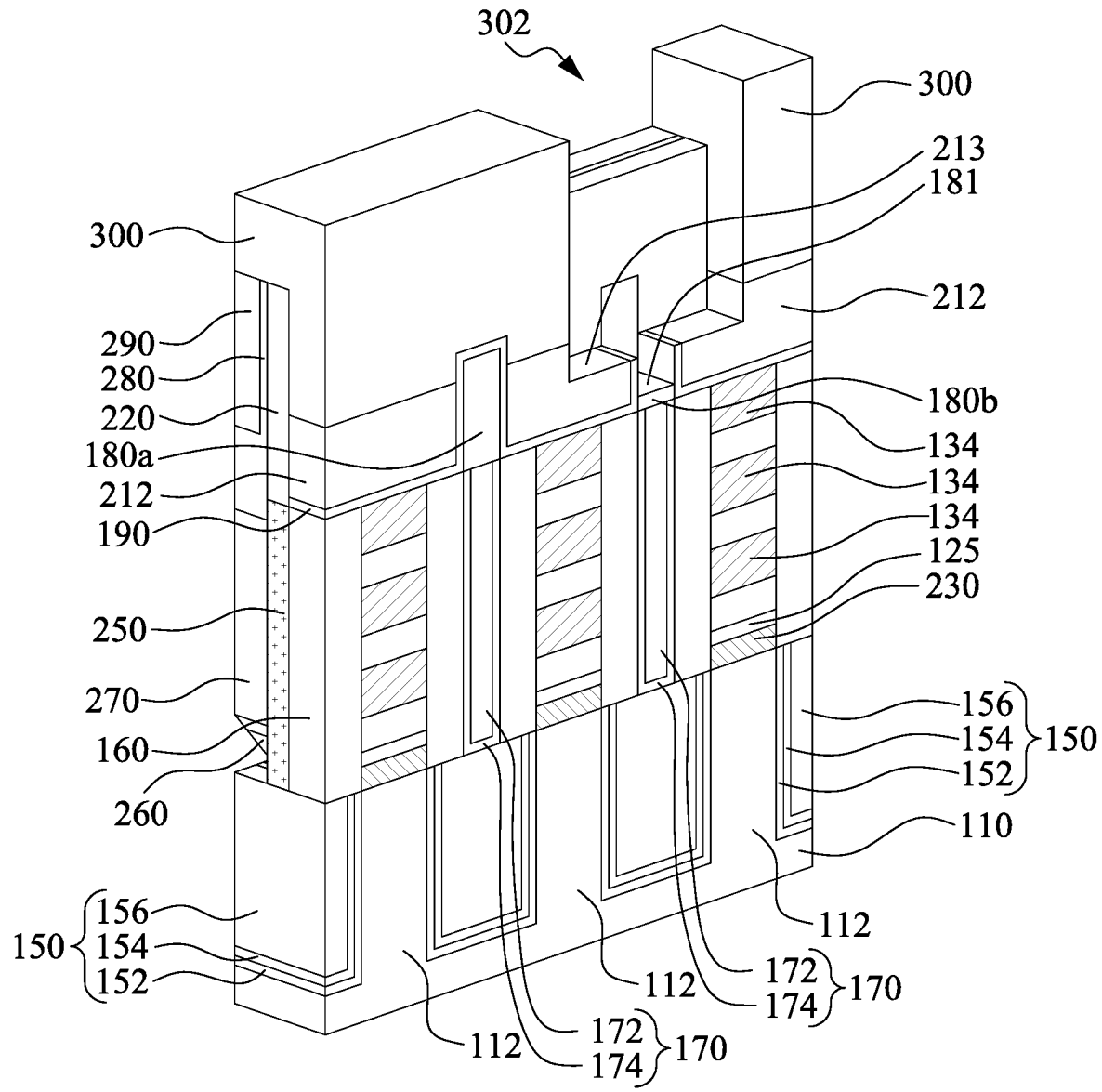

Reference is made to FIGS. 20A-20C, where FIG. 20B is a cross-sectional view taken along line B-B in FIG. 20A, and FIG. 20C is a cross-sectional view taken along line C-C in FIG. 20A. The resist layer 300 is patterned to form an opening 302 therein, and the opening 302 exposes a portion of the interfacial layer 190 above one of the mask layers 180 (labeled as the mask layer 180b) and a portion of the dummy gate layer 212. Another of the mask layers 180 (labeled as the mask layer 180a) is still covered by the resist layer 300. Next, one or more etching processes are performed to recess the mask layer 180b and the exposed portion of the dummy gate layer 212. For example, the exposed portion of the interfacial layer 190 is etched to expose the mask layer 180b, and the exposed mask layer 180b is further recessed. During the etching processes, the exposed portion of the dummy gate layer 212 is also recessed as shown in FIG. 19C. Due to the difference etching rate among the materials, the top surface 213 of the recessed portion of the dummy gate layer 212 is not level with the top surface 181 of the recessed portion of the mask layer 180b. For example, the top surface 213 is higher than the top surface 181.

Figure 21A:
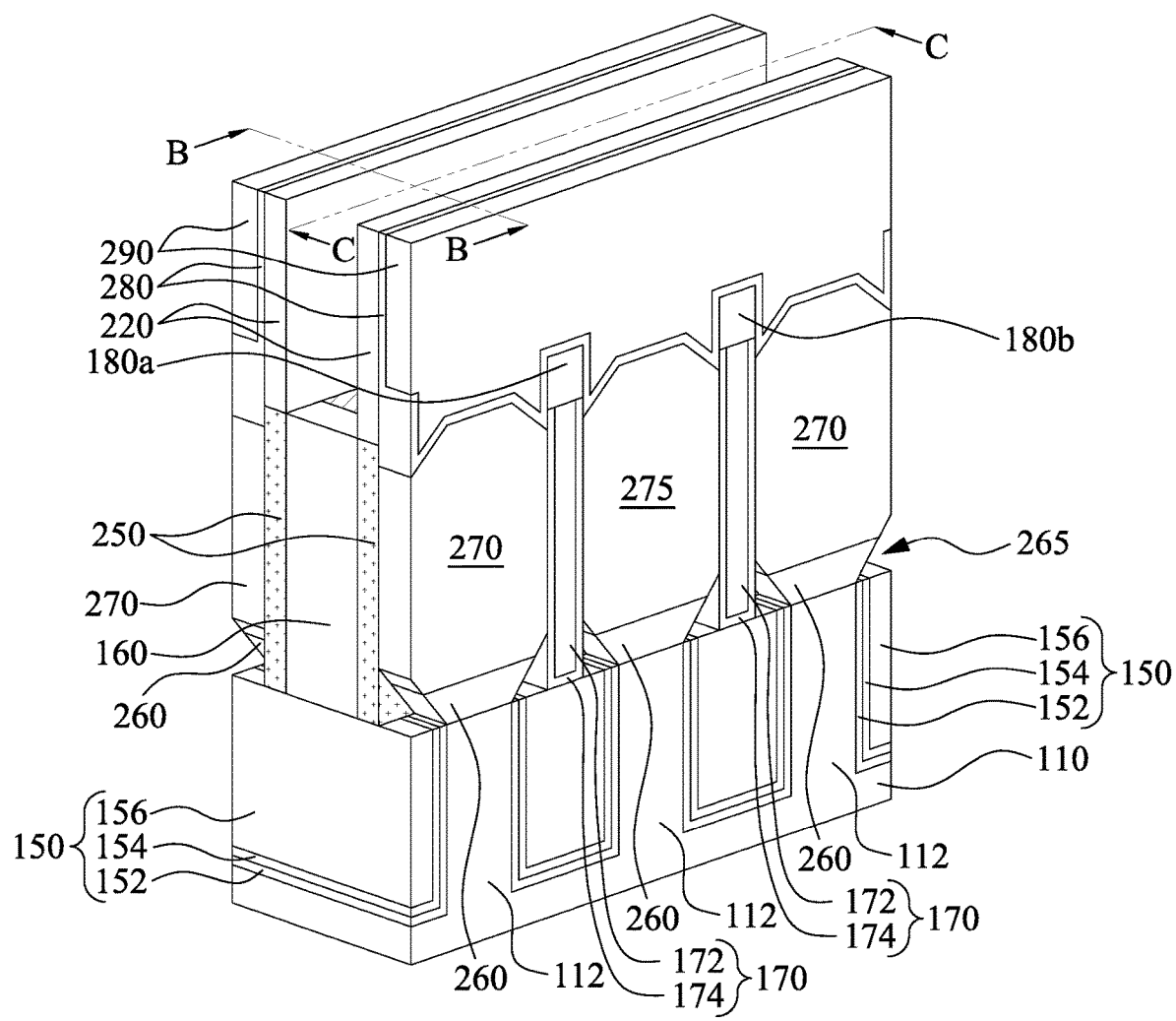
Figure 21B:
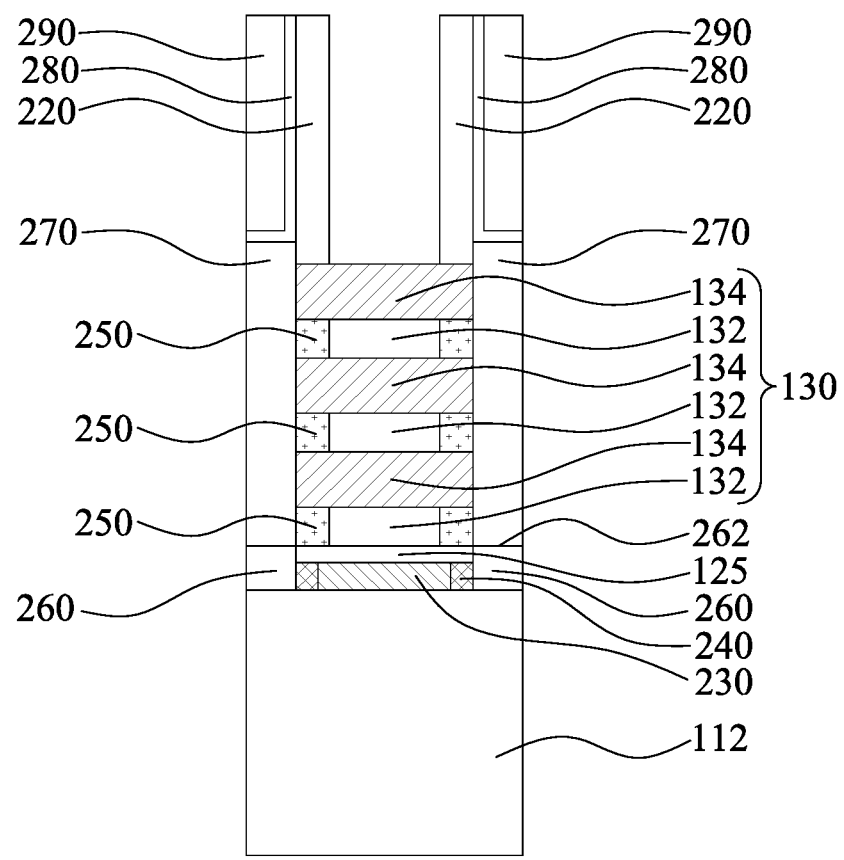
Figure 21C:
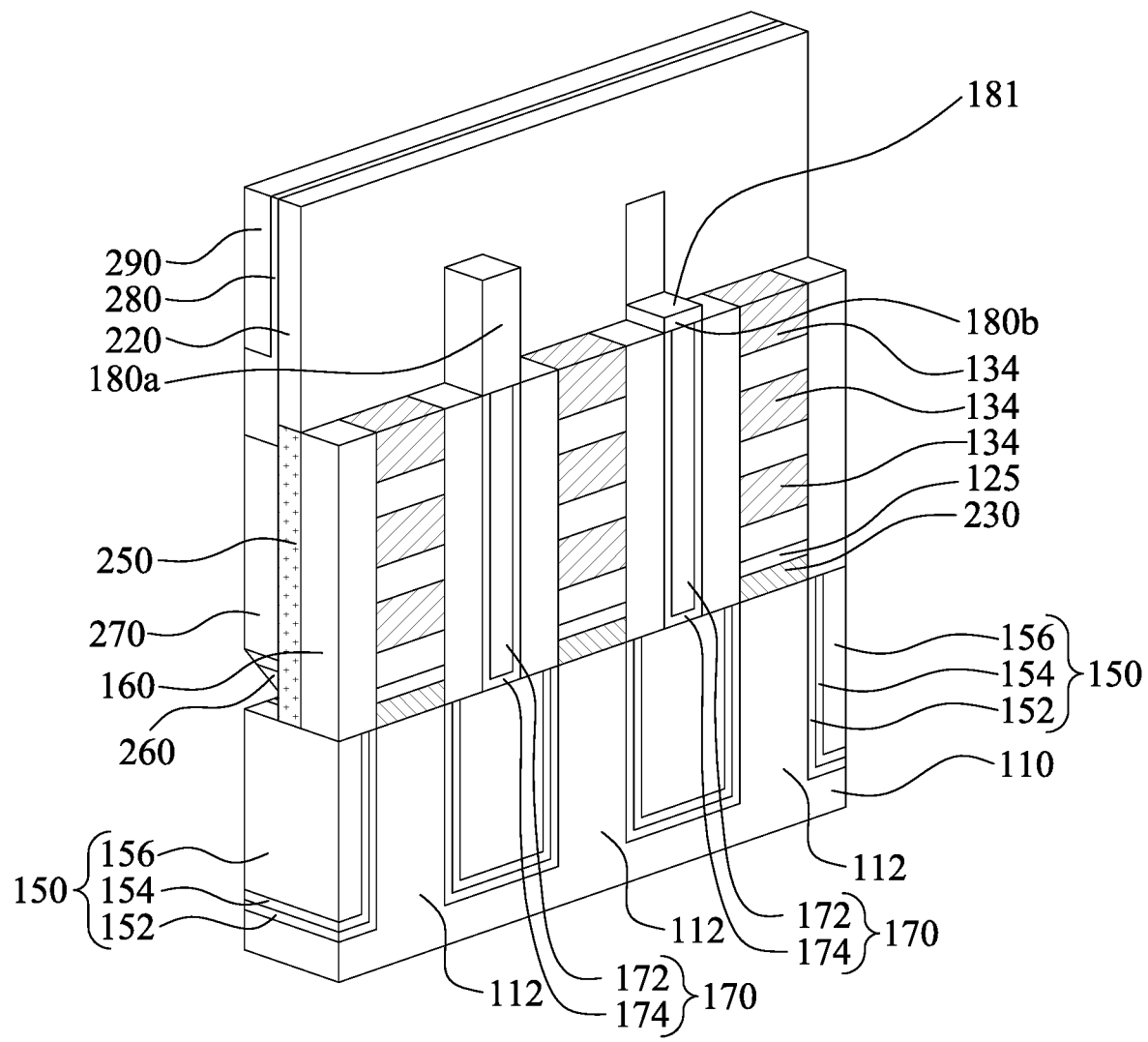

Reference is made to FIGS. 21A-21C, where FIG. 20B is a cross-sectional view taken along line B-B in FIG. 21A, and FIG. 21C is a cross-sectional view taken along line C-C in FIG. 21A. After the etching process, the resist layer 300 (see FIG. 20A-20C) may be stripped by, for example, an ashing process, such as a plasma ashing process using $O_2$ or another stripping process, and a cleaning process, such as a wet dip in dilute hydrofluoric acid or an organic chemical, may be performed to remove any contaminants from the surface of the dummy gate layer 212. The dummy gate layer 212 and the interfacial layer 190 (see FIG. 20C) are then removed, thereby exposing the semiconductor layers 134 and the cladding layers 160. The ILD 290 protects the epitaxial structures 270 and 275 during the removal of the dummy gate layer 212. The dummy gate layer 212 can be removed using plasma dry etching and/or wet etching. When the dummy gate layer 212 is polysilicon and the ILD 290 is silicon oxide, a wet etchant such as a TMAH solution can be used to selectively remove the dummy gate layer 212. The dummy gate layer 212 is thereafter removed using plasma dry etching and/or wet etching. Subsequently, the interfacial layer 190 is removed as well. As such, the cladding layers 160 and the topmost semiconductor layers 134 are exposed.

Figure 22A:
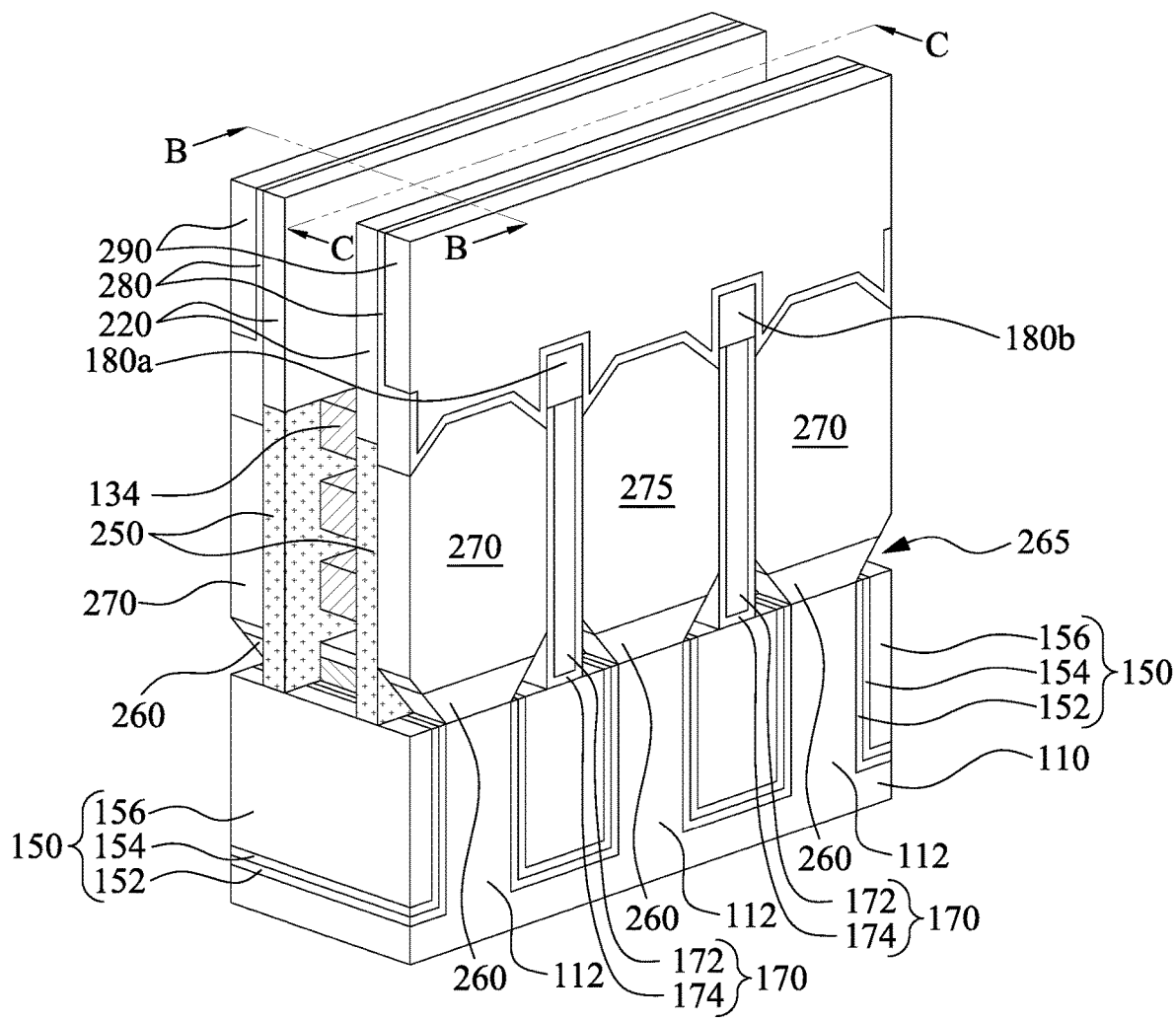
Figure 22B:
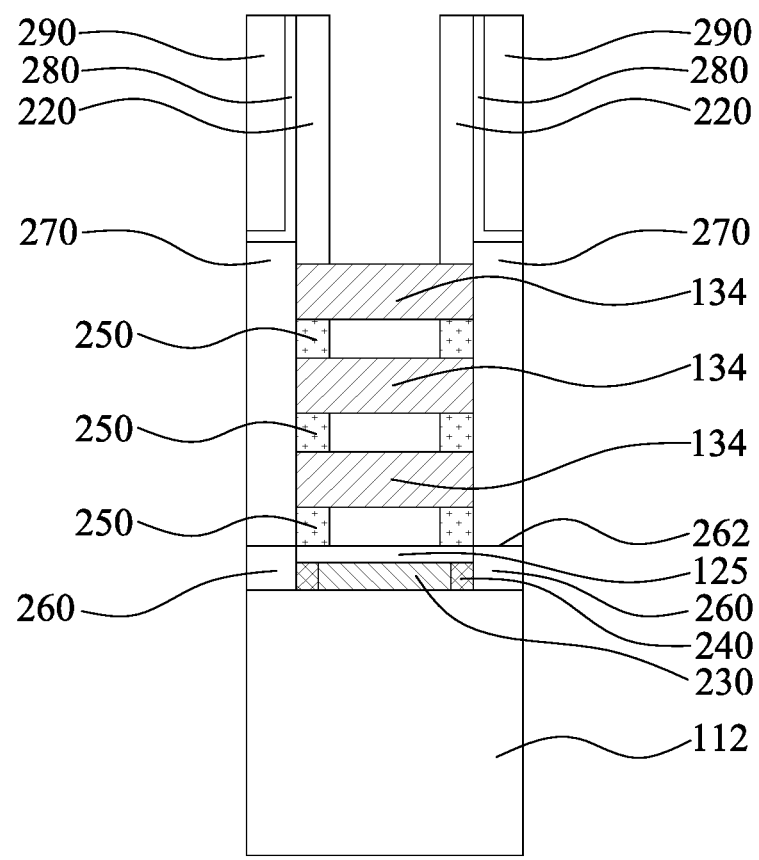
Figure 22C:
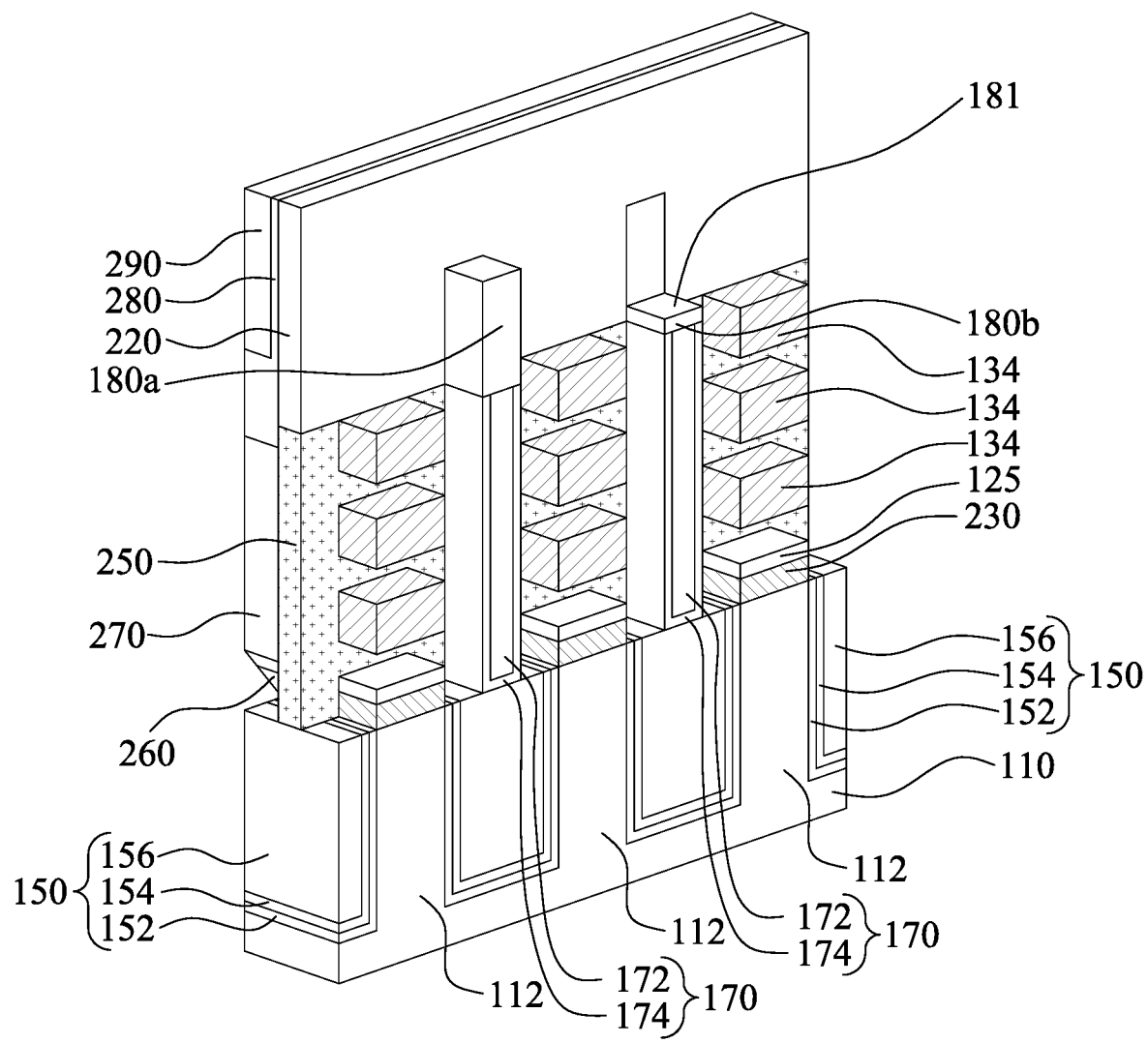

Reference is made to FIGS. 22A-22C, where FIG. 22B is a cross-sectional view taken along line B-B in FIG. 22A, and FIG. 22C is a cross-sectional view taken along line C-C in FIG. 22A. After the dummy gate layer 212 (see FIGS. 20A-20C) is removed, the remaining semiconductor layers 132 and the cladding layers 160 (see FIGS. 21A-21C) are removed, thereby forming sheets (or wires or rods or columns) of the semiconductor layers 134. The semiconductor layers 132 and the cladding layers 160 can be removed or etched using an etchant that can selectively etch the semiconductor layers 132 and the cladding layers 160. In some embodiments, the etchant for removing the semiconductor layers 132 and the cladding layers 160 is $F_2$ (Fluorine).

Figure 23A:
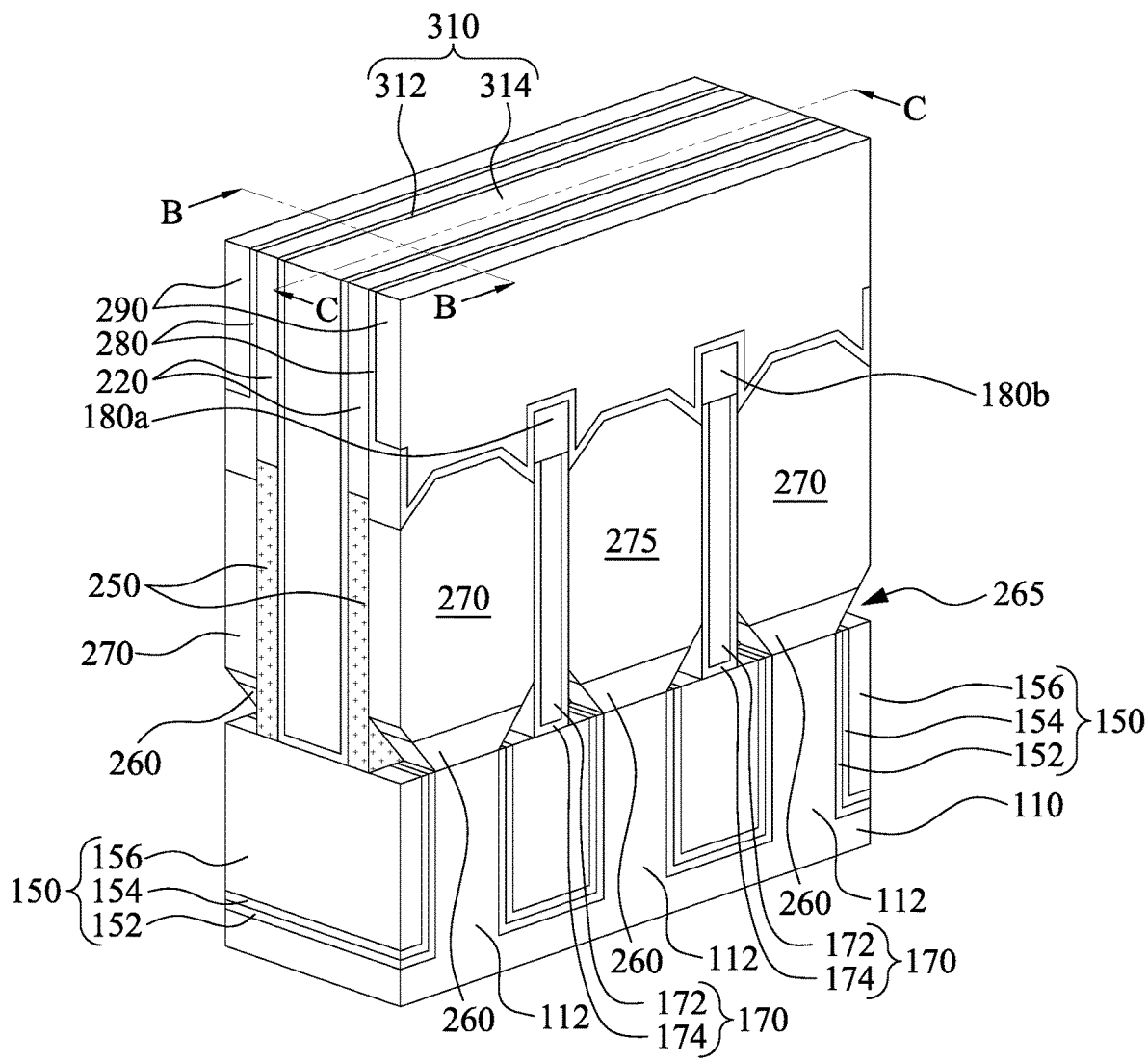
Figure 23B:
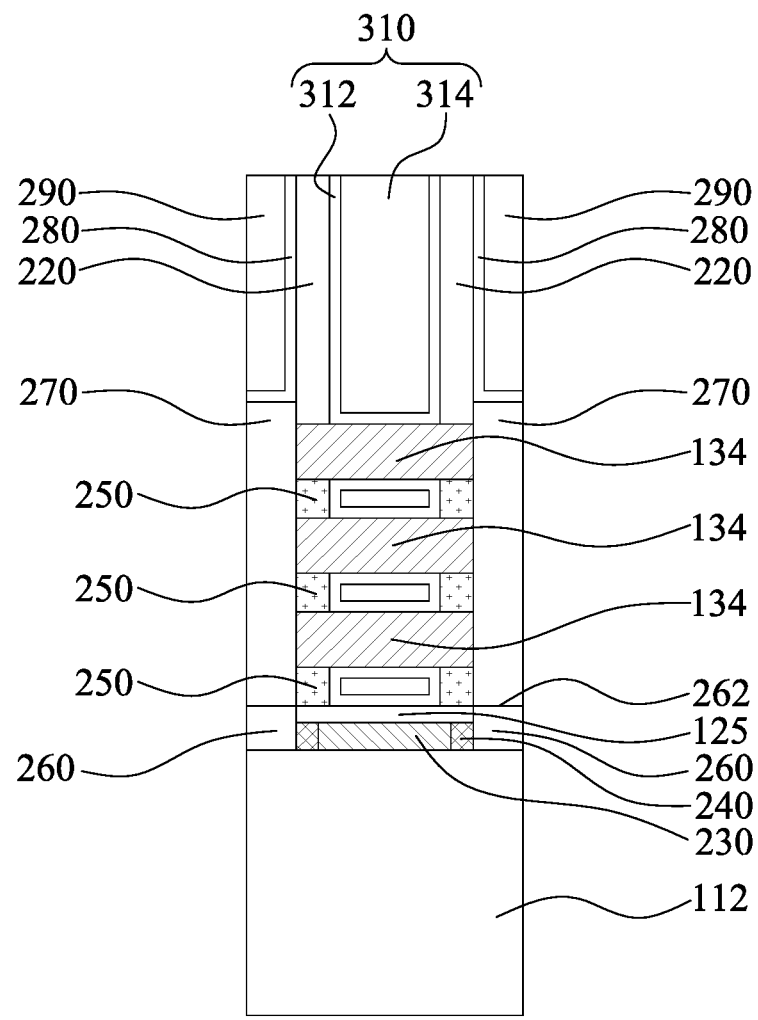
Figure 23C:
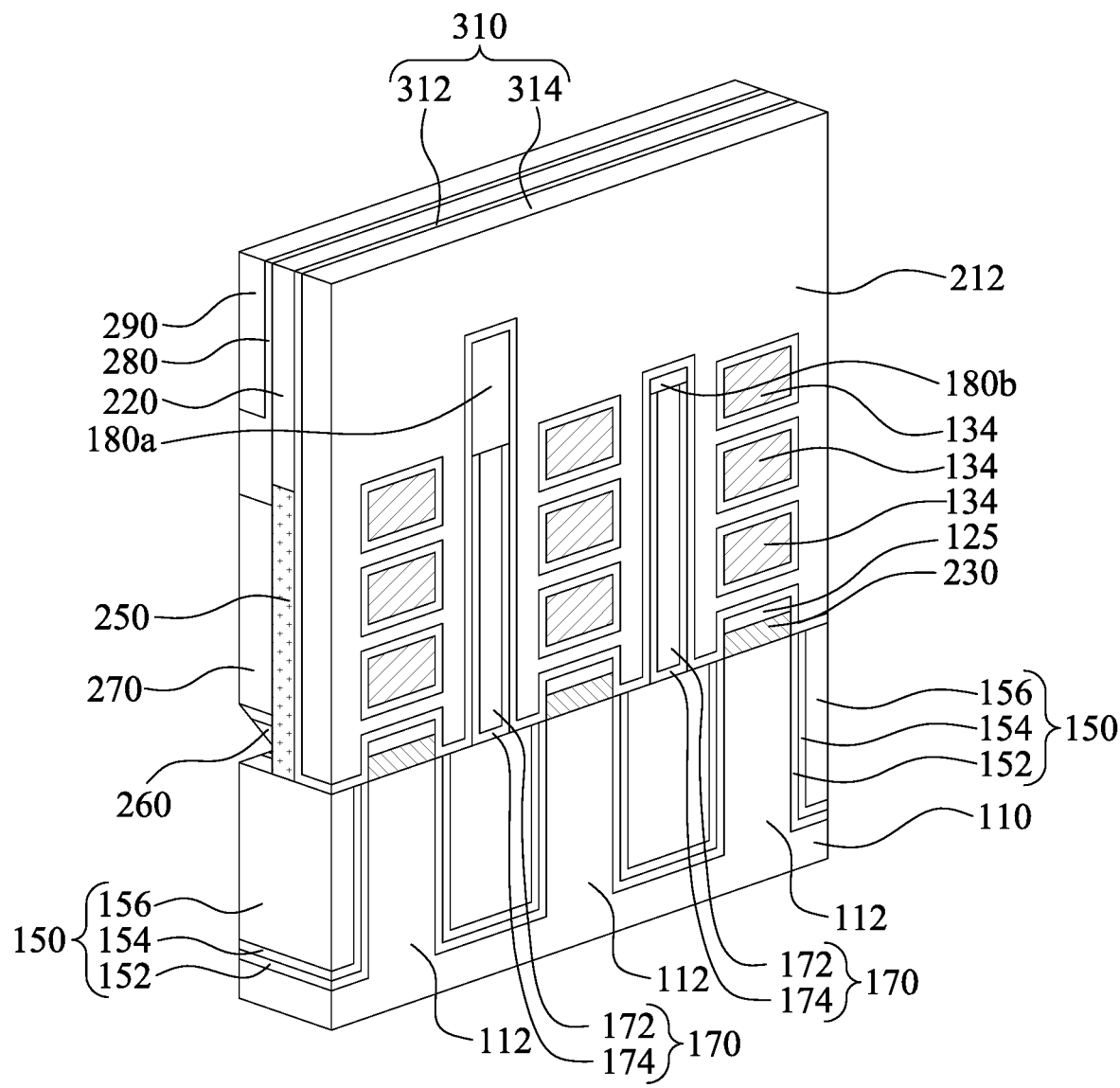

Reference is made to FIGS. 23A-23C, where FIG. 23B is a cross-sectional view taken along line B-B in FIG. 23A, and FIG. 23C is a cross-sectional view taken along line C-C in FIG. 23A. A gate structure 310 is formed and/or filled between the gate spacers 220 or the inner sidewall spacers 250. That is, the gate structure 310 encircles (wraps) the semiconductor layers 134. The gate spacers 220 are disposed on opposite sides of the gate structure 310. The gate structure 310 includes a gate dielectric layer 312 and a gate electrode 314. The gate electrode 314 includes one or more work function metal layer (s) and a filling metal. The gate dielectric layer 312 is conformally formed. That is, the gate dielectric layer 312 is in contact with the isolation structures 150, the bottom isolation layers 230, the protection layers 125, the semiconductor layers 134, the dummy fin structures 170, and the mask layers 180a and 180b, in which the semiconductor layers 134 are referred to as channels of the semiconductor device. The gate dielectric layer 312 is spaced apart from the bottom spacers 240 in some embodiments. Furthermore, the gate dielectric layer 312 surrounds the semiconductor layers 134, and spaces between the semiconductor layers 134 are still left after the deposition of the gate dielectric layer 312. In some embodiments, the gate dielectric layer 312 includes a high-k material (k is greater than 7) such as hafnium oxide ($HfO_2$), zirconium oxide ($ZrO_2$), lanthanum oxide ($Al_2O_3$), hafnium aluminum oxide ($HfO_2$), hafnium silicon oxide ($HfSiO_2$), aluminum oxide ($Al_2O_3$), or other suitable materials. In some embodiments, the gate dielectric layer 312 may be formed by performing an ALD process or other suitable process. In some embodiments, the thickness of the gate dielectric layer 312 is in a range of about 10 nm to about 30 nm.

The work function metal layer is conformally formed on the gate dielectric layer 312, and the work function metal layer surrounds the semiconductor layers 134 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process.

The filling metal fills the remained space between the gate spacers 220 and between the inner sidewall spacers 250. That is, the work function metal layer(s) is in contact with and between the gate dielectric layer 312 and the filling metal. The filling metal may include material such as tungsten or aluminum. After the deposition of the gate dielectric layer 312 and the gate electrode 314, a planarization process, such as a CMP process, may be then performed to remove excess portions of the gate dielectric layer 312 and the gate electrode 314 to form the gate structure 310.

Figure 24A:
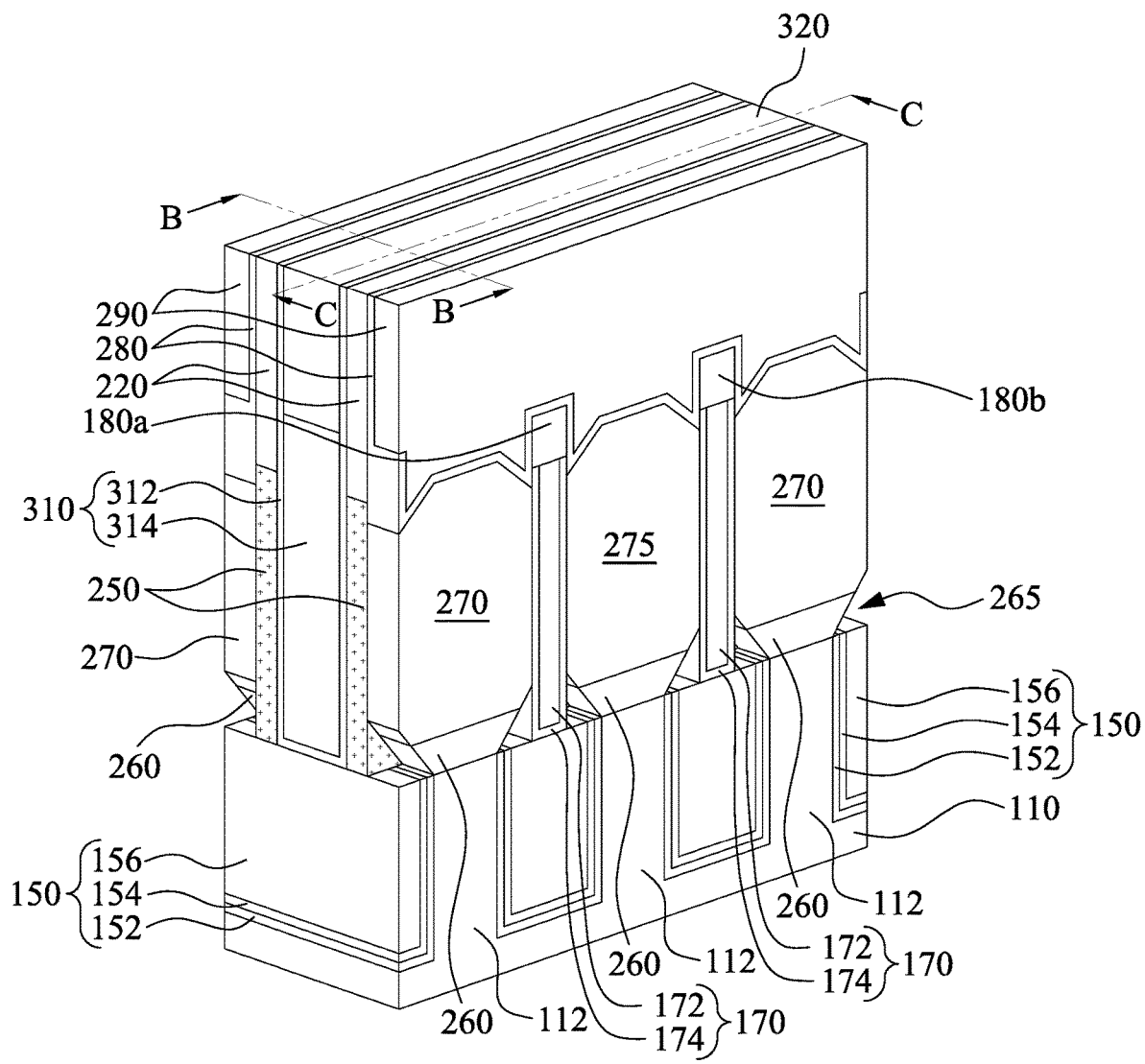
Figure 24B:
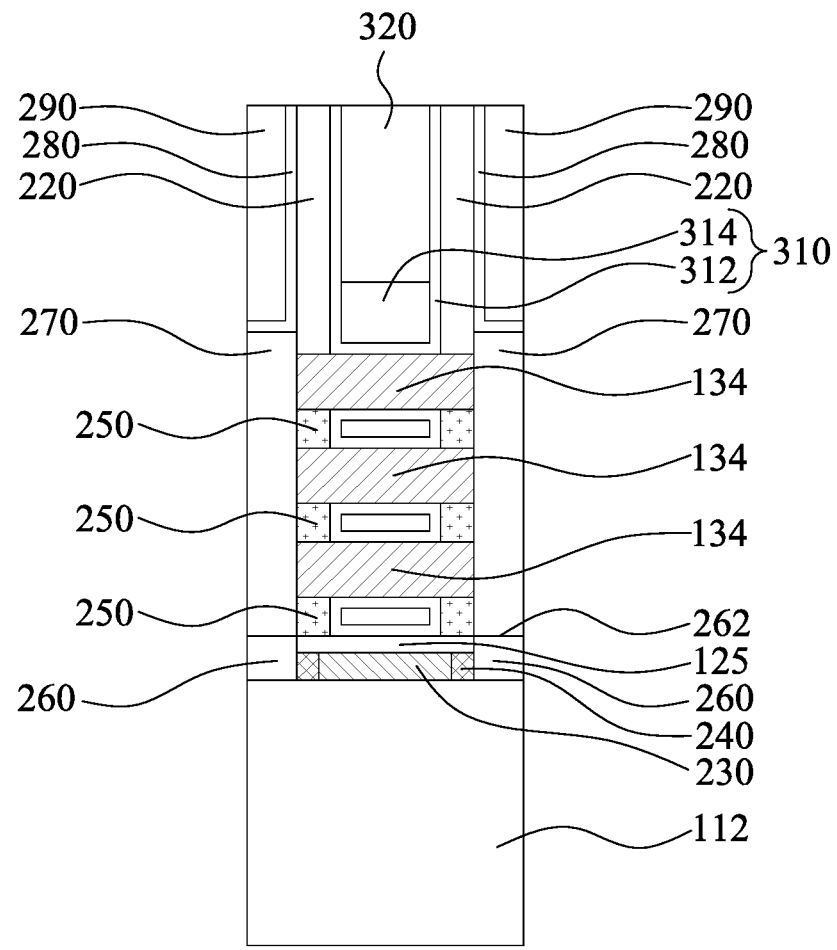
Figure 24C:
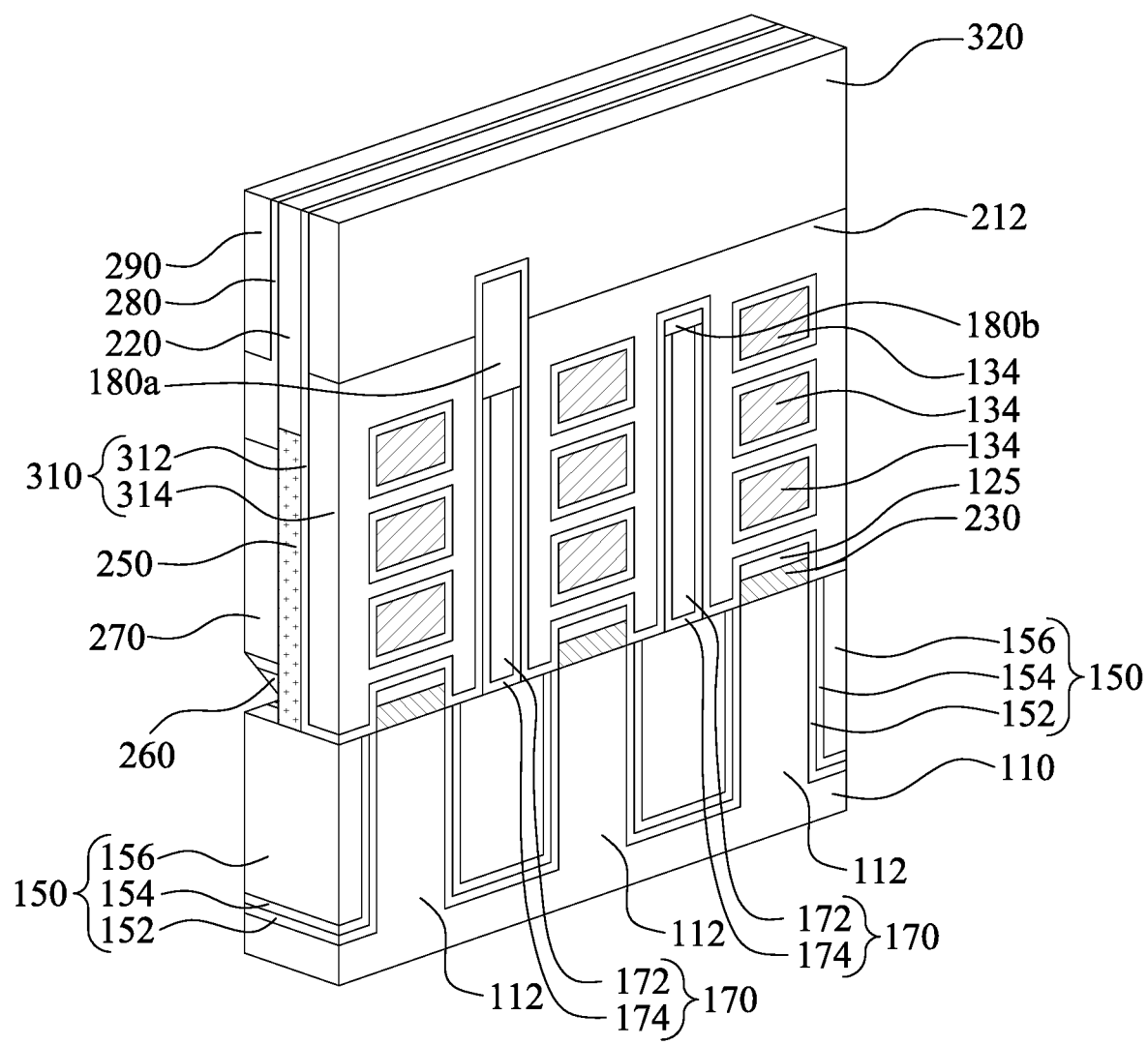

Reference is made to FIGS. 24A-24C, where FIG. 24B is a cross-sectional view taken along line B-B in FIG. 24A, and FIG. 24C is a cross-sectional view taken along line C-C in FIG. 24A. In some embodiments, the gate electrode 314 of the gate structure 310 is etched back to a predetermined level and form a gate trench thereon. As such, a portion of the mask layer 180a protrudes from the gate electrode 314 while the mask layer 180b is embedded in the gate electrode 314. Then, a capping layer 320 is formed over the etched gate electrode 314 using, for example, a deposition process to deposit a dielectric material over the substrate 110, followed by a CMP process to remove excess dielectric material outside the gate trenches. In some embodiments, the capping layer 320 includes silicon nitride, silicon oxide, silicon oxynitride, SiCN, SiCON, SiOC, or other suitable dielectric material. By way of example, if the capping layer 320 is SiN, the spacer structures 220 and/or the ILD 290 are dielectric materials different from SiN. The capping layer 320 can be used to define self-aligned contact region and thus referred to as SAC structures or a SAC layer. The capping layer 320 is in contact with the gate dielectric layer 312, and a portion of the mask layer 180a is embedded in the capping layer 320.

Figure 25A:
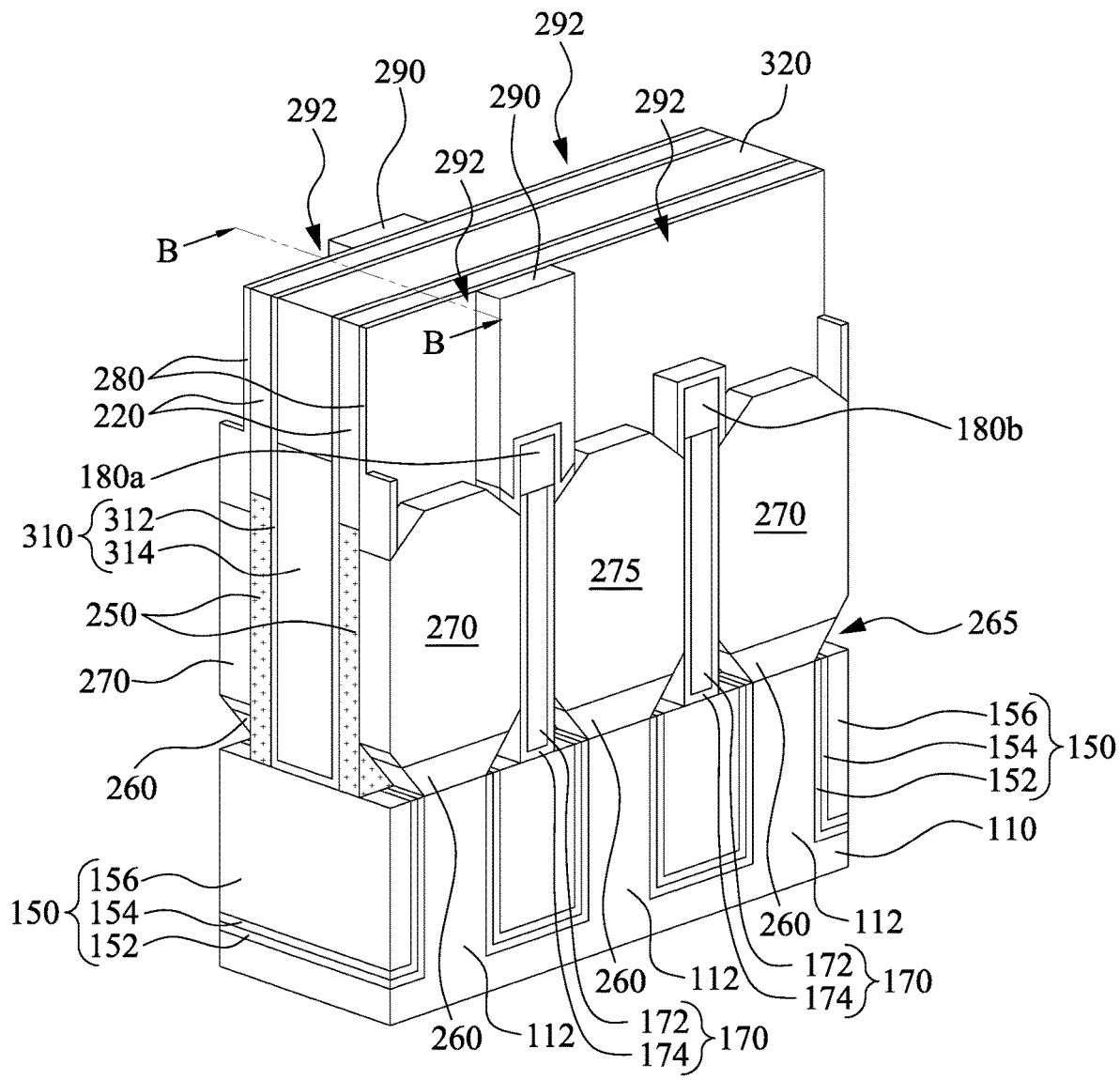
Figure 25B:
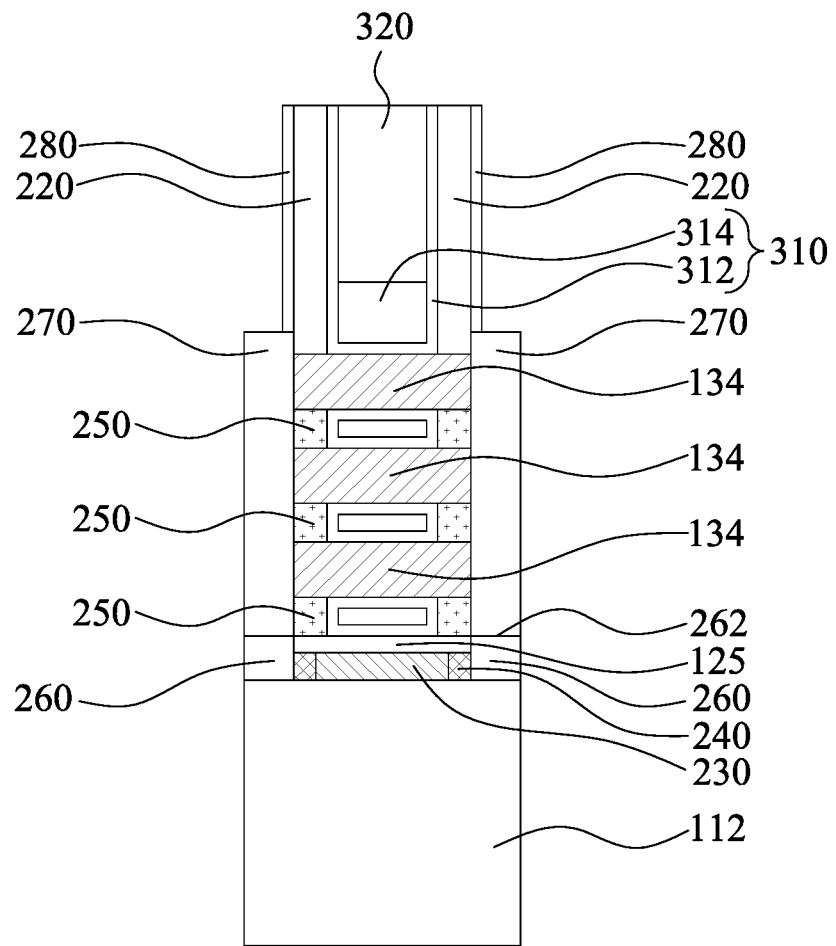

Reference is made to FIGS. 25A and 25B, where FIG. 25B is a cross-sectional view taken along line B-B in FIG. 25A. The ILD 290 is patterned to form trenches 292 on opposite sides of the gate structure 310 and the capping layer 320, and then the CESL 280 is patterned to expose the epitaxial structures 270 and 275. In some embodiments, multiple etching processes are performed to pattern the ILD 290 and the CESL 280. The etching processes include dry etching process, wet etching process, or combinations thereof.

Figure 26A:
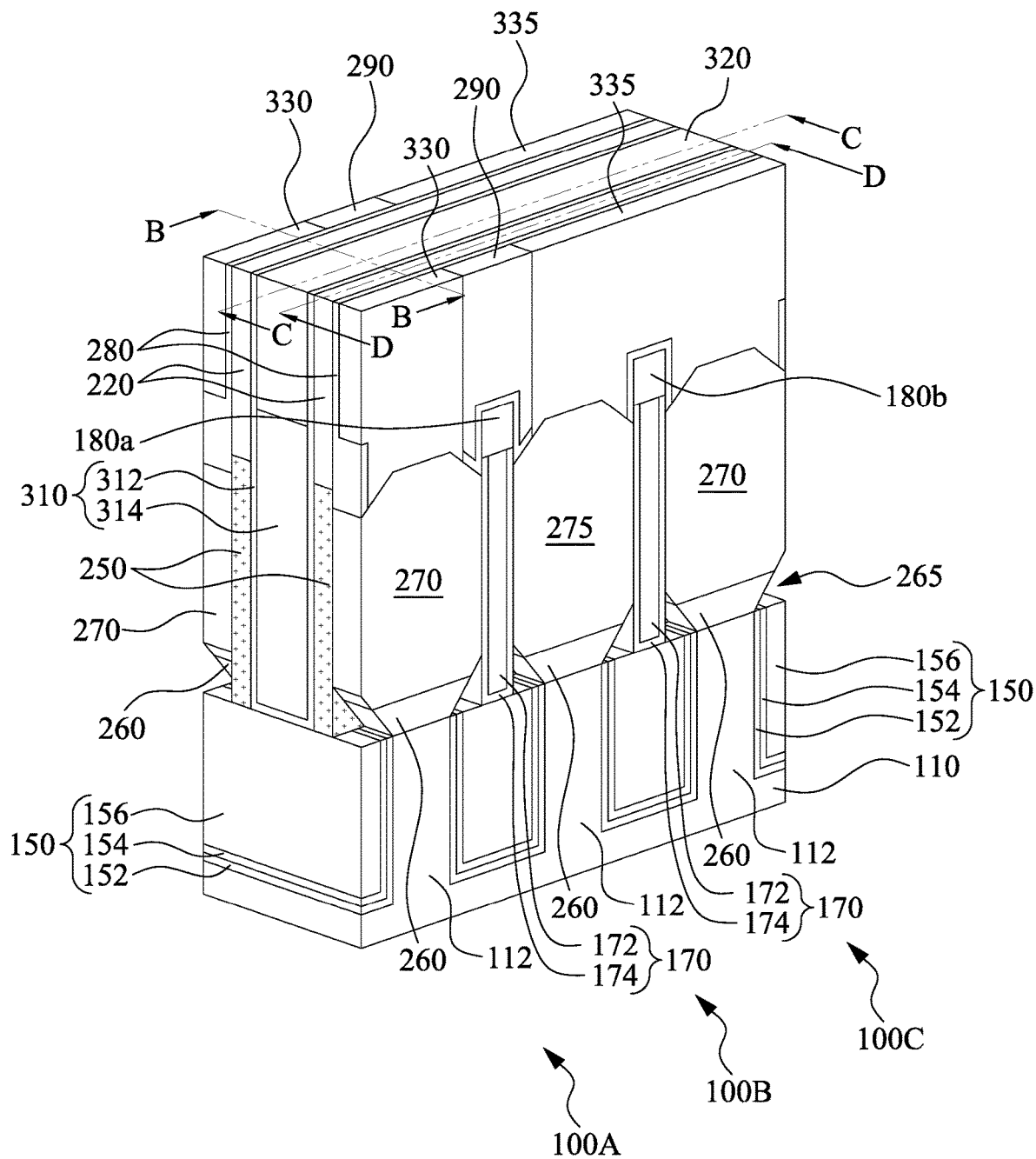
Figure 26B:
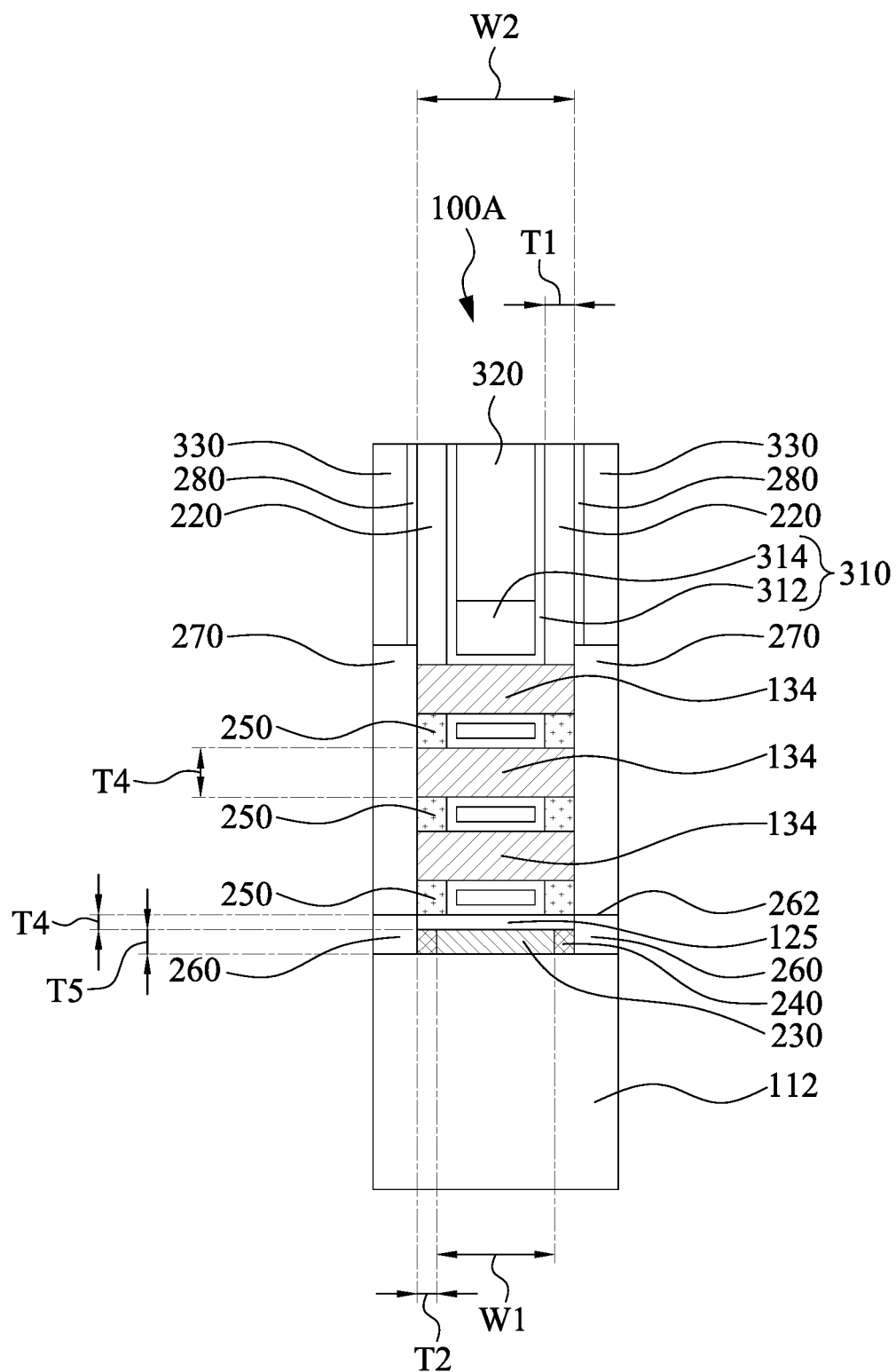
Figure 26C:
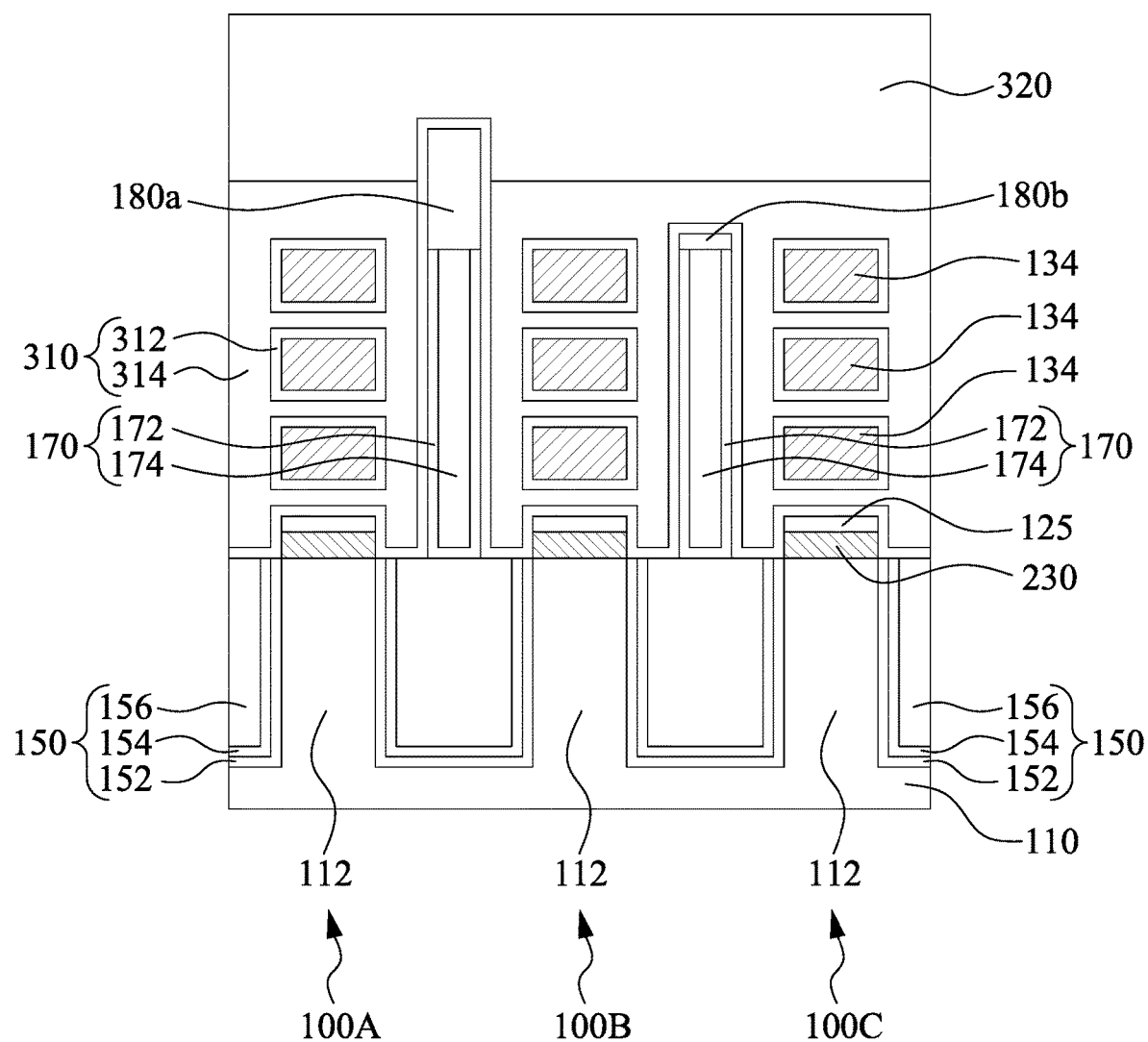
Figure 26D:
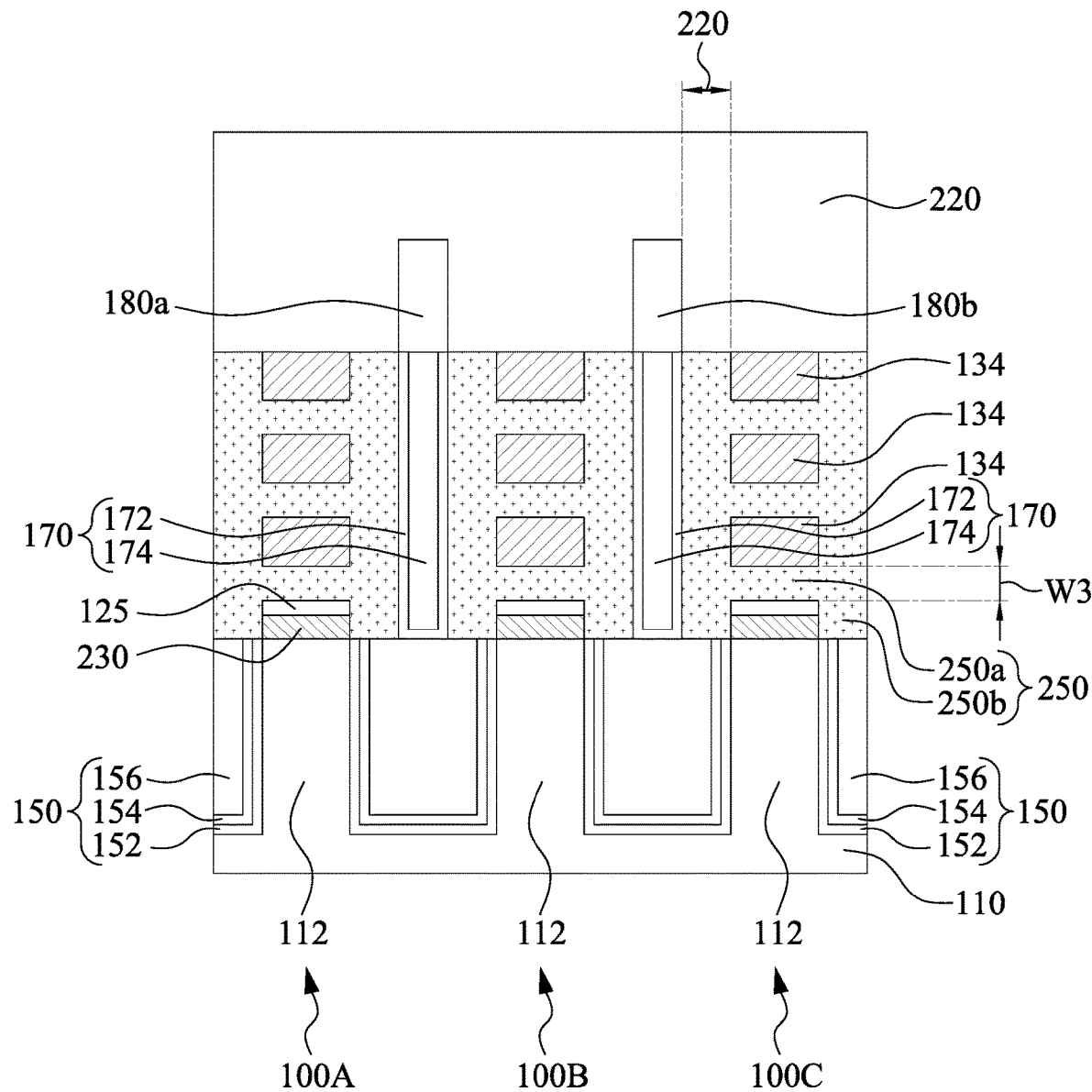

Reference is made to FIGS. 26A-26D, where FIG. 26B is a cross-sectional view taken along line B-B in FIG. 26A, FIG. 26C is a cross-sectional view taken along line C-C in FIG. 26A, and FIG. 26D is a cross-sectional view taken along line D-D in FIG. 26A. Contacts 330 and 335 are formed in the trenches 292. As such, the contacts 330 are respectively in contact with the epitaxial structures 270, and the contacts 335 are in contact with the epitaxial structures 270 and 275. As such, the contact 335 interconnects the adjacent epitaxial structures 270 and 275. In some embodiments, the contacts 330 and 335 may be made of metal, such as W, Co, Ru, Al, Cu, or other suitable materials. After the deposition of the contacts 330 and 335, a planarization process, such as a chemical mechanical planarization (CMP) process, may be then performed. As such, a top surface of the contacts 330 and a top surface of the contacts 335 are substantially coplanar. In some embodiments, metal alloy layers (such as silicide) may be formed between the contacts 330 (335) and the epitaxial structures 270 (275). Further, barrier layers may be formed in the trenches 292 before the formation of the contacts 330 and 335. The barrier layers may be made of TiN, TaN, or combinations thereof.

In FIGS. 26A-26D, the semiconductor includes at least (HGAA) transistors 100A, 100B, and 100C. Each of the transistors 100A, 100B, and 100C includes the semiconductor layers 134 as its channels. Each of the transistors 100A, 100B, and 100C further includes the protection layer 125 between the semiconductor layers 134 and the base portion 112 of the substrate 110. The protection layer 125 is configured to prevent current leakage from the channels (i.e., the semiconductor layers 134) to the substrate 110. Further, the protection layer 125 prevents the semiconductor layers 132 (see FIGS. 10A and 10B) from being etched when the sacrificial layers 120 (see FIGS. 9A and 9B) are removed. In some embodiments, a thickness T3 of the protection layer 125 (e.g., about 2 nm to about 3 nm) is smaller than a thickness T4 of each of the semiconductor layers 134.

The bottom isolation layer 230 is between the protection layer 125 and the base portion 112 of the substrate 110 and spaced apart from the top and bottom epitaxial structures 260, 270, and 275. The bottom isolation layer 230 is a dielectric layer and has good isolation performance to isolate the channels (semiconductor layers 134) from the substrate 110. The width W1 of the bottom isolation layer 230 is smaller than the width W2 of each of the semiconductor layers 134. The thickness T5 of the bottom isolation layer 230 is in a range of about 5 nm to about 15 nm. In some embodiments, the bottom isolation layer 230 includes oxide materials to reduce charge amounts at the interface between the bottom isolation layer 230 and the substrate 110. As such, the parasitic capacitance between the channels (i.e., the semiconductor layers 134) and the substrate 110 can be improved.

The semiconductor device further includes the bottom spacers 240 on opposite sidewalls of the bottom isolation layer 230. The bottom spacers 240 are between the protection layer 125 and the base portion 112 of the substrate 110. The bottom spacer 240 and the bottom isolation layer 230 are in direct contact with the protection layer 125. The bottom spacer 240 and the bottom isolation layer 230 may include different materials. In some embodiments, the thickness T2 of the bottom spacer 240 is in a range of about 2 nm to about 10 nm. If the thickness T2 of the bottom spacers 240 is less than about 2 nm, the bottom spacers 240 may not protect the bottom isolation layers 230 from being etched in the following etching or cleaning processes. If the thickness T2 of the bottom spacers 240 is greater than about 10 nm, a parasitic capacitance may be formed between the semiconductor layers 134 (channels) and the substrate 110, and the processing speed of the semiconductor device may be decreased.

Each of the transistors 100A, 100B, and 100C includes bottom epitaxial structures 260 and top epitaxial structures 270 (or 275). The top epitaxial structures 270 (or 275) and the bottom epitaxial structures 260 are referred to as source/drain regions of the transistors 100A, 100B, and 100C. The top epitaxial structures 270 (or 275) are on opposite sides of the semiconductor layers 134 as shown in FIG. 26B. The top epitaxial structures 270 and 275 are doped epitaxial materials, and the bottom epitaxial structures 260 are undoped epitaxial materials. That is, the dopant concentration of the top epitaxial structure 270 (275) is greater than the dopant concentration of the bottom epitaxial structure 260. The top epitaxial structures 270 may be P-type materials, and the top epitaxial structures 275 may be N-type materials, or vise versa. As such, the transistors 100A and 10C are P-type transistors, and the transistor 100B is an N-type transistor, or vise versa. The bottom epitaxial structures 260 are configured to prevent the current leakage from the top epitaxial structures 270 and 275 to the substrate 110. Also, the bottom epitaxial structures 260 reduces the parasitic capacitance of the transistors 100A-100C. The bottom spacer 240 is in direct contact with the bottom epitaxial structure 260 and spaced apart from the top epitaxial structure 270 (275).

The semiconductor device further includes a gate structure 310. The gate structure 310 includes a gate dielectric layer 312 and a gate electrode 314. The gate dielectric layer 312 surrounds (wraps around) the semiconductor layers 134 and is in contact with the protection layers 125 and the bottom isolation layers 230 as shown in FIG. 26C. The bottom spacer 240 is spaced apart from the gate structure 310 as shown in FIG. 26B.

The semiconductor device further includes the inner sidewall spacers 250 between the gate structure 310 and the top epitaxial structures 270 (275) and directly above the bottom spacers 240. In some embodiments, the inner sidewall spacers 250 and the bottom spacers 240 include the same material. A thickness T1 of the inner sidewall spacers 250 may be greater than or substantially the same as the thickness T2 of the bottom spacers 240. In some embodiments, the inner sidewall spacers 250 includes first portions 250a between the semiconductor layers 134 and second portions 250b between the semiconductor layer 134 and the dummy fin structure 170. The first portions 250a are formed in the recesses 133 (see FIG. 14A), and the second portions 250b are formed in the recesses 162 (see FIG. 14A). At least one of the second portions 250b has a width W4 greater than or substantially equal to a width W3 of at least one of the first portions 250a. With such configuration, etchants are easier to remove the semiconductor layers 132 (see FIGS. 22A-22C) and the gate structure 310 is easier to fill the spaces between the semiconductor layers 134.

The semiconductor device further includes dummy fin structures 170 respectively between the transistors 100A and 100B and the transistors 100B and 100C. The dummy fin structures 170 can shape the top epitaxial structures 270 and 275. The dummy fin structures 170 can be used to produce any desirable size of the top epitaxial structures 270 and 275. The dummy fin structures 170 also configured to isolate gate structures 310 in different transistors 110A-110C. The dummy fin structures 170 are in contact with the gate dielectric layer 312 of the gate structure 310. At least one air gap 265 may be formed among the dummy fin structure 170, the top and bottom epitaxial structures 270 (275) and 260, the isolation structure 150, and the substrate 110.

The semiconductor device further includes the capping layer 320 above the gate electrode 314 and the mask layers 180a and 180b respectively on the dummy fin structures 170. A portion of the mask layer 180a between the gate spacers 220 has a height higher than the height of a portion of the mask layer 180b between the gate spacers 220 as shown in FIG. 26C. The mask layer 180a is partially embedded in the capping layer 320, and the mask layer 180b is spaced apart from the capping layer 320. As a result, the gate of the transistor 100A is spaced apart from the gates of the transistors 100B and 100C, and the gates of the transistors 100B and 100C are electrically connected to each other.

The isolation structures 150 are adjacent the base portions 112 of the substrate 110. Each of the isolation structures 150 includes the first liner layer 152, the second liner layer 154, and the filling material 156. The first liner layer 152 and the filling material 156 are dielectric materials. The second liner layer 154 may be semiconductor layers in some embodiments. The second liner layer 154, however, may become a dielectric layer (e.g., $SiO_2$) after one or more thermal processes in FIGS. 1-26D.

The semiconductor device further includes the CESL 280 and the ILD 290. The CESL 280 is above the top epitaxial structures 270 and 275, the mask layers 180a and 180b, and adjacent the gate spacers 220. The ILD 290 is above the CESL 280 and the mask layer 180a. The contacts 330 are above the top epitaxial structures 270 of the transistor 100A, and the contacts 335 are above the top epitaxial structures 275 and 270 of the transistor 100B and 100C. The contacts 300 are separated from the contacts 335 by the ILD 290. The contacts 335 interconnect the top epitaxial structures 275 and 270 of the transistor 100B and 100C.

In FIGS. 26A-26D, the bottom spacers 240 are formed on the sidewalls of the inner bottom spacer 240. The bottom spacers 240 prevent the etchants used in cleaning process from etching the bottom spacers 240, such that the bottom spacers 240 can provide a good isolation performance between the channel and the substrate 110.

Figure 27:
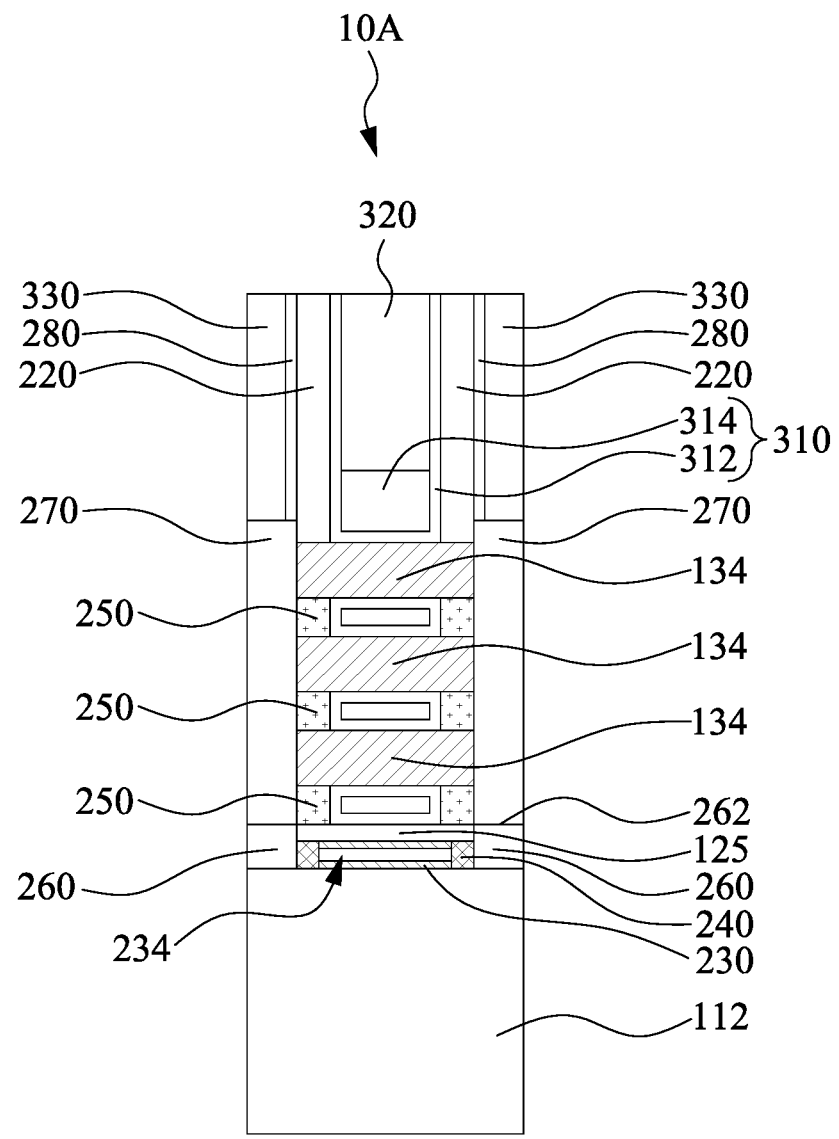
FIG. 27 is a cross-sectional view of a semiconductor device in accordance with some embodiments of the present disclosure.

FIG. 27 is a cross-sectional view of a semiconductor device in accordance with some embodiments of the present disclosure. The difference between the semiconductor devices in FIGS. 27 and 26B pertains to the shape of the bottom isolation layer 230. In FIG. 27, the bottom isolation layer 230 has a seam 234 therein. In the case that the bottom isolation layer 230 is formed by using ALD processes, the precursors used in the ALD processes are conformally deposited on the exposed surfaces of the protection layer 125 and the base portion 112 of the substrate 110, such that the seam 234 may be formed in the middle of the resulting bottom isolation layer 230. The bottom spacers 240, however, seal the seam 234, such that the following processes (e.g., the cleaning process mentioned in FIGS. 15A-15B) don't damage the bottom isolation layer 230 from the seam 234. Other relevant structural details of the semiconductor device in FIG. 27 are substantially the same as or similar to the semiconductor device in FIGS. 26A-26D, and, therefore, a description in this regard will not be repeated hereinafter.

Figure 28:
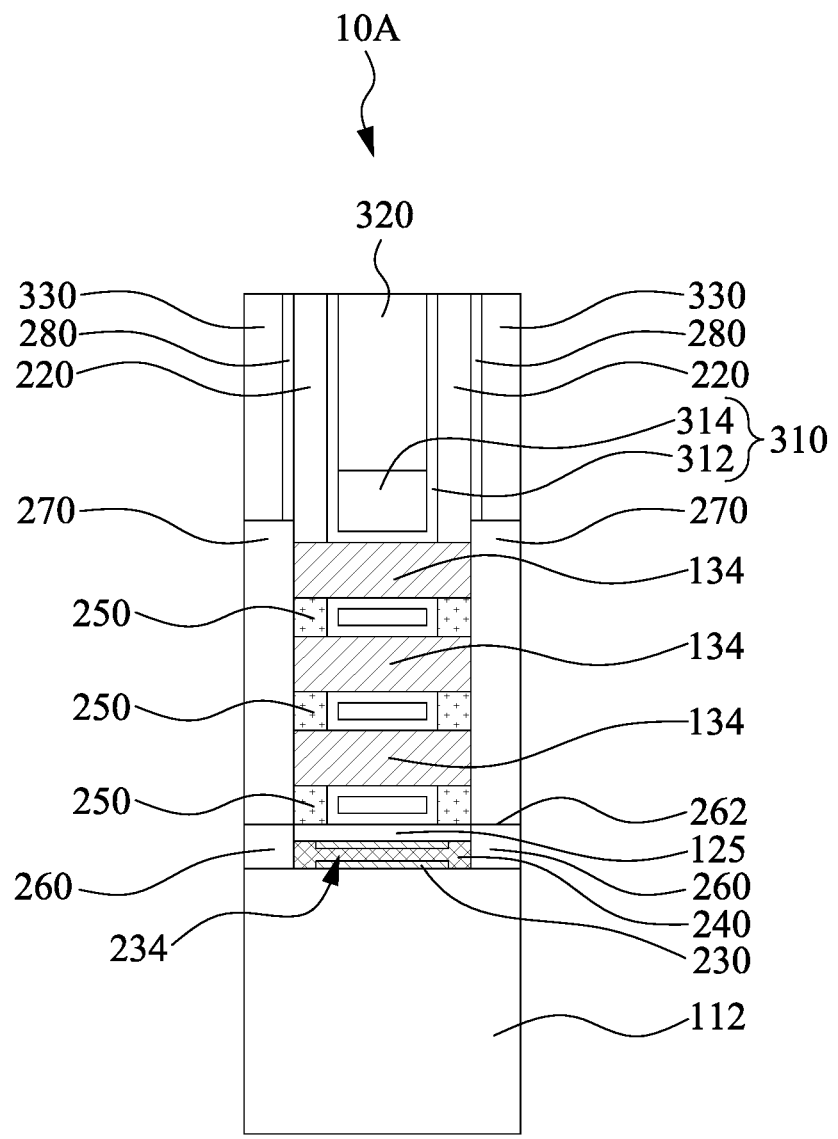
FIG. 28 is a cross-sectional view of a semiconductor device in accordance with some embodiments of the present disclosure.

FIG. 28 is a cross-sectional view of a semiconductor device in accordance with some embodiments of the present disclosure. The difference between the semiconductor devices in FIGS. 28 and 27 pertains to the shape of the bottom spacers 240. In FIG. 28, at least one of the bottom spacers 240 extends into the seam 234. In some embodiments, the bottom spacers 240 fill the seam 234 as shown in FIG. 28. In some other embodiments, the bottom spacers 240 partially fill the seam 234. Other relevant structural details of the semiconductor device in FIG. 28 are substantially the same as or similar to the semiconductor device in FIG. 28, and, therefore, a description in this regard will not be repeated hereinafter.

Figure 29:
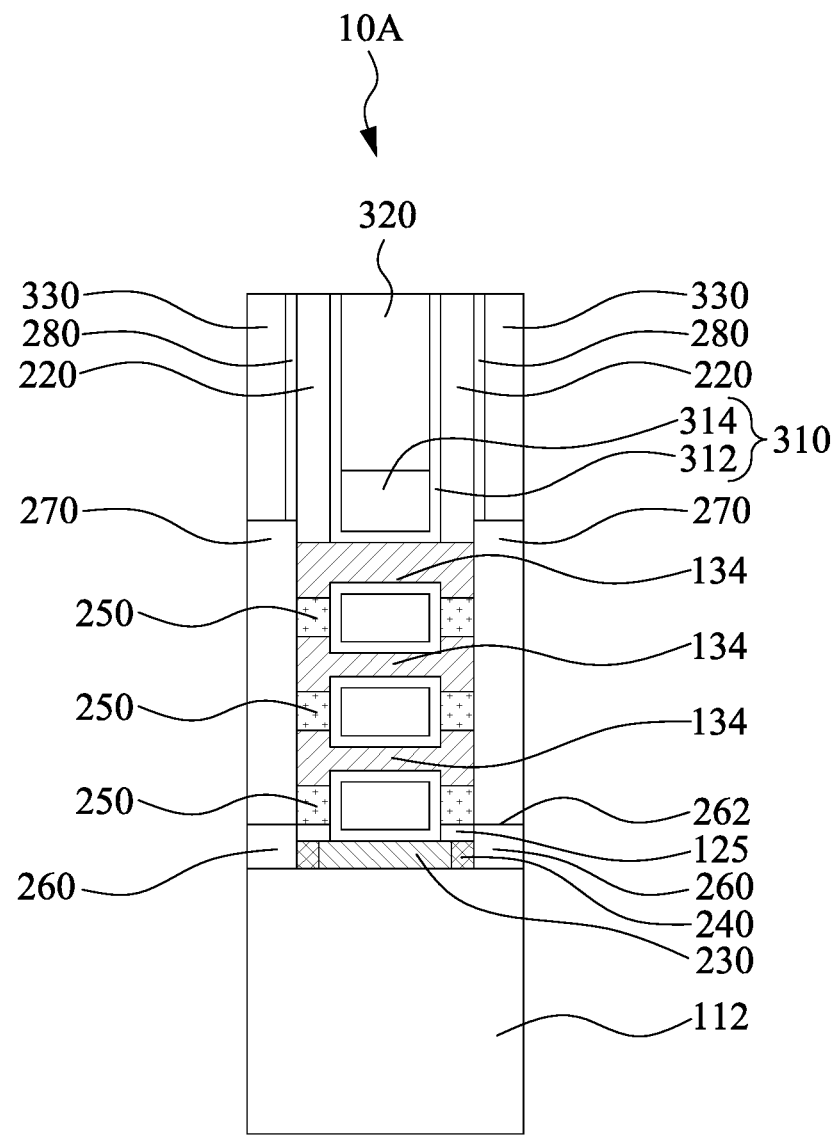
FIG. 29 is a cross-sectional view of a semiconductor device in accordance with some embodiments of the present disclosure.

FIG. 29 is a cross-sectional view of a semiconductor device in accordance with some embodiments of the present disclosure. The difference between the semiconductor devices in FIGS. 29 and 26B pertains to the shape of the protection layer 125 and the semiconductor layers 134. In some embodiments, during the removal of the semiconductor layers 132 (e.g., the process shown in FIGS. 22A-22C), portions of the semiconductor layers 134 and the protection layer 125 are recessed as well. As such, the gate dielectric layer 312 is in contact with the bottom isolation layer 230. Further, each of the semiconductor layers 134 has a narrow portion in contact with the gate dielectric layer 312 and wide portions in contact with the inner sidewall spacers 250. Other relevant structural details of the semiconductor device in FIG. 29 are substantially the same as or similar to the semiconductor device in FIGS. 26A-26D, and, therefore, a description in this regard will not be repeated hereinafter.

Figure 30:
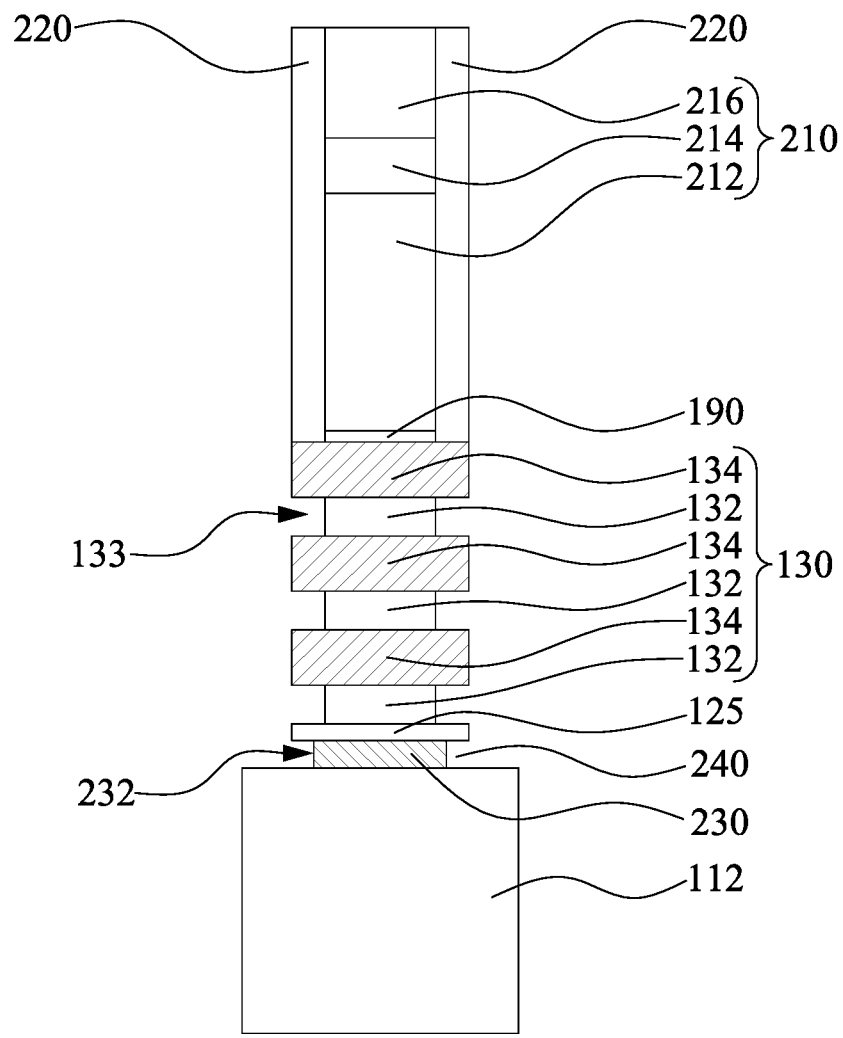
FIGS. 30-31 illustrate a method for manufacturing a semiconductor device at various stages in accordance with some embodiments of the present disclosure.
Figure 31:
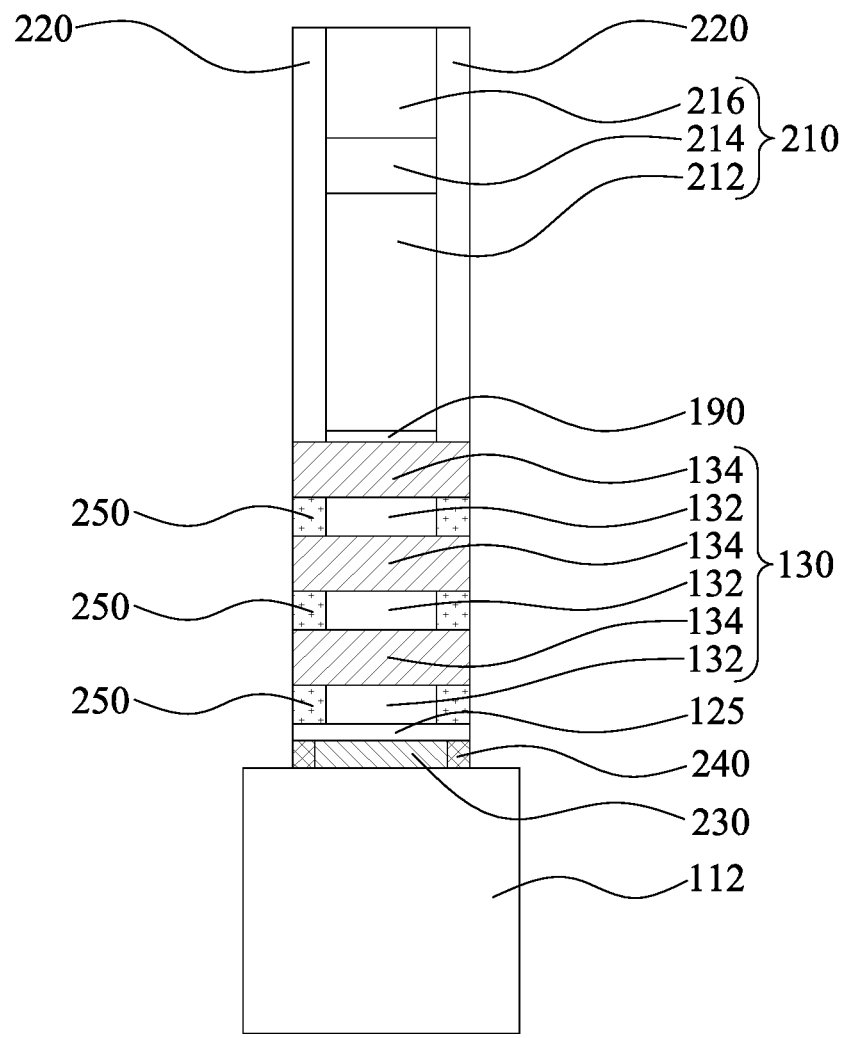

FIGS. 30-31 illustrate a method for manufacturing a semiconductor device at various stages in accordance with some embodiments of the present disclosure. In some embodiments, the bottom spacers 240 and the inner sidewall spacers 250 are formed together. For example, after the bottom isolation layer 230 is recessed as shown in FIGS. 12A-12B, the semiconductor layers 132 and the cladding layers 160 are recessed to form the recesses 133 and 162 as shown in FIG. 30. Subsequently, a dielectric layer is filled in the recesses 232, 133, and 162 to form the bottom spacers 240 and the inner sidewall spacers 250 as shown in FIG. 31. In this case, the bottom spacers 240 and the inner sidewall spacers 250 have the same material. Other relevant structural details of the semiconductor device in FIGS. 30-31 are substantially the same as or similar to the semiconductor device in FIGS. 26A-26D, and, therefore, a description in this regard will not be repeated hereinafter.

Figure 32:
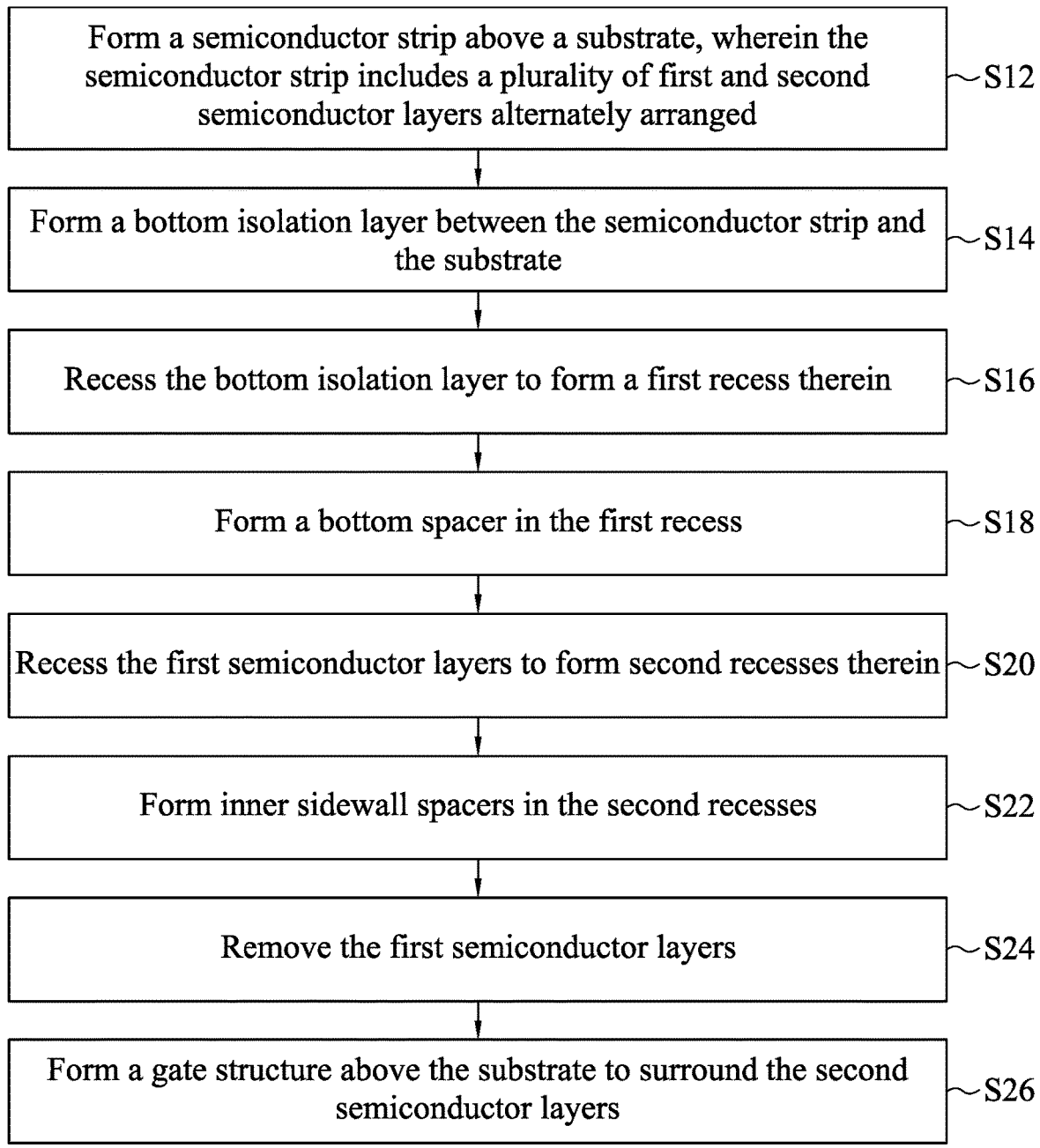
FIG. 32 is a flow chart of a method M1 for forming a semiconductor device in accordance with some embodiments of the present disclosure.

FIG. 32 is a flow chart of a method M1 for forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, a semiconductor strip is formed above a substrate, wherein the semiconductor strip includes a plurality of first and second semiconductor layers alternately arranged. FIG. 2 illustrates a perspective view of some embodiments corresponding to act in block S12. At block S14, a bottom isolation layer is formed between the semiconductor strip and the substrate. FIGS. 11A and 11B illustrate a perspective view and a cross-sectional view of some embodiments corresponding to act in block S14. At block S16, the bottom isolation layer is recessed to form a first recess therein. FIGS. 12A and 12B illustrate a perspective view and a cross-sectional view of some embodiments corresponding to act in block S16. At block S18, a bottom spacer is formed in the first recess. FIGS. 13A and 13B illustrate a perspective view and a cross-sectional view of some embodiments corresponding to act in block S18. At block S20, the first semiconductor layers are recessed to form second recesses therein. FIGS. 14A and 14B illustrate a perspective view and a cross-sectional view of some embodiments corresponding to act in block S20. At block S22, inner sidewall spacers are formed in the second recesses. FIGS. 15A and 15B illustrate a perspective view and a cross-sectional view of some embodiments corresponding to act in block S22. At block S24, the first semiconductor layers are removed. FIGS. 22A-22C illustrate a perspective view and cross-sectional views of some embodiments corresponding to act in block S24. At block S26, a gate structure is formed above the substrate to surround the second semiconductor layers. FIGS. 23A-23C illustrate a perspective view and cross-sectional views of some embodiments corresponding to act in block S26. In some embodiments, the operation S20 may be performed before the operation S18, and the operations S18 and S22 may be formed together, as shown in FIGS. 30-31.

According to some embodiments, a semiconductor device includes a substrate, a semiconductor layer, a gate structure, source/drain regions, a bottom isolation layer, and a bottom spacer. The semiconductor layer is above the substrate. The gate structure is above the substrate and surrounds the semiconductor layer. The source/drain regions are on opposite sides of the semiconductor layer. The bottom isolation layer is between the substrate and the semiconductor layer. The bottom spacer is on a sidewall of the bottom isolation layer.

According to some embodiments, a semiconductor device includes a substrate, a bottom isolation layer, a semiconductor layer, a gate structure, and source/drain regions. The bottom isolation layer is above the substrate. The semiconductor layer is above the bottom isolation layer. A width of the semiconductor layer is greater than a width of the bottom isolation layer. The gate structure wraps around the semiconductor layer. The source/drain regions are connected to the semiconductor layer.

According to some embodiments, a method for manufacturing a semiconductor device includes forming a semiconductor strip above a substrate, wherein the semiconductor strip includes a plurality of first and second semiconductor layers alternately arranged. A bottom isolation layer is formed between the semiconductor strip and the substrate. The bottom isolation layer is recessed to form a first recess therein. A bottom spacer is formed in the first recess. The first semiconductor layers are removed. A gate structure is formed above the substrate to surround the second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a semiconductor layer above the substrate;
a gate structure above the substrate and surrounding the semiconductor layer;
source/drain regions on opposite sides of the semiconductor layer;
a bottom isolation layer between the substrate and the semiconductor layer;
a bottom spacer on a sidewall of the bottom isolation layer; and
an inner sidewall spacer between the gate structure and one of the source/drain regions, wherein a thickness of the inner sidewall spacer is greater than a thickness of the bottom spacer.

2. The semiconductor device of claim 1, wherein the inner sidewall spacer is directly above the bottom spacer.

3. The semiconductor device of claim 1, wherein the inner sidewall spacer and the bottom spacer comprise a same material.

4. The semiconductor device of claim 1, further comprising a protection layer between the semiconductor layer and the bottom isolation layer.

5. The semiconductor device of claim 4, wherein the bottom spacer and the bottom isolation layer are in direct contact with the protection layer.

6. The semiconductor device of claim 1, wherein each of the source/drain regions comprises:
a bottom epitaxial structure; and
a top epitaxial structure above the bottom epitaxial structure, wherein a dopant concentration of the top epitaxial structure is greater than a dopant concentration of the bottom epitaxial structure.

7. The semiconductor device of claim 6, wherein the bottom spacer is in direct contact with the bottom epitaxial structure and spaced apart from the top epitaxial structure.

8. The semiconductor device of claim 1, wherein the bottom spacer is spaced apart from the gate structure.

9. A semiconductor device, comprising:
a substrate;
a bottom isolation layer above the substrate;
a channel layer above the bottom isolation layer, wherein a width of the channel layer is greater than a width of the bottom isolation layer;
a gate structure wrapping around the channel layer;
a semiconductive protection layer between the channel layer and the bottom isolation layer, wherein the semiconductive protection layer is in contact with the bottom isolation layer; and
source/drain regions connected to the channel layer.

10. The semiconductor device of claim 9, wherein the bottom isolation layer is spaced apart from the source/drain regions.

11. The semiconductor device of claim 9, wherein the gate structure passes through the semiconductive protection layer and is in direct contact with the bottom isolation layer.

12. The semiconductor device of claim 9, wherein the bottom isolation layer has a seam therein.

13. The semiconductor device of claim 9, wherein the semiconductive protection layer is spaced apart from the channel layer.

14. The semiconductor device of claim 9, wherein the gate structure comprises:
a gate electrode wrapping around the channel layer; and
a gate dielectric layer between the gate electrode and the semiconductive protection layer.

15. A method for manufacturing a semiconductor device, comprising:
forming a semiconductor strip above a substrate, wherein the semiconductor strip comprises a plurality of first and second semiconductor layers alternately arranged;
forming a bottom dielectric isolation layer between the semiconductor strip and the substrate;
recessing the bottom dielectric isolation layer to form a first recess therein;
forming a bottom spacer in the first recess and in contact with the substrate;
removing the first semiconductor layers; and
forming a gate structure above the substrate to surround the second semiconductor layers.

16. The method of claim 15, further comprising:
recessing the first semiconductor layers to form second recesses therein; and
forming inner sidewall spacers in the second recesses.

17. The method of claim 16, wherein forming the inner sidewall spacers and forming the bottom spacer are performed together.

18. The method of claim 15, further comprising forming a semiconductive cladding layer to cover the semiconductor strip prior to forming the bottom spacer.

19. The method of claim 15, wherein the bottom spacer is spaced apart from any of the first and second semiconductor layers of the semiconductor strip.

20. The method of claim 15, wherein a top surface of the bottom spacer is substantially coplanar with a top surface of the bottom dielectric isolation layer.

* * * * *